United States Patent
Nakagawa et al.

(10) Patent No.: US 12,177,591 B2
(45) Date of Patent: Dec. 24, 2024

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Daisuke Nakagawa, Kanagawa (JP); Yosuke Ueno, Kanagawa (JP); Kouji Matsuura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 39 days.

(21) Appl. No.: 18/041,220

(22) PCT Filed: Jun. 21, 2021

(86) PCT No.: PCT/JP2021/023354
§ 371 (c)(1),
(2) Date: Feb. 10, 2023

(87) PCT Pub. No.: WO2022/038885
PCT Pub. Date: Feb. 24, 2022

(65) Prior Publication Data
US 2023/0345151 A1 Oct. 26, 2023

(30) Foreign Application Priority Data
Aug. 19, 2020 (JP) .................... 2020-138539

(51) Int. Cl.
*H04N 25/772* (2023.01)
*H04N 25/709* (2023.01)
(Continued)

(52) U.S. Cl.
CPC ......... *H04N 25/772* (2023.01); *H04N 25/709* (2023.01); *H04N 25/7795* (2023.01); *H04N 25/78* (2023.01)

(58) Field of Classification Search
CPC ............. H04N 25/7795; H04N 25/709; H04N 25/7678; H04N 25/77; H04N 25/772;
(Continued)

(56) References Cited

U.S. PATENT DOCUMENTS

| | | | |
|---|---|---|---|
| 9,967,489 B2 * | 5/2018 | Yan | H04N 25/77 |
| 10,598,936 B1 * | 3/2020 | Berkovich | G06F 3/0346 |

(Continued)

FOREIGN PATENT DOCUMENTS

| | | |
|---|---|---|
| JP | 2012-147339 A | 8/2012 |
| JP | 2015-152699 A | 8/2015 |

(Continued)

OTHER PUBLICATIONS

International Search Report and Written Opinion of PCT Application No. PCT/JP2021/023354, issued on Jul. 20, 2021, 09 pages of ISRWO.

*Primary Examiner* — Pritham D Prabhakher
(74) *Attorney, Agent, or Firm* — CHIP LAW GROUP

(57) ABSTRACT

A degree of freedom in design is improved in a solid-state imaging element in which a logic gate is provided in a comparator. A comparison circuit compares an input potential which has been input with a predetermined reference potential and outputs any one of a pair of output potentials as a comparison result. A level shift circuit outputs any one of a pair of shift potentials having a larger potential difference than the pair of output potentials as an output signal on the basis of the comparison result. The logic gate determines whether or not the output signal is higher than a predetermined threshold between the pair of shift potentials and (Continued)

outputs a determination result. A counter counts a count value over a period until the determination result is inverted.

20 Claims, 43 Drawing Sheets

(51) Int. Cl.
*H04N 25/76* (2023.01)
*H04N 25/78* (2023.01)

(58) Field of Classification Search
CPC ..... H04N 25/78; H04N 25/00; H03M 1/1295; H03M 1/56; H03M 1/123; H03K 19/018521; H03K 5/2472; H03K 7/08; H01L 27/14634
USPC ........................................................ 348/294
See application file for complete search history.

(56) References Cited

U.S. PATENT DOCUMENTS

| | | | |
|---|---|---|---|
| 2010/0002120 A1* | 1/2010 | Yoshikawa .......... | H03K 5/2481 348/312 |
| 2012/0199723 A1* | 8/2012 | Egawa .................. | H04N 25/77 250/208.1 |
| 2013/0206961 A1* | 8/2013 | Ikeda ..................... | H04N 25/75 250/208.1 |
| 2014/0291482 A1* | 10/2014 | Tanaka .................. | H04N 25/75 327/108 |
| 2016/0006969 A1* | 1/2016 | Matsumoto ....... | H01L 27/14621 348/308 |
| 2016/0028974 A1* | 1/2016 | Guidash ............... | H04N 25/673 348/294 |
| 2017/0085820 A1* | 3/2017 | Inada ..................... | H03M 1/56 |
| 2018/0103222 A1 | 4/2018 | Yan | |
| 2020/0358975 A1* | 11/2020 | Hagihara ............... | H04N 25/75 |
| 2020/0396405 A1* | 12/2020 | Kim ..................... | H04N 25/709 |

FOREIGN PATENT DOCUMENTS

| | | |
|---|---|---|
| JP | 2019-047383 A | 3/2019 |
| WO | 2018/037902 A1 | 3/2018 |
| WO | 2019/017092 A1 | 1/2019 |

* cited by examiner

| REFERENCE VOLTAGE $V_{RMP}$ | CMP1 (FIRST STAGE) | CMP2 (SECOND STAGE) | OUT (THIRD STAGE) | INV (FOURTH STAGE) | VCO (FIFTH STAGE) |
|---|---|---|---|---|---|
| $V_{RMP} > V_{AZ}$ | LOW ($V_{CLP}$) | HIGH ($V_{VSL}$) | HIGH (VDDB) | LOW (VSSC) | HIGH (VDDC) |
| $V_{RMP} < V_{VSL} - Vt$ | HIGH ($V_{VSL}$) | LOW ($Vds'$) | LOW ($Vds'$) | HIGH (VDDC) | LOW (VSSC) |

SOLID-STATE IMAGING ELEMENT AND IMAGING DEVICE

CROSS REFERENCE TO RELATED APPLICATIONS

This application is a U.S. National Phase of International Patent Application No. PCT/JP2021/023354 filed on Jun. 21, 2021, which claims priority benefit of Japanese Patent Application No. JP 2020-138539 filed in the Japan Patent Office on Aug. 19, 2020. Each of the above-referenced applications is hereby incorporated herein by reference in its entirety.

TECHNICAL FIELD

The present technology relates to a solid-state imaging element. Specifically, the present technology relates to a solid-state imaging element provided with a comparator for each column, and an imaging device.

BACKGROUND ART

Conventionally, in solid-state imaging elements and the like, a single-slope analog to digital converter (ADC) is often used for analog to digital (AD) conversion because of a simple structure. The single-slope ADC generally includes a comparator and a counter that performs counting on the basis of a comparison result of the comparator. For example, a solid-state imaging element in which a p-channel metal-oxide-semiconductor (pMOS) transistor, a current source, and a logic gate (an inverter or the like) are provided in a comparator is proposed (see, for example, Patent Document 1). The pMOS transistor and the current source are connected in series to a pixel circuit, and the pMOS transistor compares a pixel signal from the pixel circuit with a reference signal, and outputs a comparison result from a drain via the inverter.

CITATION LIST

Patent Document

Patent Document 1: U.S. Patent Application Laid-Open No. 2018/0103222

SUMMARY OF THE INVENTION

Problems to be Solved by the Invention

In the above-described solid-state imaging element, a power supply of the pixel circuit is used in common by the comparator, so that power consumption is reduced as compared with a configuration in which the power supply is also provided in the comparator separately from the pixel circuit. However, the pixel circuit, the pMOS transistor, and the current source are connected in series in the above-described solid-state imaging element, and thus, has a narrower voltage range on an input side of the inverter than a case of being connected in parallel. If the voltage range is narrow, an output of the inverter is not inverted at a timing when the drain (that is, the input of the inverter) of the pMOS transistor is inverted, and there is a possibility that the inverter malfunctions. Furthermore, if the voltage range is narrow, there is a possibility that a leakage current flows when the input of the inverter becomes a value close to a threshold. In the above-described solid-state imaging element, it is necessary to sufficiently increase a power supply voltage and sufficiently lower the threshold in order to prevent these malfunction and leakage current, and there is a problem that the degree of freedom in design decreases.

The present technology has been made in view of such a situation, and an object thereof is to improve a degree of freedom in design in a solid-state imaging element in which a logic gate is provided in a comparator.

Solutions to Problems

The present technology has been made to solve the above-described problem, and a first aspect thereof is a solid-state imaging element including: a comparison circuit that compares an input potential which has been input with a predetermined reference potential and outputs any one of a pair of output potentials as a comparison result; a level shift circuit that outputs, as an output signal, any one of a pair of shift potentials having a larger potential difference than the pair of output potentials on the basis of the comparison result; a logic gate that determines whether or not the output signal is higher than a predetermined threshold between the pair of shift potentials and outputs a determination result; and a counter that counts a count value over a period until the determination result is inverted. This brings about an effect of improving a degree of freedom in design.

Furthermore, in the first aspect, one of the pair of shift potentials may be a power supply potential higher than the input potential, and the other of the pair of shift potentials may be the same as a lower one of the pair of output potentials. This brings about an effect that a voltage range is expanded to a power supply side.

Furthermore, in the first aspect, one of the pair of shift potentials may be the same potential as the input potential, and the other of the pair of shift potentials may be a standard potential lower than a lower one of the pair of output potentials. This brings about an effect that the voltage range is expanded to a ground side.

Furthermore, in the first aspect, one of the pair of shift potentials may be a power supply potential higher than the input potential, and the other of the pair of shift potentials may be a standard potential lower than a lower one of the pair of output potentials. This brings about an effect that the voltage range is expanded to the power supply side and the ground side.

Furthermore, in the first aspect, the level shift circuit may include: an N-type transistor having a gate connected to a vertical signal line of the input potential and a source to which the comparison result is input; a power-supply-side precharge transistor that initializes a potential of a drain of the N-type transistor to the power supply potential; a P-type transistor having a gate connected to the drain of the N-type transistor and a drain connected to the logic gate; and a standard-side precharge transistor that initializes a potential of the drain of the P-type transistor to the standard potential. This brings about an effect that a voltage circuit is expanded by the four transistors.

Furthermore, in the first aspect, a short-circuit transistor that short-circuits the gate and the source of the N-type transistor may be further provided. This brings about an effect that a leakage current is suppressed.

Furthermore, in the first aspect, a back gate and the source of the N-type transistor may be short-circuited. Therefore, it is possible to suppress a change in a threshold of the N-type transistor caused by the potential (input potential) of the vertical signal line.

Furthermore, in the first aspect, a back gate of the N-type transistor may be grounded. This brings about an effect that a mounting area is reduced as compared with a case where the back gate and the source are short-circuited.

Furthermore, in the first aspect, the level shift circuit may include: a P-type transistor having a gate to which the comparison result is input and a source connected to a vertical signal line of the input potential; a standard-side precharge transistor that initializes a potential of a drain of the P-type transistor to the standard potential; an N-type transistor having a gate connected to the drain of the P-type transistor and a drain connected to the logic gate; and a power-supply-side precharge transistor that initializes a potential of the drain of the N-type transistor to the power supply potential. This brings about an effect that the normal operation can be performed even in a case where an output voltage range is higher than a power supply voltage of the level shift circuit.

Furthermore, in the first aspect, a short-circuit transistor that short-circuits the vertical signal line and the gate of the P-type transistor may be further provided. This brings about an effect that a leakage current of the P-type transistor is suppressed.

Furthermore, in the first aspect, the comparison circuit may include: an input transistor having a source connected to the vertical signal line and a gate to which the reference potential is input; and a current source connected to a drain of the input transistor.

Furthermore, in the first aspect, the comparison circuit may include: a pair of capacitors that divides a voltage between the input potential and the reference potential; an input transistor having a gate connected to a connection node of the pair of capacitors and a source to which a drop potential lower than the power supply potential is input; and a current source connected to a drain of the input transistor.

Furthermore, in the first aspect, a filter circuit that suppresses a variation in a first power supply potential may be further provided, and the filter circuit may be inserted between a power supply line of the first power supply potential and the level shift circuit. This brings about an effect that inter-column interference (streaking) caused by a power supply potential variation of the level shift circuit.

Furthermore, in the first aspect, the filter circuit may include a capacitor and a transistor connected in series between the power supply line of the first power supply potential and the level shift circuit. This brings about an effect that a current variation is suppressed.

Furthermore, in the first aspect, a predetermined potential for constantly turning on the transistor may be applied to the gate of the transistor. Therefore, an RC filter circuit including an on-resistance of the transistor and the capacitor is formed. Then, a band of the filter can be controlled by a potential applied to the above-described transistor.

Furthermore, in the first aspect, a timing control section that supplies a control signal to the gate of the transistor may be further provided. This enables dynamic filter band function control.

Furthermore, in the first aspect, the input potential may include a reset level and a signal level, and the timing control section may control the transistor to be turned on by the control signal over a first pulse period before a counting period of the count value corresponding to the reset level. Therefore, the above-described level shift circuit can be reliably initialized at the time of precharge, a desired filter function can be implemented during the counting period.

Furthermore, in the first aspect, the timing control section may control the transistor to be turned on by the control signal over each of a second pulse period and the first pulse period between the counting period of the count value corresponding to the reset level and a counting period of the count value corresponding to the signal level. This brings about an effect that a power supply voltage variation is reliably suppressed even in a case where a value of the capacitor is relatively small.

Furthermore, in the first aspect, a filter circuit that suppresses a variation in a second power supply potential may be further provided, and the filter circuit may be inserted between a power supply line of the second power supply potential and the logic gate. This brings about an effect that streaking caused by a power supply potential variation of the logic gate is suppressed.

Furthermore, a second aspect of the present technology is an imaging device including: a comparison circuit that compares an input potential which has been input with a predetermined reference potential and outputs any one of a pair of output potentials as a comparison result; a level shift circuit that outputs, as an output signal, any one of a pair of shift potentials having a larger potential difference than the pair of output potentials on the basis of the comparison result; a logic gate that determines whether or not the output signal is higher than a predetermined threshold between the pair of shift potentials and outputs a determination result; a counter that counts a count value over a period until the determination result is inverted; and a storage section that stores image data in which a digital signal indicating the count value is arranged. This brings about an effect of improving a degree of freedom in designing a circuit in the imaging device.

MODE FOR CARRYING OUT THE INVENTION

Hereinafter, modes for carrying out the present technology (hereinafter, referred to as embodiments) will be described. The description will be given in the following order.

1. First Embodiment (Example in which Voltage Range Is Expanded by level Shift Circuit)
2. Second Embodiment (Example in which Potential Variation Is Suppressed by Filter Circuit)
3. Example of Application to Mobile Body

1. First Embodiment

Configuration Example of Imaging Device

Figure 1:
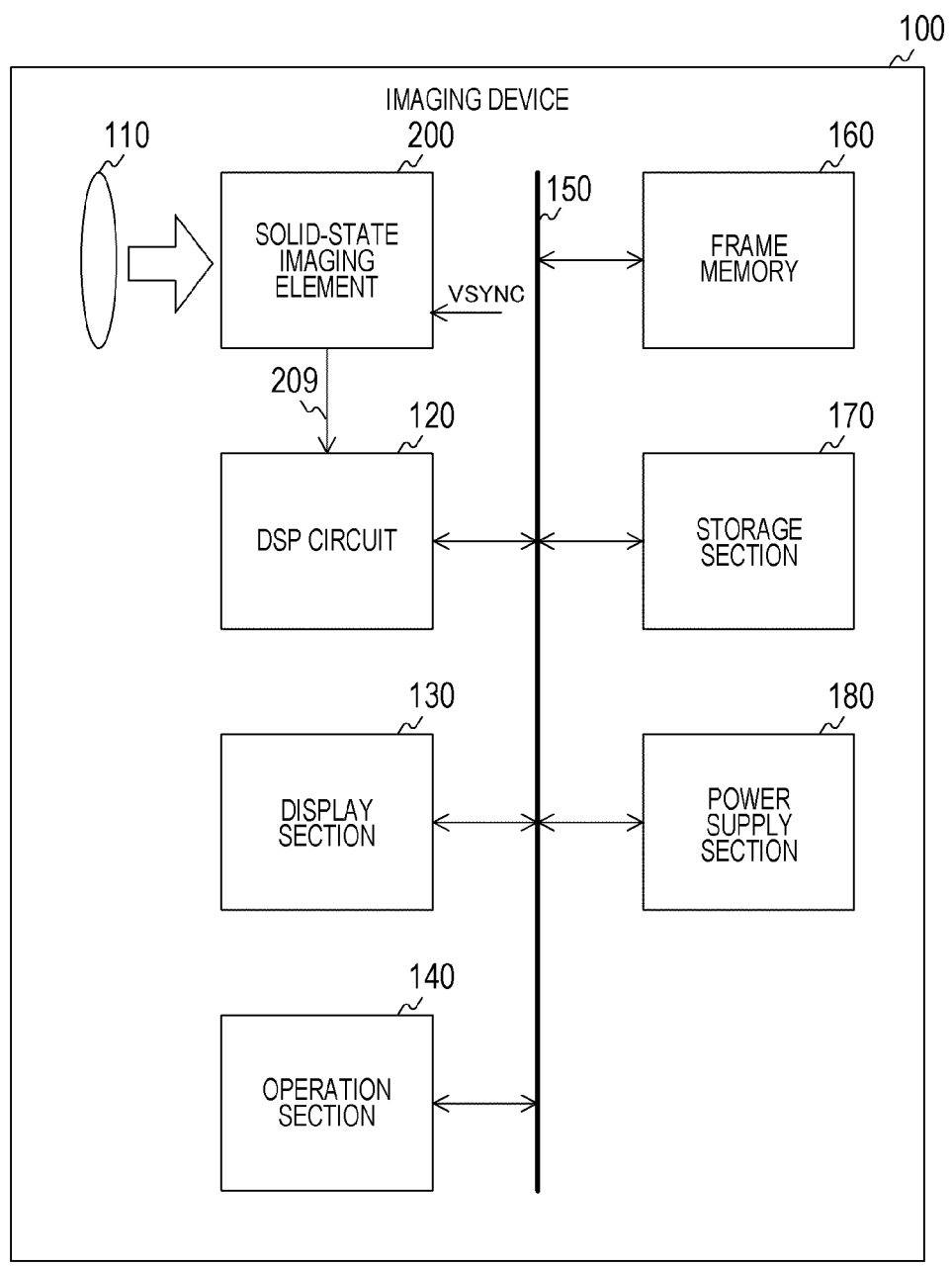
FIG. 1 is a block diagram depicting a configuration example of an imaging device in a first embodiment of the present technology.

FIG. 1 is a block diagram depicting a configuration example of an imaging device 100 in a first embodiment of the present technology. The imaging device 100 is a device configured to image data, and includes an optical section 110, a solid-state imaging element 200, and a digital signal processing (DSP) circuit 120. The imaging device 100 further includes a display section 130, an operation section 140, a bus 150, a frame memory 160, a storage section 170, and a power supply section 180. As the imaging device 100, a camera mounted on a smartphone, a vehicle-mounted camera, or the like is assumed.

The optical section 110 collects light from a subject and guides the light to the solid-state imaging element 200. The solid-state imaging element 200 generates image data by photoelectric conversion. The solid-state imaging element 200 supplies the generated image data to the DSP circuit 120 via a signal line 209.

The DSP circuit 120 executes predetermined signal processing on the image data. The DSP circuit 120 outputs the processed image data to the frame memory 160 and the like via the bus 150.

The display section 130 displays the image data. As the display section 130, for example, a liquid crystal panel or an organic electro luminescence (EL) panel is assumed. The operation section 140 generates an operation signal in accordance with an operation of a user.

The bus 150 is a common path configured for transmission and reception of data among the optical section 110, the solid-state imaging element 200, the DSP circuit 120, the display section 130, the operation section 140, the frame memory 160, the storage section 170, and the power supply section 180.

The frame memory 160 holds the image data. The storage section 170 stores various types of data such as the image data. The power supply section 180 supplies power to the solid-state imaging element 200, the DSP circuit 120, the display section 130, and the like.

Figure 2:
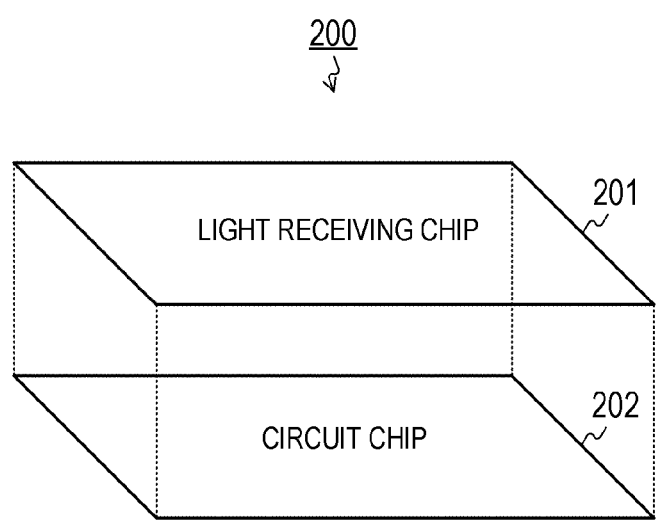
FIG. 2 is a diagram depicting an example of a stacked structure of a solid-state imaging element in the first embodiment of the present technology.

FIG. 2 is a diagram depicting an example of a stacked structure of the solid-state imaging element 200 in the first embodiment of the present technology. The solid-state imaging element 200 includes a circuit chip 202 and a light receiving chip 201 stacked on the circuit chip 202. These chips are electrically connected via a connection section such as a via. Note that the connection can also be made by a Cu—Cu bonding or a bump other than the via.

Configuration Example of Solid-State Imaging Element

Figure 3:
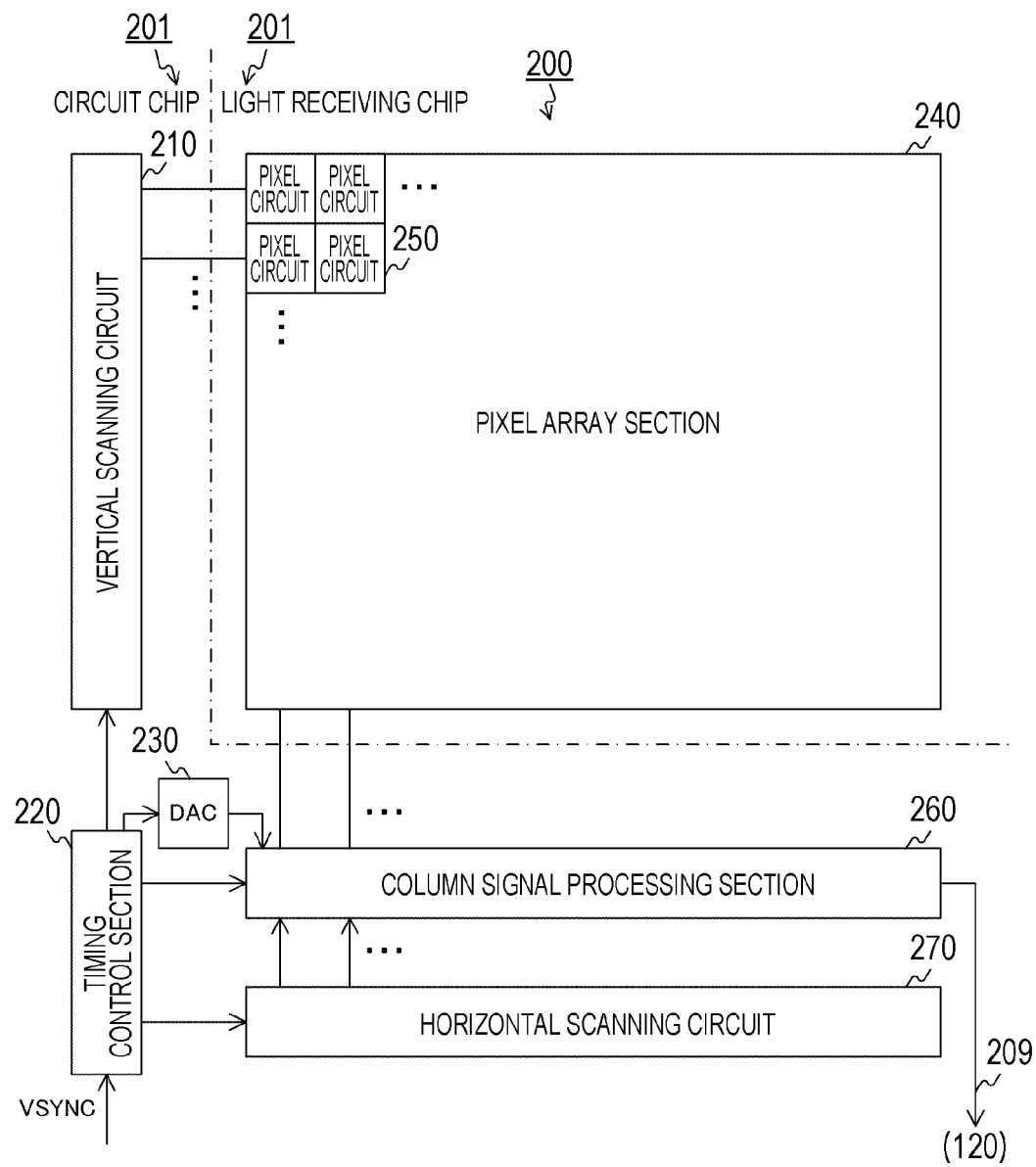
FIG. 3 is a block diagram depicting a configuration example of the solid-state imaging element in the first embodiment of the present technology.

FIG. 3 is a block diagram depicting a configuration example of the solid-state imaging element 200 in the first embodiment of the present technology. The solid-state imaging element 200 includes a vertical scanning circuit 210, a timing control section 220, a digital to analog converter (DAC) 230, a pixel array section 240, a column signal processing section 260, and a horizontal scanning circuit 270. In the pixel array section 240, a plurality of pixel circuits 250 is arrayed in a two-dimensional lattice pattern.

The pixel array section 240 is arranged on the light receiving chip 201, for example, and the remaining circuits are arranged on the circuit chip 202. Note that the circuits arranged in the respective chips are not limited to those illustrated in the drawing.

The vertical scanning circuit 210 sequentially selects and drives rows in the pixel array section 240.

The timing control section 220 controls operation timings of the vertical scanning circuit 210, the DAC 230, the column signal processing section 260, and the horizontal scanning circuit 270 in synchronization with a vertical synchronization signal VSYNC.

The DAC 230 generates a saw tooth wave-like ramp signal and supplies the generated ramp signal to the column signal processing section 260 as a reference signal.

The pixel circuit 250 generates an analog pixel signal by photoelectric conversion under the control of the vertical scanning circuit 210. The pixel circuit 250 of each column outputs the pixel signal to the column signal processing section 260 via a vertical signal line (not illustrated).

In the column signal processing section 260, an ADC (not illustrated) is arranged for every column of the pixel circuits 250. Each of the ADCs converts the pixel signal of the corresponding column into a digital signal and outputs the digital signal to the DSP circuit 120 under the control of the horizontal scanning circuit 270.

The horizontal scanning circuit 270 controls the column signal processing section 260 to sequentially output the digital signals.

Configuration Example of Pixel Circuit

Figure 4:
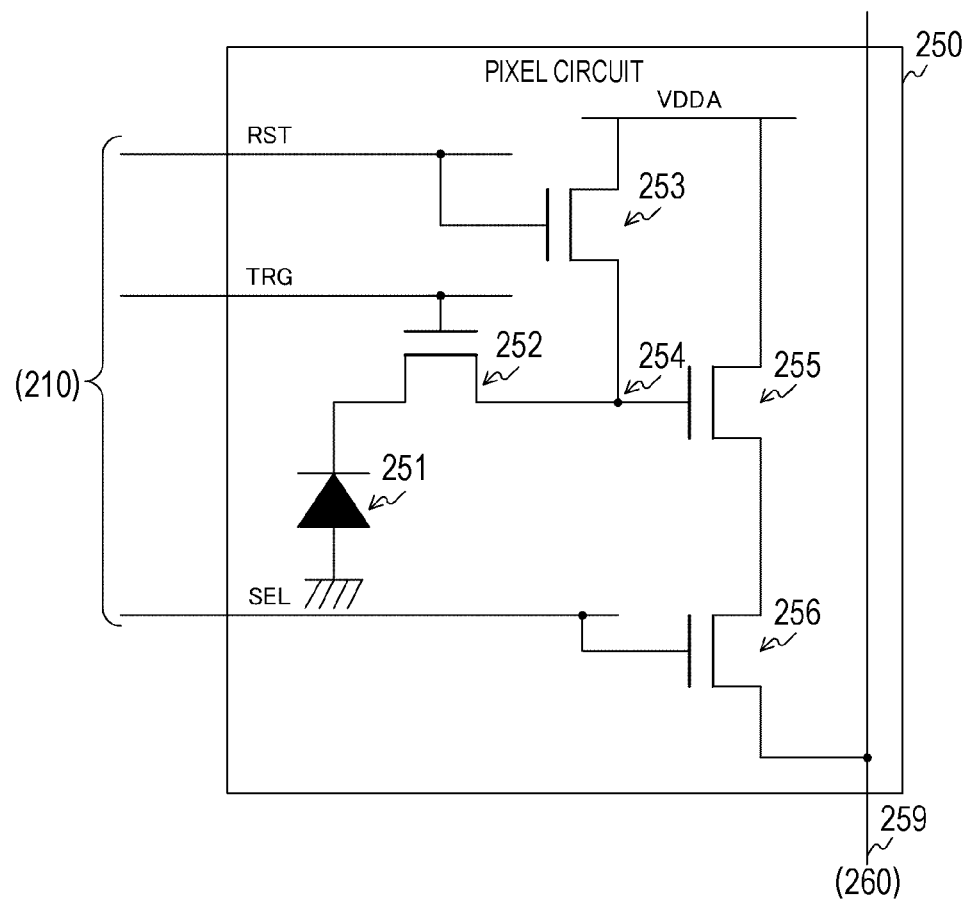
FIG. 4 is a circuit diagram depicting a configuration example of a pixel circuit in the first embodiment of the present technology.

FIG. 4 is a circuit diagram depicting a configuration example of the pixel circuit 250 in the first embodiment of the present technology. The pixel circuit 250 includes a photoelectric conversion element 251, a transfer transistor 252, a reset transistor 253, a floating diffusion layer 254, an amplification transistor 255, and a selection transistor 256. Furthermore, vertical signal lines 259 are wired for every column along a vertical direction in the pixel array section 240.

The photoelectric conversion element 251 photoelectrically converts incident light to generate a charge. The transfer transistor 252 transfers the charge from the photoelectric conversion element 251 to the floating diffusion layer 254 in accordance with a drive signal TRG from the vertical scanning circuit 210.

The reset transistor 253 extracts and initializes the charge from the floating diffusion layer 254 in accordance with a drive signal RST from the vertical scanning circuit 210.

The floating diffusion layer 254 accumulates the charge and generates a voltage corresponding to the amount of the charge. The amplification transistor 255 amplifies the voltage of the floating diffusion layer 254.

The selection transistor 256 outputs a signal of the amplified voltage as a pixel signal to the column signal processing section 260 via the vertical signal line 259 in accordance with a drive signal SEL from the vertical scanning circuit 210.

Configuration Example of Column Signal Processing Section

Figure 5:
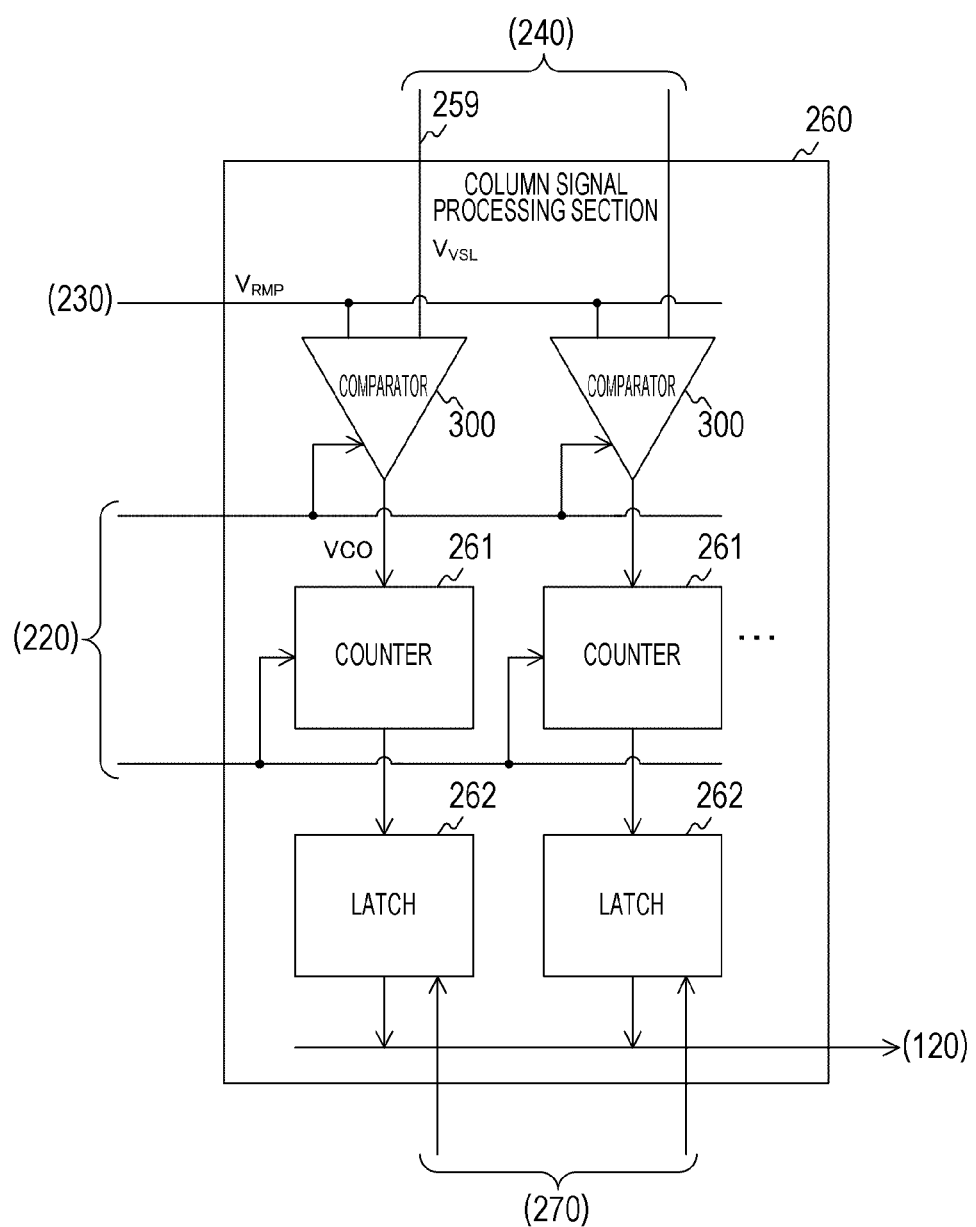
FIG. 5 is a block diagram depicting a configuration example of a column signal processing section in the first embodiment of the present technology.

FIG. 5 is a block diagram depicting a configuration example of the column signal processing section 260 in the first embodiment of the present technology. In the column signal processing section 260, a comparator 300, a counter 261, and a latch 262 are arranged for every column. in a case where the number of columns is N (N is an integer), N comparators 300, N counters 261, and N latches 262 are arranged.

The comparator 300 compares the reference signal from the DAC 230 with the pixel signal from the corresponding column. Hereinafter, a potential of the reference signal is referred to as a reference potential $V_{RMP}$, and a potential of the vertical signal line 259 that transmits the pixel signal is referred to as an input potential $V_{VSL}$. The comparator 300 supplies an output signal VCO indicating a comparison result to the counter 261 of the corresponding column.

Furthermore, a level (that is, the input potential $V_{VSL}$) of the pixel signal when the pixel circuit 250 is initialized is hereinafter referred to as a "reset level", and a level of the pixel signal when the charge is transferred to the floating diffusion layer 254 is hereinafter referred to as a "signal level".

The counter 261 counts a count value over a period until the output signal VCO is inverted. For example, the counter 261 performs down-count over a period until the output signal VCO corresponding to the reset level is inverted, and performs up-count over a period until the output signal VCO corresponding to the signal level is inverted. Therefore, correlated double sampling (CDS) processing is implemented to obtain a difference between the reset level and the signal level.

Then, the counter 261 causes the latch 262 to hold a digital signal indicating the count value. The comparator 300 and the counter 261 implement AD conversion processing to convert an analog pixel signal into a digital signal. That is, the comparator 300 and the counter 261 function as an ADC. The ADC using the comparator and the counter as described above is generally called a single-slope ADC.

Note that the CDS processing is implemented by the up-count and the down-count, but is not limited to this configuration. The counter 261 may perform only any one of up-count and the down-count, and a circuit in the subsequent stage may execute the CDS processing of obtaining the difference.

The latch 262 holds the digital signal. The latch 262 outputs the held digital signal under the control of the horizontal scanning circuit 270.

Configuration Example of Comparator

Figure 6:
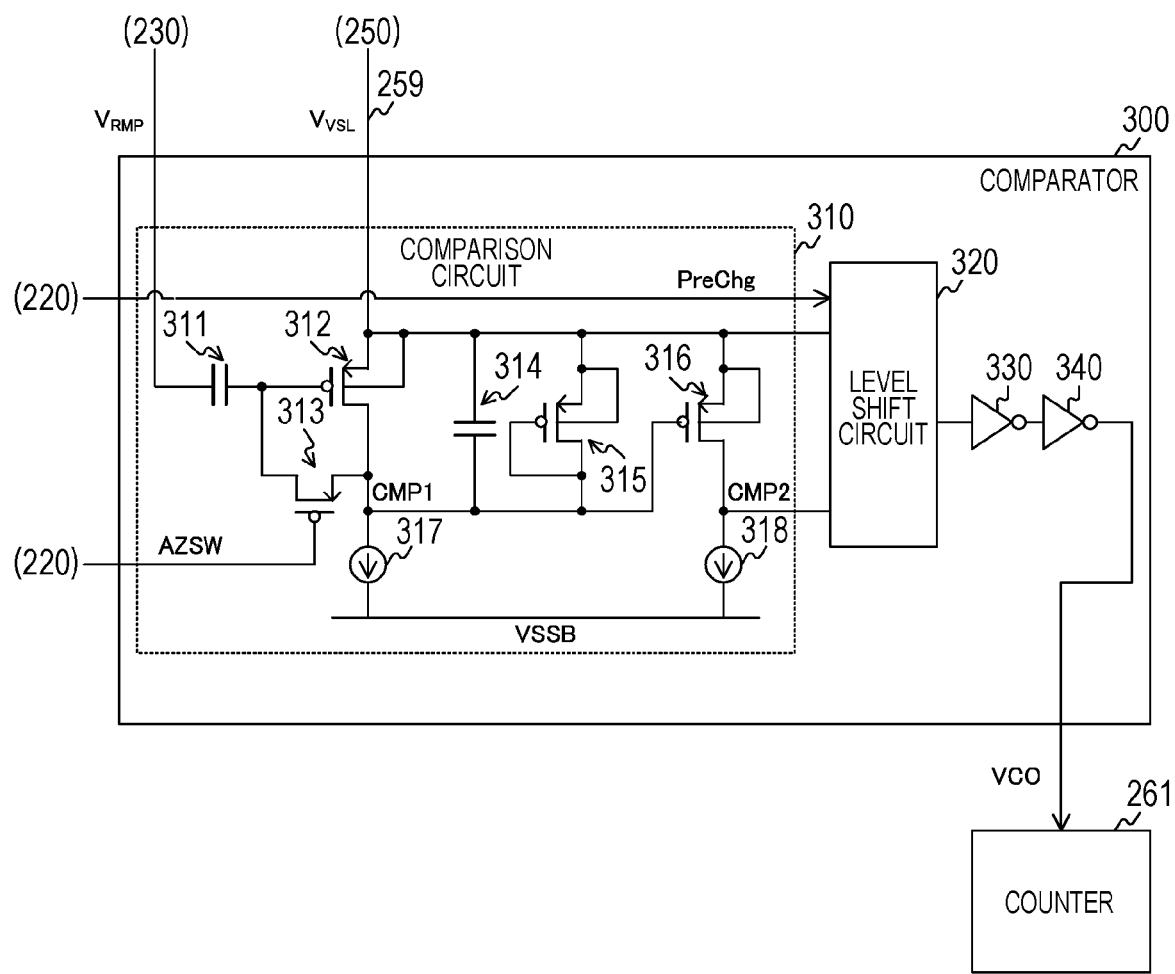
FIG. 6 is a circuit diagram depicting a configuration example of a comparator in the first embodiment of the present technology.

FIG. 6 is a circuit diagram depicting a configuration example of the comparator 300 in the first embodiment of the present technology. The comparator 300 includes a comparison circuit 310, a level shift circuit 320, and inverters 330 and 340.

In the comparison circuit 310, capacitors 311 and 314, an input transistor 312, an auto-zero transistor 313, a clamp transistor 315, an output transistor 316, and current sources 317 and 318 are provided.

The capacitor 311 is inserted between the DAC 230 and a gate of the input transistor 312.

The input transistor 312 has a source connected to the vertical signal line 259, and the input potential $V_{VSL}$, which is the potential of the vertical signal line 259, is input to the source. Furthermore, the reference potential $V_{RMP}$ is input to the gate of the input transistor 312 via the capacitor 311. When the input potential $V_{VSL}$ input to the source and the reference potential $V_{RMP}$ input to the gate substantially match, the input transistor 312 outputs a signal at a level corresponding to the input potential $V_{VSL}$ and the reference potential $V_{RMP}$ from a drain as a comparison result CMP1. Here, "substantially matching" means that respective potentials of comparison targets completely match or a difference therebetween is within a predetermined allowable value. This allowable value is set to a threshold Vt of the input transistor 312. As the input transistor 312, for example, a pMOS transistor is used.

Furthermore, it is desirable that a back gate and the source of the input transistor 312 are short-circuited in order to suppress a back gate effect.

The auto-zero transistor 313 short-circuits between the gate and the drain of the input transistor 312 in accordance with a control signal AZSW from the timing control section 220. As the auto-zero transistor 313, for example, a pMOS transistor is used.

The current source 317 is inserted between the drain of the input transistor 312 and a predetermined standard potential VSSB. The current source 317 supplies a constant current. The current source 317 is achieved by an n-channel metal-oxide-semiconductor (nMOS) transistor or the like.

The capacitor 314 is inserted between the source and the drain of the input transistor 312.

The clamp transistor 315 is inserted between the source and the drain of the input transistor 312. As the clamp transistor 315, a p-channel MOS (pMOS) transistor is used, and a gate thereof is short-circuited to a drain. Furthermore, a back gate and a source of the clamp transistor 315 are desirably short-circuited. The clamp transistor 315 can suppress a decrease in a drain voltage when the input transistor 312 is in an off state. A potential lower than the input potential $V_{VSL}$ by a drain-source voltage of the clamp transistor 315 is hereinafter referred to as a "clamp potential $V_{CLP}$".

A source of the output transistor 316 is connected to the vertical signal line 259, and the input potential $V_{VSL}$ is input to the source. Furthermore, a gate of the output transistor 316 is connected to the drain of the input transistor 312, and receives an input of the comparison result CMP1. As the output transistor 316, for example, a pMOS transistor is used. Furthermore, a back gate and the source of the output transistor 316 are desirably short-circuited.

The output transistor 316 outputs a signal indicating whether or not a difference between the input potential $V_{VSL}$ input to the source and the comparison result CMP1 input to the gate exceeds a predetermined threshold voltage from a drain as a comparison result CMP2. The comparison result CMP2 is input to the level shift circuit 320.

Here, when the pixel signal and the reference signal substantially match, the drain voltage (that is, the comparison result CMP1) of the input transistor 312 varies according to the level of the pixel signal. Therefore, in a case where the comparison result CMP1 is input to, for example, a subsequent circuit having a fixed threshold based on a ground potential, a timing at which the drain voltage is inverted may deviate from an ideal timing at which the pixel signal and the reference signal substantially match.

The connection in the drawing allows a drain-source voltage of the input transistor 312 to be input as a gate-source voltage of the output transistor 316. Since a variation amount of the drain voltage of the input transistor 312 is equal to a variation amount of the voltage of the pixel signal, the comparison result CMP2 from the output transistor 316 is inverted at the ideal timing at which the pixel signal and the reference signal substantially match. In a case where the comparison result CMP2 is connected to, for example, the subsequent circuit having the fixed threshold based on the ground potential, the comparison result CMP2 varies depending on the level of the pixel signal similarly to the comparison result CMP1, but an error is less likely to be seen since a gain is higher than that of the comparison result CMP1. In this manner, the error in the inversion timing can be suppressed by adding the output transistor 316.

The current source 318 is inserted between the drain of the output transistor 316 and the standard potential VSSB, and supplies a constant current. The current source 318 is achieved by an nMOS transistor or the like. Hereinafter, a potential on the power supply side of the current source 318 (that is, potential higher than the standard potential VSSB by a drain-source voltage Vds of the nMOS transistor) is referred to as a "current source operation potential Vds'".

Note that the capacitor 314, the clamp transistor 315, and the output transistor 316 are arranged in the comparison circuit 310, it is also possible to adopt a configuration in which at least one of these is not provided. In a case where the output transistor 316 is not provided, the current source 318 is unnecessary.

The reference potential $V_{RMP}$ is set to be higher than that of the auto-zero time when the AD conversion is started, and decreases with the lapse of time within an AD conversion period. Here, the AD conversion period is a period for which the counter 261 performs counting. At the start of the AD conversion period, the input transistor 312 of the first stage is set to the off state, a current flows through the clamp transistor 315, and the clamp potential $V_{CLP}$ determined by the clamp transistor 315 is output as the comparison result CMP1. The output transistor 316 of the second stage is set to an on state, and outputs the input potential $V_{VSL}$ as the comparison result CMP2.

Then, when the reference potential $V_{RMP}$ decreases and a gate potential of the input transistor 312 in the substantially matching state described above becomes lower than a value obtained by subtracting the threshold Vt of the input transistor from the input potential $V_{VSL}$, the input transistor 312 of the first stage transitions to the on state, and the comparison result CMP1 is inverted to the input potential $V_{VSL}$. The output transistor 316 of the second stage transitions to the off state, and the comparison result CMP2 is inverted to the current source operation potential Vds'.

In this manner, the comparison circuit 310 compares the input potential $V_{VSL}$ with the reference potential $V_{RMP}$, and outputs one of the input potential $V_{VSL}$ and the current source operation potential Vds' as the comparison result CMP2.

The level shift circuit 320 outputs any one of a pair of potentials (in other words, a high level and a low level) having a larger potential difference than the input potential $V_{VSL}$ and the current source operation potential Vds' to the inverter 330 as an output signal on the basis of the comparison result CMP2. The high level is set to, for example, a power supply potential higher than the input potential $V_{VSL}$. The low level is set to be substantially the same as the current source operation potential Vds', for example. Note that the input potential $V_{VSL}$ and the current source operation potential Vds' correspond to an example of a pair of output potentials described in the claims. The power supply potential and the current source operation potential Vds' correspond to an example of a pair of shift potentials described in the claims.

The inverter 330 determines whether or not the output signal of the level shift circuit 320 is higher than a predetermined threshold, and outputs a determination result to the inverter 340. The threshold is set to a potential between the power supply potential and the current source operation potential Vds'. Furthermore, the determination result is set to the low level in a case where the output signal of the level shift circuit 320 is at the high level, and the determination result is set to the high level in a case where the output signal is at the low level.

The inverter 340 has a circuit configuration similar to that of the inverter 330. The inverter 340 outputs the determination result to the counter 261 as the output signal VCO.

Note that another logic gate such as a buffer or a negative OR (NOR) gate may be provided instead of the inverter 330. The inverter 330 is an example of a logic gate described in the claims.

Configuration Example of Level Shift Circuit

Figures 7, 8:
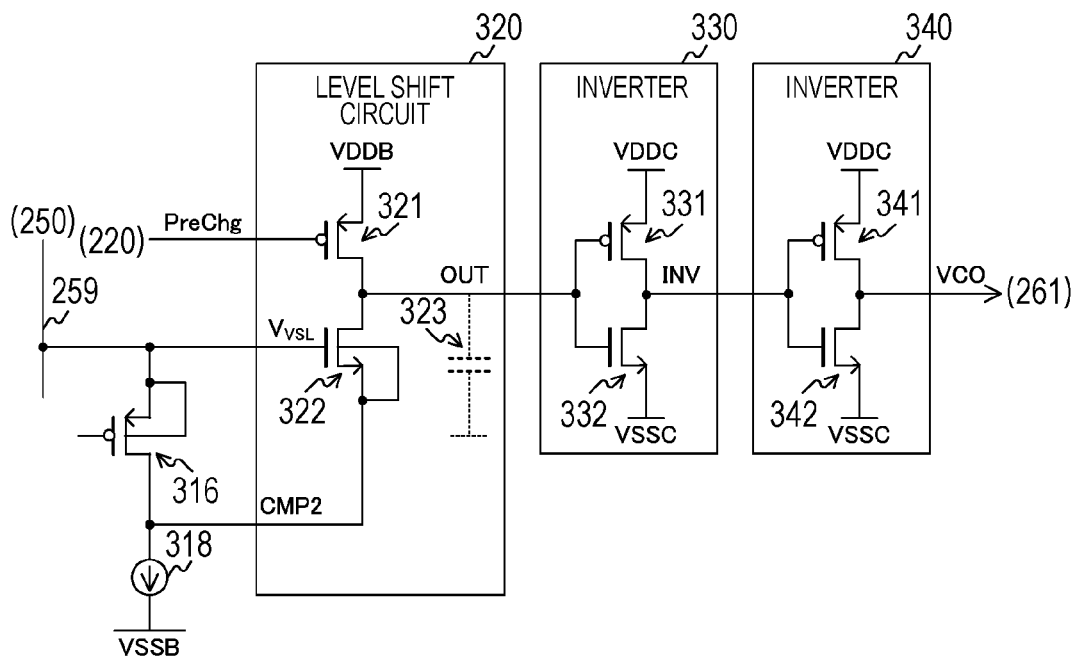
FIG. 7 is a circuit diagram depicting a configuration example of a level shift circuit and inverters in the first embodiment of the present technology.
FIG. 8 is a diagram for describing a variation in an output value of each stage in the first embodiment of the present technology.

FIG. 7 is a circuit diagram depicting a configuration example of the level shift circuit 320 and the inverters 330 and 340 in the first embodiment of the present technology. The level shift circuit 320 includes a precharge transistor 321 and an nMOS transistor 322. For example, a pMOS transistor is used as the precharge transistor 321.

Furthermore, the inverter 330 includes a pMOS transistor 331 and an nMOS transistor 332. The inverter 340 includes a pMOS transistor 341 and an nMOS transistor 342.

The precharge transistor 321 has a source connected to a power supply potential VDDB and a gate to which an input of a control signal PreChg from the timing control section 220 is input. The precharge transistor 321 has a drain connected to a drain of the nMOS transistor 322. Here, the power supply potential VDDB is a power supply potential different from a power supply potential VDDA of the pixel circuit 250. Furthermore, the comparators 300 of the respective columns are connected in common to a power supply line that supplies the power supply potential VDDB.

The nMOS transistor 322 has a gate connected to the vertical signal line 259 and a source to which the comparison result CMP2 from the output transistor 316 is input. Furthermore, a connection node of the precharge transistor 321 and the nMOS transistor 322 is connected to the inverter 330, and an output signal OUT is output from the connection node. A back gate and the source of the nMOS transistor 322 are short-circuited.

The pMOS transistor 331 and the nMOS transistor 332 in the inverter 330 are connected in series between a power supply potential VDDC and a standard potential VSSC. The output signal OUT is input to the gates of these transistors. An inverted signal INV is output from the connection node of the pMOS transistor 331 and the nMOS transistor 332 to the inverter 340. Here, the power supply potential VDDC is a power supply potential lower than the power supply potential VDDB. Furthermore, the standard potential VSSC is a potential different from the standard potential VSSB.

The pMOS transistor 341 and the nMOS transistor 342 in the inverter 340 are connected in series between the power supply potential VDDC and the standard potential VSSC. The inverted signal INV is input to the gates of these transistors. The output signal VCO is output from a connection node of the pMOS transistor 341 and the nMOS transistor 342 to the counter 261.

The inverters 330 and 340 can convert the power supply potential VDDB of the preceding stage into the power supply potential VDDC.

The timing control section 220 sets the precharge transistor 321 in the on state by the control signal PreChg immediately before the AD conversion period. The precharge transistor 321 in the on state precharges a parasitic capacitance 323 and initializes the drain of the nMOS transistor 322 to the power supply potential VDDB. Furthermore, the precharge transistor 321 is controlled to the off state during the AD conversion period.

When the AD conversion is started, the comparison result CMP2 becomes the input potential $V_{VSL}$ (high level). At this time, the nMOS transistor 322 is set to the off state, and the power supply potential VDDB of the precharged parasitic capacitance 323 is output as the output signal OUT.

Then, when the comparison result CMP2 is inverted to the current source operation potential Vds' (low level), the nMOS transistor 322 transitions to the on state, and the potential of the output signal OUT is inverted to the current source operation potential Vds'.

FIG. 8 is a diagram for describing a variation in an output value of each stage in the first embodiment of the present technology. When the AD conversion is started, the reference potential $V_{RMP}$ is set to be higher than an auto-zero potential $V_{AZ}$. At this time, the input transistor 312 of the first stage outputs the comparison result CMP1 of the clamp potential $V_{CLP}$ (low level). According to the comparison result CMP1, the output transistor 316 of the second stage outputs the comparison result CMP2 of the input potential $V_{VSL}$ (high level).

According to the comparison result CMP2, the nMOS transistor 322 of the third stage outputs the output signal OUT of the power supply potential VDDB (high level). According to the output signal OUT, the inverter 330 of the fourth stage outputs the inverted signal INV of the standard potential VSSC (low level). According to the inverted signal INV, the inverter 340 of the fifth stage outputs the output signal VCO of the power supply potential VDDC (high level).

Then, when the reference potential $V_{RMP}$ decreases and the gate potential of the input transistor 312 in the substantially matching state described above becomes lower than the value obtained by subtracting the threshold Vt of the input transistor from the input potential $V_{VSL}$ in the AD conversion period, the comparison result CMP1 that is the output of the first stage is inverted to the input potential $V_{VSL}$ (high level). According to the comparison result CMP1, the comparison result CMP2, which is the output of the second stage, is inverted to the current source operation potential Vds' (low level).

According to the comparison result CMP2, the output signal OUT of the third stage is inverted to the current source operation potential Vds' (low level). According to the output signal OUT, the inverted signal INV, which is the output of the fourth stage, is inverted to the power supply potential VDDC (high level). According to the inverted signal INV, the output signal VCO, which is the output of the fifth stage, is inverted to the standard potential VSSC (low level).

Figure 9:
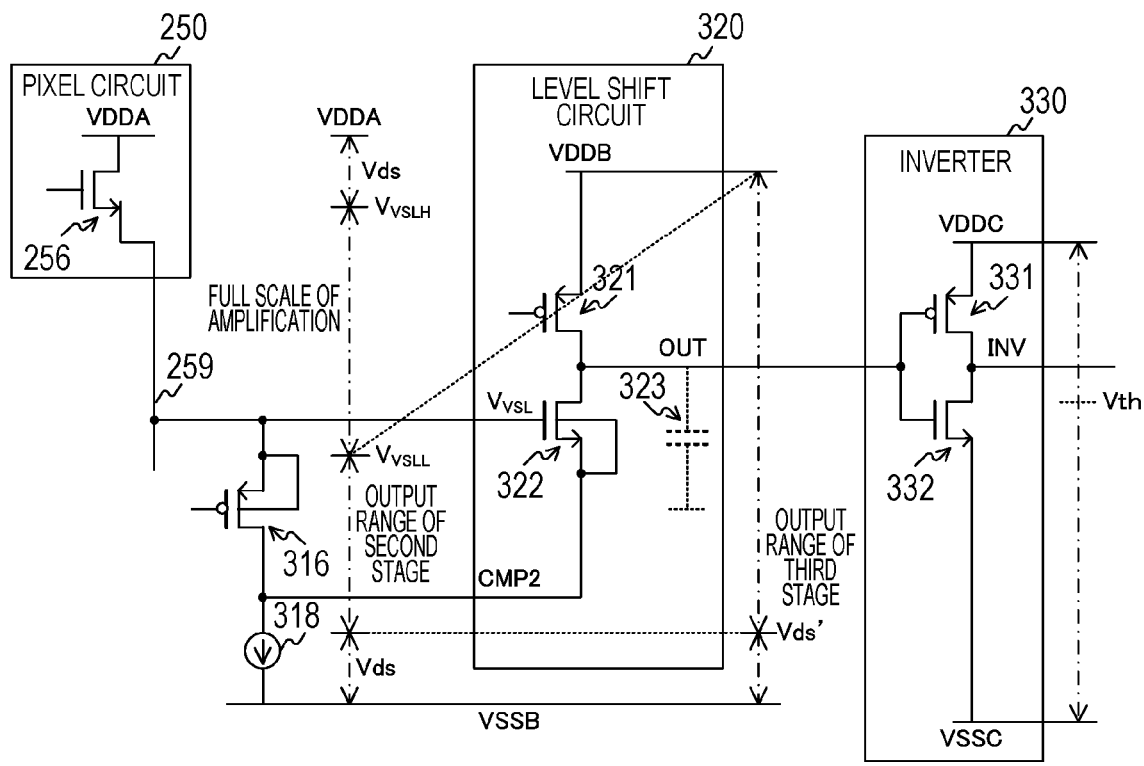
FIG. 9 is a diagram for describing an output range of each stage in the first embodiment of the present technology.

FIG. 9 is a diagram for describing an output range of each stage in the first embodiment of the present technology. A drain-source voltage of the amplification transistor 255 in the pixel circuit 250 in the on state when light is not incident is denoted by Vds. In this case, the maximum potential (that is, input potential $V_{VSL}$) of the vertical signal line 259 becomes a potential $V_{VSLH}$ lower than the power supply potential VDDA of the pixel circuit 250 by Vds.

Furthermore, the potential of the vertical signal line 259 varies depending on a received light amount of light received by the pixel circuit 250, and a potential (so-called white level) of the vertical signal line 259 when the received light amount is maximum is denoted by $V_{VSLL}$. A range from the potential $V_{VSLL}$ to the potential $V_{VSLH}$ corresponds to a full scale of amplitude of the vertical signal line 259. Furthermore, a potential on the power supply side of the current source 318 is the current source operation potential Vds'. Therefore, an output range of the second stage is from the current source operation potential Vds' to the potential $V_{VSLH}$ at the maximum, and from the current source operation potential Vds' to the potential $V_{VSLL}$ at the minimum. The output range of the second stage of the drawing indicates a range when the white level is output.

The nMOS transistor 322 in the level shift circuit 320 outputs the output signal OUT of the current source operation potential Vds' according to the input of the comparison result CMP2 of the current source operation potential Vds'. Furthermore, the nMOS transistor 322 outputs the output signal OUT of the power supply potential VDDB according to the input of the comparison result CMP2 of the input potential $V_{VSL}$. Therefore, the output range of the third stage is from the current source operation potential Vds' to the power supply potential VDDB.

The inverter 330 of the fourth stage outputs the power supply potential VDDC or the standard potential VSSC depending on whether or not the output signal OUT is higher than the threshold Vth. Therefore, an output range of the fourth stage is from the standard potential VSSC to the power supply potential VDDC.

As illustrated in the drawing, the pixel circuit 250, the output transistor 316, and the current source 318 are connected in series, and thus, the output range of the second stage is narrowed as compared with the case where these are connected in parallel. In particular, when the white level is output, the output range of the second stage becomes extremely narrow.

Here, a comparative example in which the level shift circuit 320 is not provided and an output (comparison result CMP2) of the second stage is directly input to the inverter 330 is assumed. When the input (comparison result CMP2) of the inverter 330 is at a high level, there is a case where the level does not exceed the threshold Vth since an output range of the second stage is narrow in this comparative example. In this case, an output (inverted signal INV) of the inverter 330 does not become a low level, and a malfunction occurs in the inverter 330.

Furthermore, when the input (comparison result CMP2) of the inverter 330 is at the high level, there is a case where the level becomes a value close to the threshold Vth since the output range of the second stage is narrow in this comparative example. In this case, both the pMOS transistor 331 and the nMOS transistor 332 in the inverter 330 are set to an on state, and there is a possibility that a leakage current flows to the inverter 330.

In the comparative example, it is necessary to sufficiently increase a power supply potential so as not to cause the malfunction and the like and to reduce the threshold in order to prevent the malfunction and the leakage current, so that a degree of freedom in design decreases.

On the other hand, in a case where the level shift circuit 320 is provided, the power supply potential VDDB is output according to the input potential $V_{VSL}$ of the level shift circuit 320, and thus, a voltage range on the input side of the inverter 330 can be expanded from that of the comparative example. As the voltage range is expanded, a difference between a lower limit and an upper limit of the range and the threshold of the inverter 330 becomes sufficiently large, so that the malfunction and the leakage current of the inverter 330 can be prevented. Therefore, constraints in design for preventing the malfunction and the leakage current of the inverter 330 are mitigated, and the degree of freedom in design is improved. Note that the level shift circuit 320 expands only the power supply side, but can also expands only the ground side by shifting the current source operation potential Vds' on the ground side to the standard potential VSSB without shifting the input potential $V_{VSL}$ on the power supply side.

Operation Example of Solid-State Imaging Element

Figure 10:
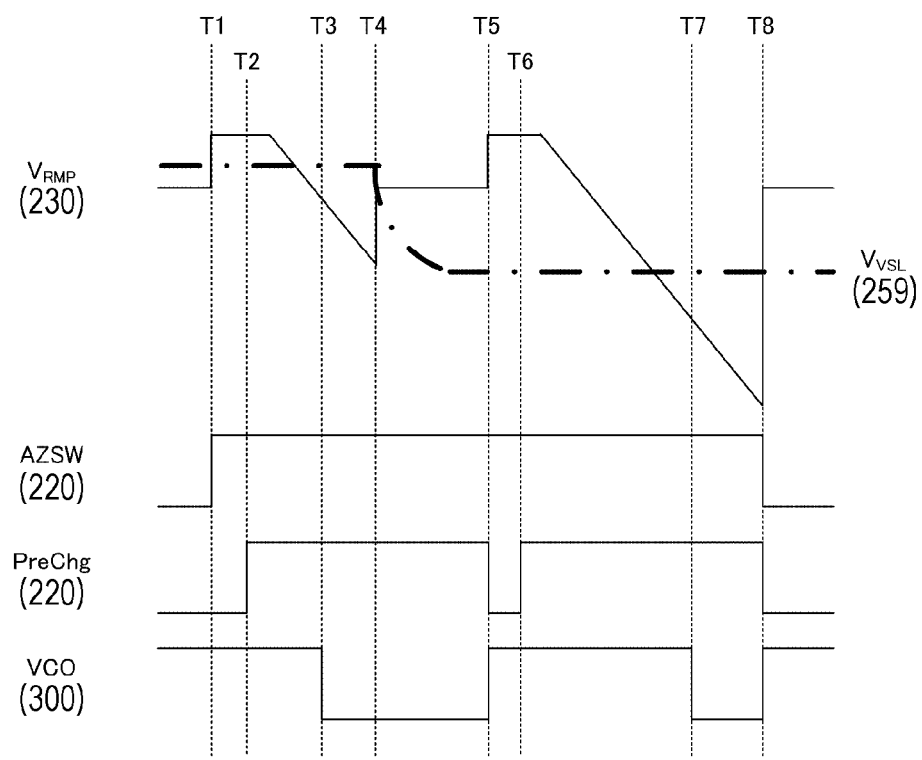
FIG. 10 is a timing chart depicting an example of the operation of the solid-state imaging element in the first embodiment of the present technology.

FIG. 10 is a timing chart depicting an example of the operation of the solid-state imaging element 200 in the first embodiment of the present technology. An alternate long and short dash line in the drawing indicates a variation in the potential (input potential $V_{VSL}$) of the vertical signal line 259.

The timing control section 220 sets the control signal AZSW from the low level to the high level at a timing T1 at the end of the auto-zero period to set the auto-zero transistor 313 in the off-state.

Furthermore, the timing control section 220 sets the control signal PreChg to the low level and causes the precharge transistor 321 to be precharged until a timing T2 before the start of the AD conversion. The control signal PreChg is controlled to the high level from the timing T2 to a timing T5.

The DAC 230 gradually decreases the reference potential $V_{RMP}$ over the AD conversion period of the reset level from immediately after the timing T2 to a timing T4. At a timing T3 in the AD conversion period, a difference between the reference potential $V_{RMP}$ and the potential $V_{VSL}$ of the vertical signal line 259 is assumed to be equal to or lower than an allowable value (a gate-source voltage Vgs of the input transistor 312). At this time, the output signal VCO of the comparator 300 is inverted from the high level to the low level.

Then, the potential (input potential $V_{VSL}$) of the vertical signal line transitions from the reset level to the signal level in a period between the timings T4 and T5.

The timing control section 220 sets the control signal PreChg to the low level and causes the precharge transistor 321 to be precharged between the timings T5 and T6 before the start of the AD conversion of the signal level. The control signal PreChg is controlled to the high level from the timing T6 to a timing T8.

The DAC 230 gradually decreases the reference potential $V_{RMP}$ over the AD conversion period of the reset level from immediately after the timing T6 to the timing T8. At a timing T7 in the AD conversion period, the difference between the reference potential $V_{RMP}$ and the potential $V_{VSL}$ of the vertical signal line 259 is assumed to be equal to or lower than the allowable value (gate-source voltage Vgs). At this time, the output signal VCO of the comparator 300 is inverted from the high level to the low level.

As illustrated in the drawing, the precharge is performed immediately before the AD conversion period of the reset level and immediately before the AD conversion period of the signal level.

Figure 11:
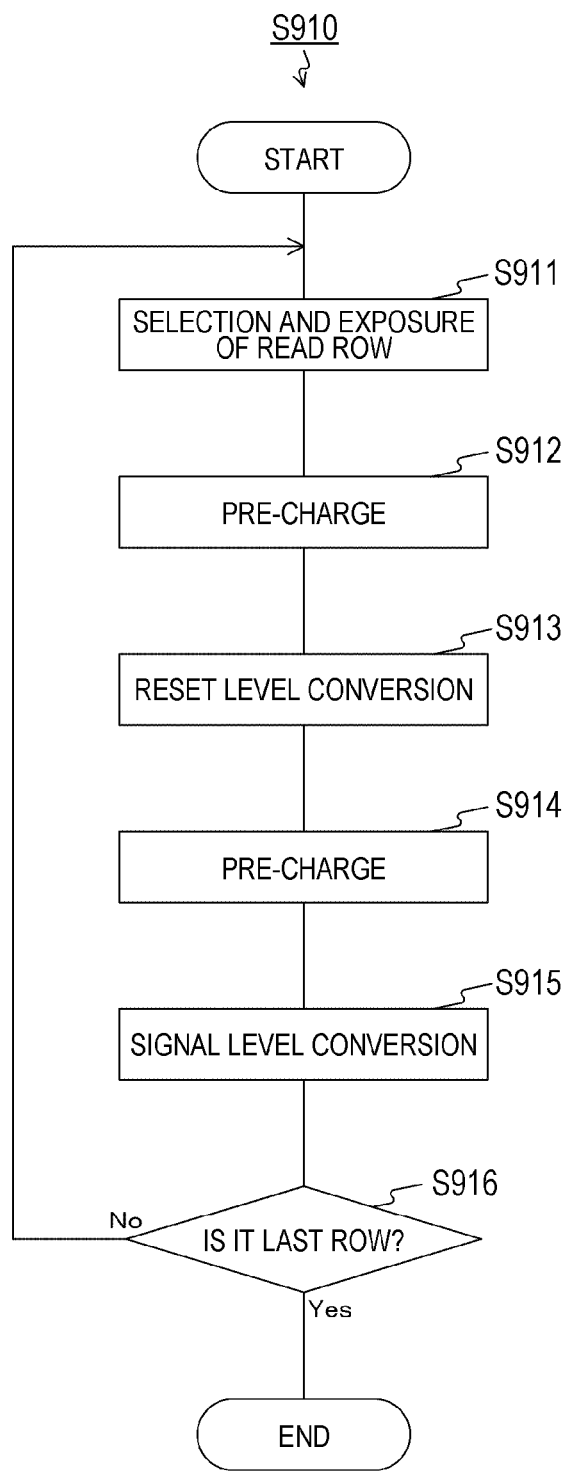
FIG. 11 is a flowchart depicting an example of the operation of the solid-state imaging element in the first embodiment of the present technology.

FIG. 11 is a flowchart depicting an example of the operation of the solid-state imaging element 200 in the first embodiment of the present technology. This operation is started, for example, when a predetermined application for imaging image data is executed.

The vertical scanning circuit 210 selects and exposes a read row (step S911). The precharge transistor 321 performs precharge (step 912). The column signal processing section 260 performs AD conversion of the reset level for every column (step 913). The precharge transistor 321 performs precharge (step 914), and the column signal processing section 260 performs AD conversion of the signal level for every column (step 915). Then, the vertical scanning circuit 210 determines whether or not the read row is the last row (step S916).

In a case where the read row is not the last row (step S916: No), the solid-state imaging element 200 repeats step S911 and the subsequent steps. On the other hand, in a case where the read row is the last row (step S916: Yes), the solid-state imaging element 200 ends the operation for imaging.

Note that the operation of the timing chart illustrated in FIG. 10 corresponds to steps S912 to S915 in FIG. 11.

In a case where a plurality of pieces of image data is continuously imaged, steps S911 to S916 are repeatedly executed in synchronization with the vertical synchronization signal.

In this manner, according to the first embodiment of the present technology, the level shift circuit 320 outputs one of the pair of potentials having the larger potential difference than the input potential $V_{VSL}$ and the current source operation potential Vds', and thus, the voltage range on the input side of the inverter 330 can be expanded. As the voltage range is expanded, a difference between a lower limit and an upper limit of the range and the threshold of the inverter 330 becomes sufficiently large, so that the malfunction and the leakage current of the inverter 330 can be prevented. Therefore, the constraints in design on the power supply voltage and the threshold for preventing the malfunction and the leakage current are mitigated, and the degree of freedom in design can be improved.

First Modified Example

In the first embodiment described above, the level shift circuit 320 expands a voltage range from the current source operation potential Vds' to the input potential $V_{VSL}$ to a voltage range from the current source operation potential Vds' to the power supply voltage VDDB. However, when the current source operation potential Vds' is relatively high, there is a possibility that a malfunction and a leakage current of the inverter 330 occur. The solid-state imaging element 200 of a first modified example of the first embodiment is different from that of the first embodiment in that a voltage range is further expanded.

Figure 12:
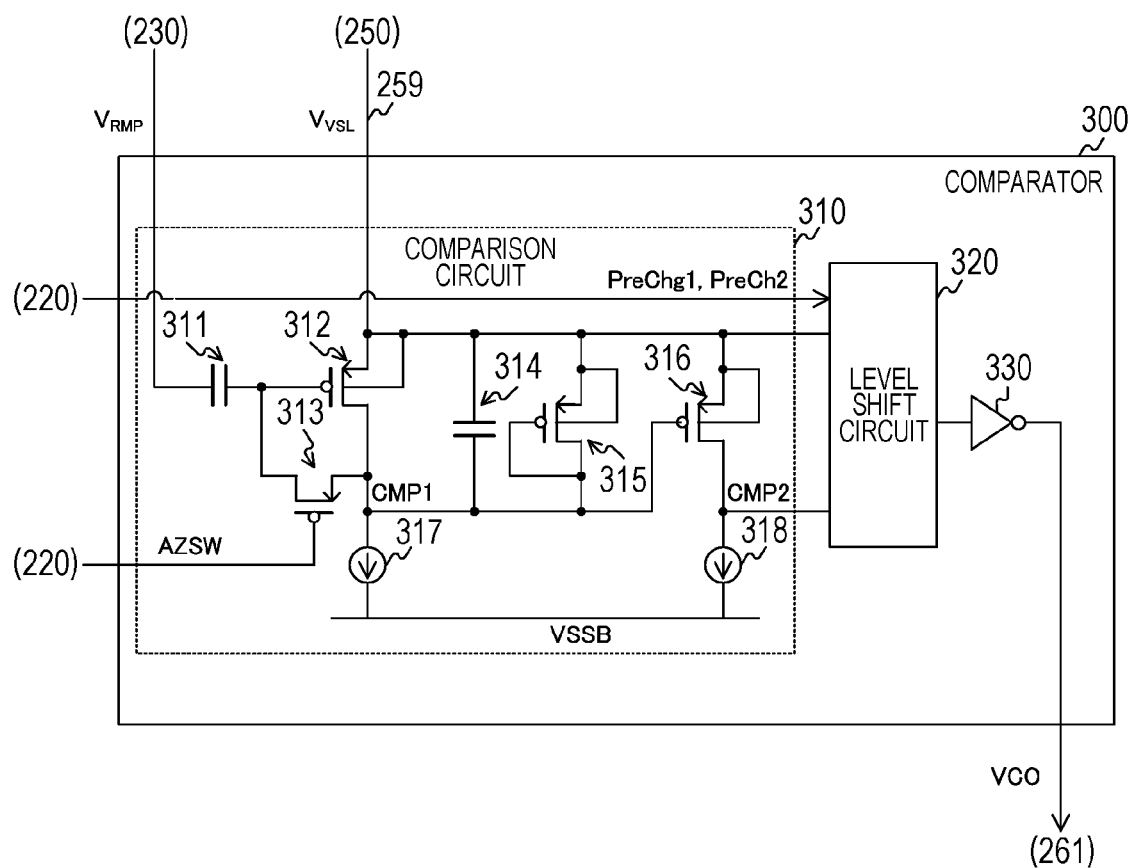
FIG. 12 is a circuit diagram depicting a configuration example of a comparator in a first modified example of the first embodiment of the present technology.

FIG. 12 is a circuit diagram depicting a configuration example of the comparator 300 in the first modified example of the first embodiment of the present technology. The comparator 300 according to the first modified example of the first embodiment is different from that of the first embodiment in that the inverter 340 is not provided.

Furthermore, control signals PreChg1 and PreChg2 from the timing control section 220 are input to the level shift circuit 320 of the first modified example of the first embodiment.

Figure 13:
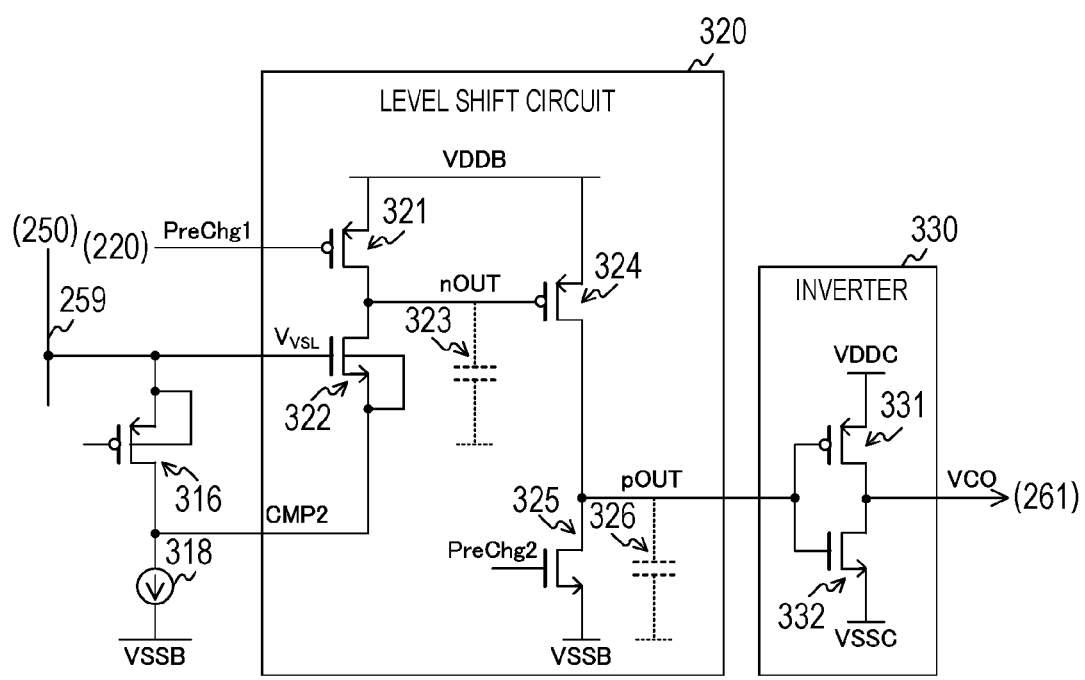
FIG. 13 is a circuit diagram depicting a configuration example of a level shift circuit and an inverter in the first modified example of the first embodiment of the present technology.

FIG. 13 is a circuit diagram depicting a configuration example of the level shift circuit 320 and the inverter 330 in the first modified example of the first embodiment of the present technology. The level shift circuit 320 of the first modified example of the first embodiment is different from that of the first embodiment in terms of further including a pMOS transistor 324 and a precharge transistor 325. For example, an nMOS transistor is used as the precharge transistor 325.

The pMOS transistor 324 has a source connected to the power supply potential VDDB and a gate connected to a connection node of the precharge transistor 321 and the nMOS transistor 322. An output signal nOUT is output from the connection node. The pMOS transistor 324 has a drain connected to a drain of the precharge transistor 325.

The precharge transistor 325 has a source connected to the standard potential VSSB and a gate to which the control signal PreChg2 is input. Furthermore, a connection node of the pMOS transistor 324 and the precharge transistor 325 is connected to the inverter 330, and an output signal pOUT is output from the connection node.

Note that the precharge transistor 321 is an example of a power-supply-side precharge transistor described in the claims. The nMOS transistor 322 is an example of an N-type transistor described in the claims. The pMOS transistor 324 is an example of a P-type transistor described in the claims. The precharge transistor 325 is an example of a standard-side precharge transistor described in the claims.

The timing control section 220 sets the precharge transistors 321 and 325 in an on state by the control signals PreChg1 and PreChg2 immediately before an AD conversion period. The precharge transistor 321 in the on state precharges a parasitic capacitance 323 and initializes the drain of the nMOS transistor 322 to the power supply potential VDDB. Furthermore, the precharge transistor 325 in the on state precharges the parasitic capacitance 326 and initializes the drain of the nMOS transistor 322 to the standard potential VSSB. Furthermore, the precharge transistors 321 and 325 are controlled to an off state during the AD conversion period.

When the AD conversion is started, the comparison result CMP2 becomes the input potential $V_{VSL}$ (high level). At this time, the nMOS transistor 322 is set to the off state, and the power supply potential VDDB of the precharged parasitic capacitance 323 is output as the output signal nOUT. According to the output signal nOUT, the pMOS transistor 324 is set to the off state, and the standard potential VSSB of the precharged parasitic capacitance 326 is output as the output signal pOUT.

Then, when the comparison result CMP2 is inverted to the current source operation potential Vds' (a low level), the nMOS transistor 322 transitions to the on state, and a potential of the output signal nOUT is inverted to the current source operation potential Vds'. Then, according to the output signal nOUT, the pMOS transistor 324 transitions to the on state, and a potential of the output signal pOUT is inverted to the power supply potential VDDB.

Figure 14:
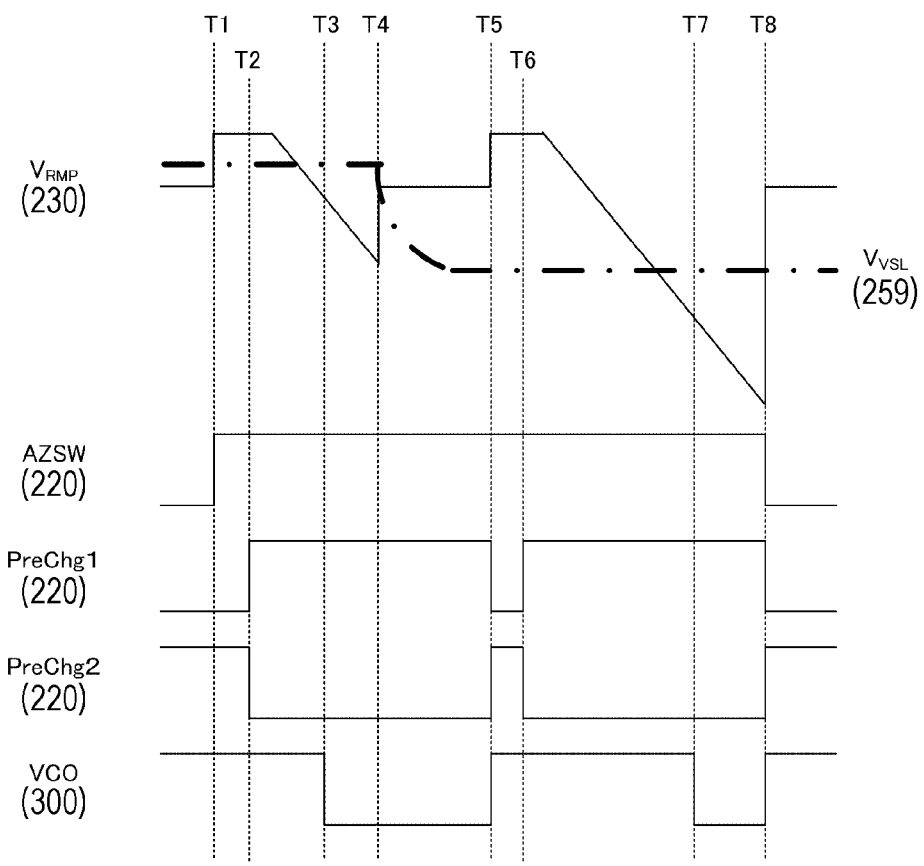
FIG. 14 is a timing chart depicting an example of the operation of a solid-state imaging element in the first modified example of the first embodiment of the present technology.

FIG. 14 is a timing chart depicting an example of the operation of the solid-state imaging element 200 in the first modified example of the first embodiment of the present technology.

The timing control section 220 sets the control signal PreChg1 to the low level and sets the control signal PreChg2 to the high level to precharge the precharge transistors 321 and 325 until a timing T2 before the start of AD conversion. From the timing T2 to a timing T5, the control signal PreChg1 is controlled to the high level, and the control signal PreChg2 is controlled to the low level.

Furthermore, the timing control section 220 sets the control signal PreChg1 to the low level and sets the control signal PreChg2 to the high level to precharge the precharge transistors 321 and 325 between the timings T5 and T6. From the timing T6 to a timing T8, the control signal PreChg1 is controlled to the high level, and the control signal PreChg2 is controlled to the low level.

Figure 15:
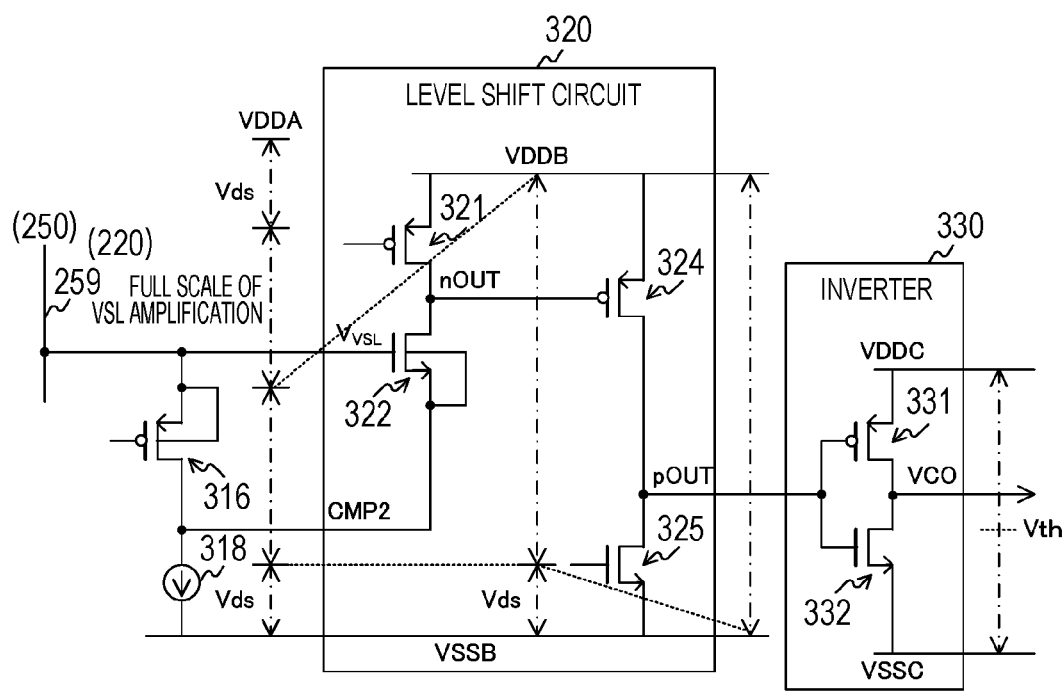
FIG. 15 is a diagram for describing an output range of each stage in the first modified example of the first embodiment of the present technology.

FIG. 15 is a diagram for describing an output range of each stage in the first modified example of the first embodiment of the present technology. Output ranges of the second stage and the third stage are similar to those of the first embodiment.

The pMOS transistor 324 in the level shift circuit 320 outputs the output signal pOUT of the standard potential VSSB according to an input of the output signal nOUT of the power supply potential VDDB. Furthermore, the pMOS transistor 324 outputs the output signal pOUT of the power supply potential VDDB according to an input of the output signal nOUT of the current source operation potential Vds'. Therefore, the output range of the third stage is from the standard potential VSSB to the power supply potential VDDB.

As illustrated in the drawing, the pMOS transistor 324 of the fourth stage further expands the voltage range from the current source operation potential Vds' to the power supply potential VDDB to a voltage range from the standard potential VSSB to the power supply voltage VDDB. Therefore, it is possible to more reliably prevent the malfunction and the leakage current of the inverter 330.

In this manner, in the first modified example of the first embodiment of the present technology, the pMOS transistor 324 further expands the voltage range from the current source operation potential Vds' to the power supply potential VDDB to the voltage range from the standard potential VSSB to the power supply voltage VDDB. Therefore, it is possible to more reliably prevent the malfunction and the leakage current of the inverter 330.

Second Modified Example

In the first modified example of the first embodiment described above, the nMOS transistor 322 has the gate connected to the vertical signal line 259 and the source connected to the connection node of the output transistor 316 and the current source 318. In this connection configuration, however, there is a possibility that the nMOS transistor 322 is set to an on state in an auto-zero period so that a leakage current flows through the transistor. The solid-state imaging element 200 according to a second modified example of the first embodiment is different from that of the first modified example of the first embodiment in that a leakage current is prevented by a short circuit between a gate and a source of an nMOS transistor 322.

Figure 16:
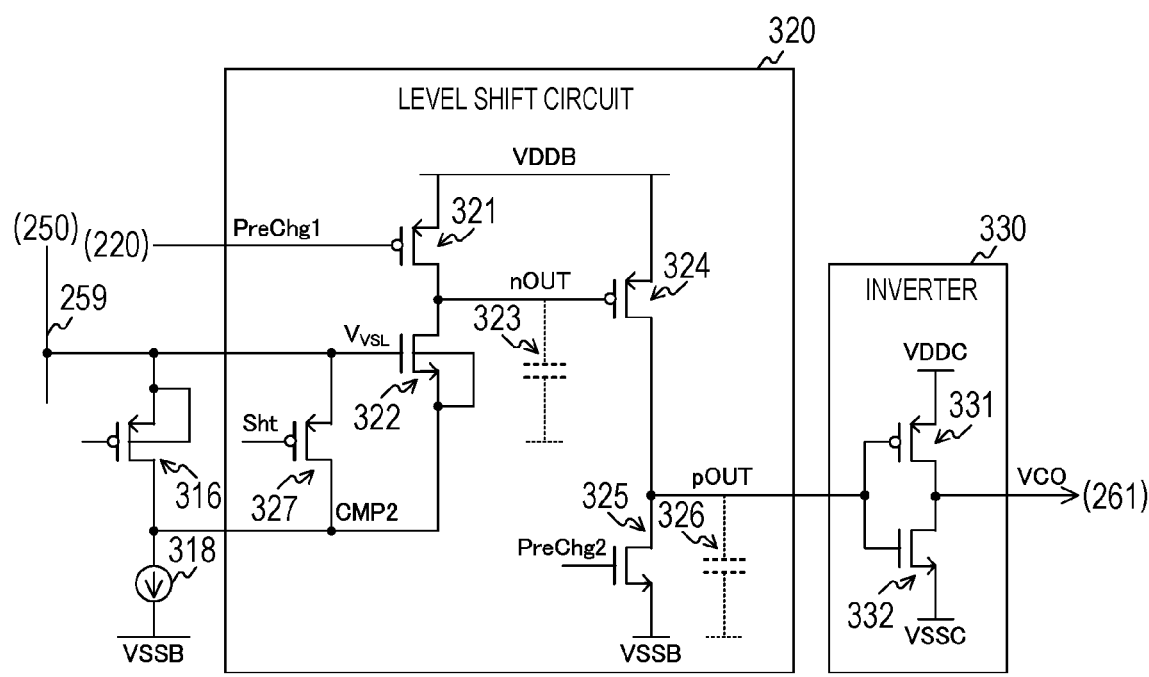
FIG. 16 is a circuit diagram depicting a configuration example of a level shift circuit and an inverter in a second modified example of the first embodiment of the present technology.

FIG. 16 is a circuit diagram depicting a configuration example of the level shift circuit 320 and the inverter 330 in the second modified example of the first embodiment of the present technology. The level shift circuit 320 of the second modified example of this second embodiment is different from that of the first modified example of the first embodiment in terms of further including a short-circuit transistor 327.

The short-circuit transistor 327 short-circuits the gate and the source of the nMOS transistor 322 in accordance with a control signal Sht from the timing control section 220. As the short-circuit transistor 327, for example, a pMOS transistor is used.

In the auto-zero period, the auto-zero transistor 313 is set to the on state. A potential of a reference signal at this time is set as an auto-zero potential. In the auto-zero period, an output (comparison result CMP2) of the second stage also becomes the auto-zero potential. On the other hand, a potential of the vertical signal line 259 is a reset level. Therefore, a potential difference is generated between the potential (reset level) of the gate and the potential (auto-zero potential) of the source in the nMOS transistor 322, and there is a possibility that the nMOS transistor 322 is set to the on state in a case where the short-circuit transistor 327 is absent. When the nMOS transistor 322 is set to the on state, the precharge transistor 321 is also set to the on state in the auto-zero period, and thus, there is a possibility that a leakage current flows through the precharge transistor 321, the nMOS transistor 322, and the current source 318.

Therefore, the timing control section 220 short-circuits the gate and the source of the nMOS transistor 322 by setting the short-circuit transistor 327 to the on state in the auto-zero period. Therefore, the nMOS transistor 322 can be set to an off state to prevent the leakage current.

Figure 17:
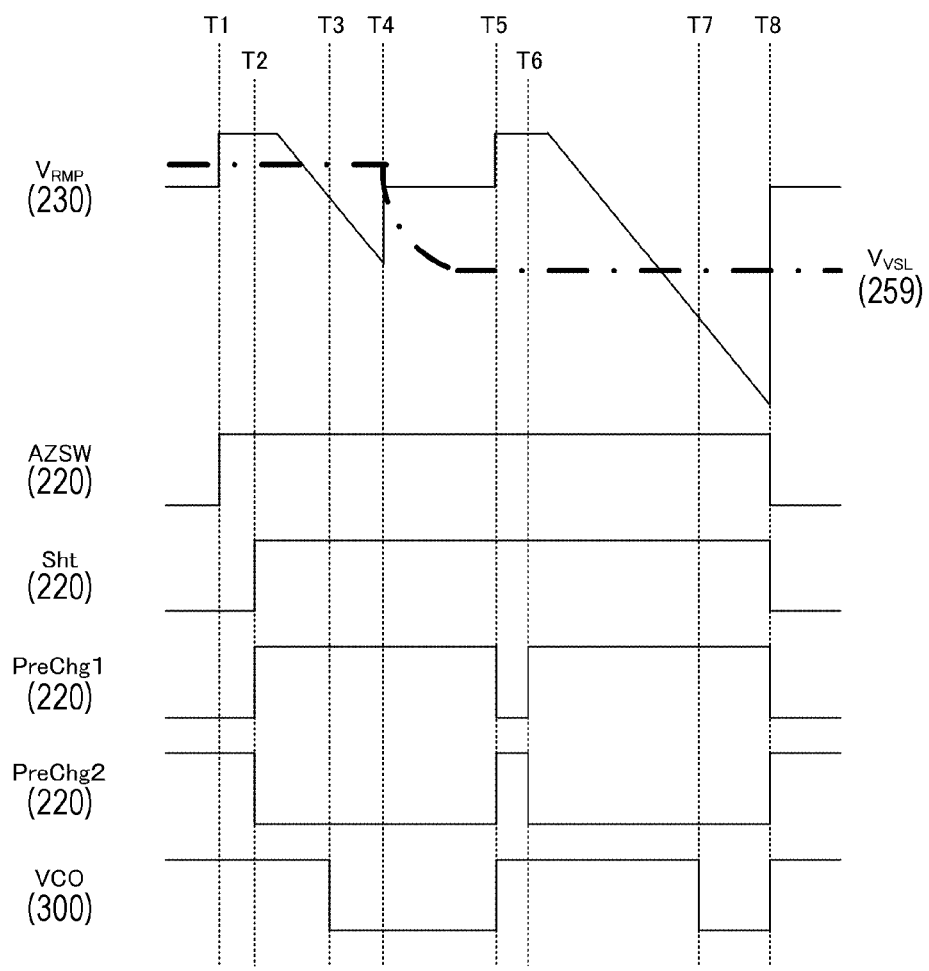
FIG. 17 is a timing chart depicting an example of an operation of a solid-state imaging element in the second modified example of the first embodiment of the present technology.

FIG. 17 is a timing chart depicting an example of the operation of the solid-state imaging element 200 in the second modified example of the first embodiment of the present technology. The timing control section 220 sets the control signal Sht to a low level and short-circuits the gate and the source of the nMOS transistor 322 until a timing T2 immediately after the auto-zero period. From the timing T2 to a timing T8, the control signal Sht is controlled to a high level.

Figure 18:
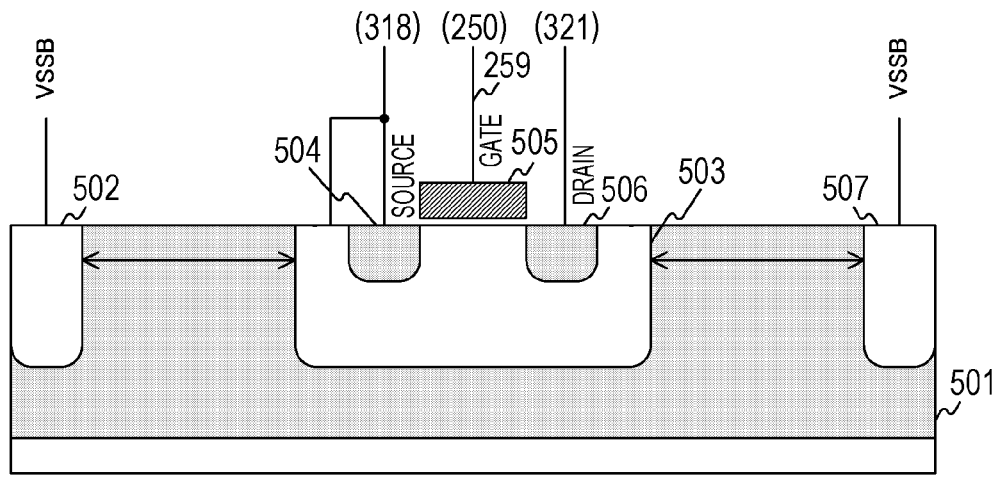
FIG. 18 is an example of a cross-sectional view of the solid-state imaging element in the second modified example of the first embodiment of the present technology.

FIG. 18 is an example of a cross-sectional view of the solid-state imaging element 200 in the second modified example of the first embodiment of the present technology. An n layer 501 is formed on a p-type substrate. In the n layer 501, p layers 502, 503, and 507 are formed. The p layers 502 and 507 are connected to the standard potential VSSB.

Furthermore, n layers 504 and 506 are formed in the p layer 503, and a gate electrode 505 is provided with an oxide film interposed therebetween. The p layer 503, the n layers 504 and 506, and the gate electrode 505 function as the nMOS transistor 322. The n layer 504 is used as the source of the nMOS transistor 322 and is connected to a back gate (the p layer 503). Furthermore, the n layer 506 is used as a drain of the nMOS transistor 322.

A potential of the back gate (p layer 503) is the same as the output of the second stage and is different from the standard potential VSSB. Therefore, a well isolation region having a sufficient length is provided between each of the p layers 502 and 507 and the p layer 503. A line segment with an arrow in the drawing indicates the length of the well isolation region.

Note that the short-circuit transistor 327 of the second modified example can be added to the first embodiment in which the pMOS transistor 324 is not provided in the subsequent stage.

In this manner, the nMOS transistor 322 can be set to the off state since the short-circuit transistor 327 short-circuits the gate and the source of the nMOS transistor 322 in the auto-zero period according to the second modified example of the first embodiment of the present technology. Therefore, the leakage current flowing through the nMOS transistor 322 can be prevented.

Third Modified Example

In the second modified example of the first embodiment described above, the back gate of the nMOS transistor 322 is connected to the source. In this configuration, however, the well isolation region needs to be sufficiently long, and it is difficult to reduce a mounting area. A third modified example of the first embodiment is different from the second modified example of the first embodiment in that a back gate of the nMOS transistor 322 is connected (grounded) to the standard potential VSSB to shorten a width of a well isolation region.

Figure 19:
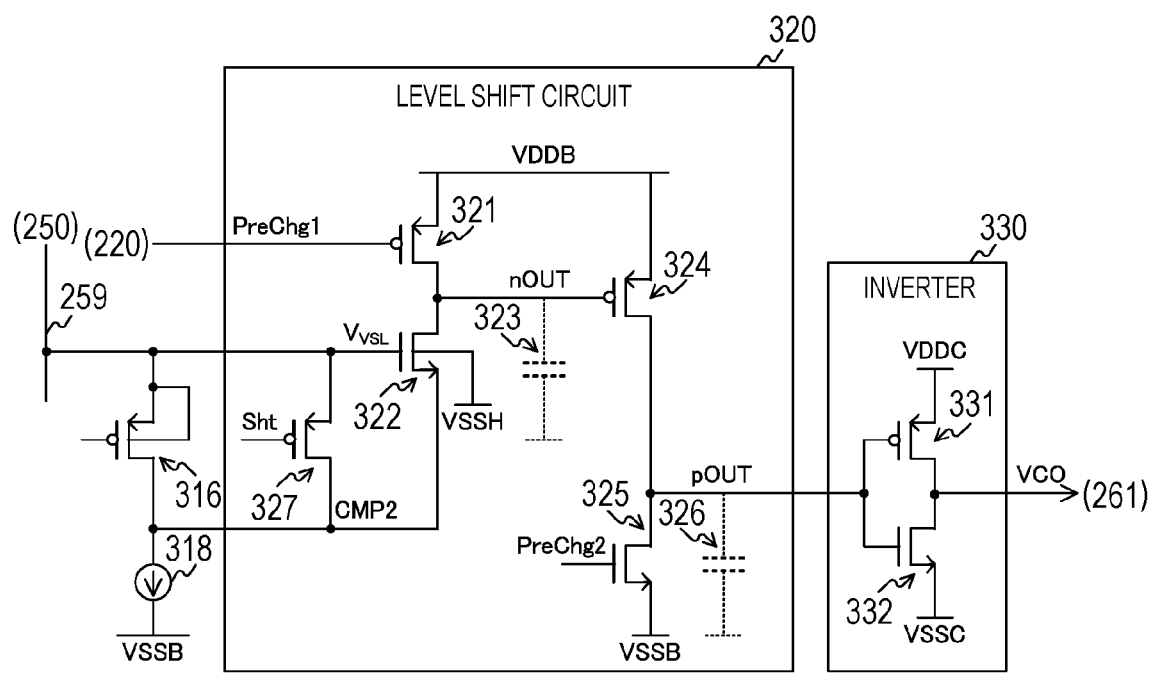
FIG. 19 is a circuit diagram depicting a configuration example of a level shift circuit and an inverter in a third modified example of the first embodiment of the present technology.

FIG. 19 is a circuit diagram depicting a configuration example of the level shift circuit 320 and the inverter 330 in the third modified example of the first embodiment of the present technology. The level shift circuit 320 of the third modified example of the first embodiment is different from that of the second modified example of the first embodiment in that the back gate of the nMOS transistor 322 is connected to the standard potential VSSB.

Figure 20:
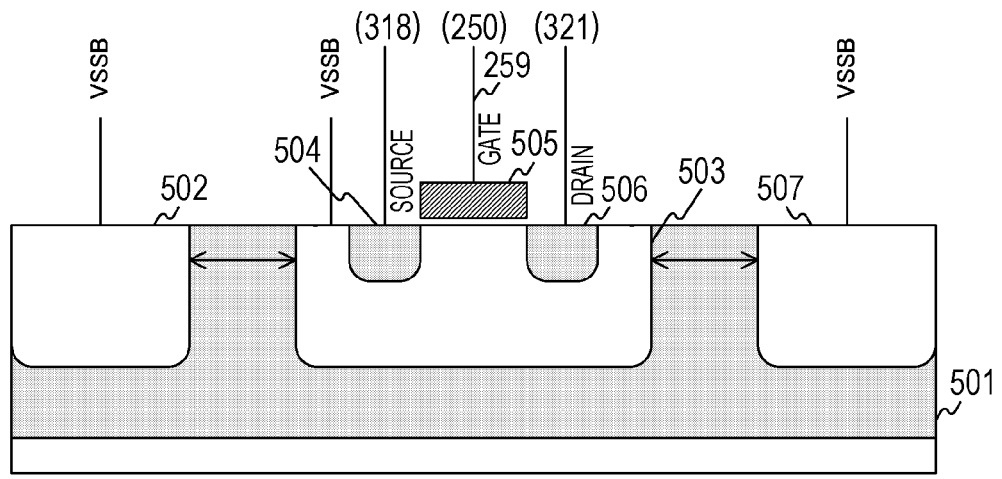
FIG. 20 is an example of a cross-sectional view of a solid-state imaging element in the third modified example of the first embodiment of the present technology.

FIG. 20 is an example of a cross-sectional view of the solid-state imaging element 200 in the third modified example of the first embodiment of the present technology. As illustrated in the drawing, the back gate (p layer 503) of the nMOS transistor 322 is connected to the standard potential VSSB. Since the p layer 503 has the same potential as the p layers 502 and 507, the well isolation region therebetween can be shortened as compared with the second modified example of the first embodiment. Therefore, the mounting area can be reduced.

Note that the third modified example can also be applied to the first embodiment or the first modified example of the first embodiment.

In this manner, the well isolation region can be shortened since the back gate of the nMOS transistor 322 is connected to the standard potential VSSB in the third modified example of the first embodiment of the present technology. Therefore, the mounting area can be reduced.

Fourth Modified Example

In the second modified example of the first embodiment described above, the nMOS transistor 322 has the source to which the output (comparison result CMP2) of the second stage is input, and the gate connected to the vertical signal line. In this connection configuration, however, in a case where a low level (the current source operation potential Vds') of the comparison result CMP2 of the second stage is relatively high, there is a possibility that the nMOS transistor 322 is not set to an on state. The solid-state imaging element 200 according to a fourth modified example of the first embodiment is different from that of the second modified example of the first embodiment in that a pMOS transistor is provided instead of the nMOS transistor 322.

Figure 21:
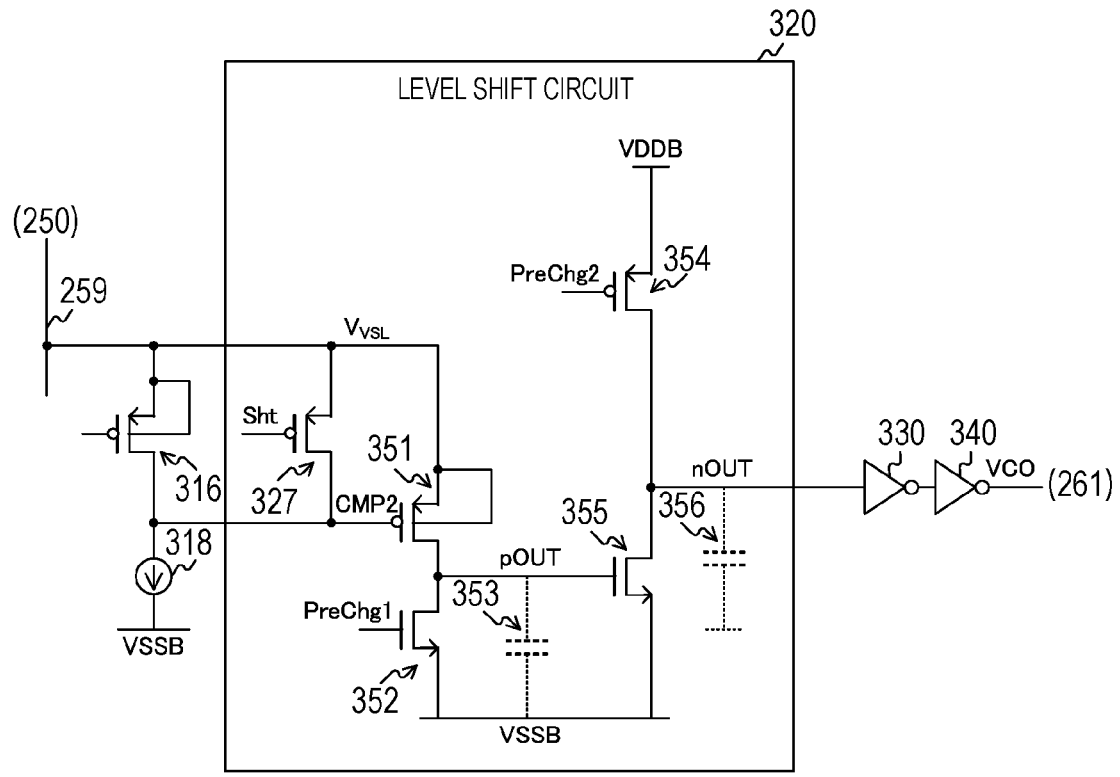
FIG. 21 is a circuit diagram depicting a configuration example of a level shift circuit in a fourth modified example of the first embodiment of the present technology.

FIG. 21 is a circuit diagram depicting a configuration example of the level shift circuit 320 in the fourth modified example of the first embodiment of the present technology. The level shift circuit 320 of the fourth modified example of the first embodiment is different from that of the second modified example of the first embodiment in that a pMOS transistor 351 is provided instead of the nMOS transistor 322. Furthermore, an nMOS transistor 355 is provided instead of the pMOS transistor 324. Precharge transistors 352 and 354 are provided instead of the precharge transistors 321 and 325. As the precharge transistors 352 and 354, for example, an nMOS transistor and a pMOS transistor are used. Moreover, the inverter 340 is added, which is different from the second modified example of the first embodiment.

The pMOS transistor 351 has a source connected to the vertical signal line 259 and a gate to which the comparison result CMP2 is input. The pMOS transistor 351 has a drain connected to a drain of the precharge transistor 352.

Furthermore, the short-circuit transistor 327 short-circuits the gate and the source of the pMOS transistor 351.

The precharge transistor 352 has a source connected to the standard potential VSSB and a gate to which the control signal PreChg1 is input. Furthermore, the output signal pOUT is output from a connection node of the pMOS transistor 351 and the precharge transistor 352.

The nMOS transistor 355 has a source connected to the standard potential VSSB and a gate connected to the connection node of the pMOS transistor 351 and the precharge transistor 352. The nMOS transistor 355 has a drain connected to a drain of the precharge transistor 354.

The precharge transistor 354 has a source connected to the power supply potential VDDB and a gate to which the control signal PreChg2 is input. Furthermore, a connection node of the precharge transistor 354 and the nMOS transistor 355 is connected to the inverter 330, and the output signal nOUT is output from the connection node.

Note that the pMOS transistor 351 is an example of a P-type transistor described in the claims. The precharge transistor 352 is an example of a standard-side precharge transistor described in the claims. The precharge transistor 354 is an example of a power-supply-side precharge transistor described in the claims. The nMOS transistor 355 is an example of an N-type transistor described in the claims.

The timing control section 220 sets the precharge transistors 352 and 354 in the on state by the control signals PreChg1 and PreChg2 immediately before an AD conversion period. The precharge transistor 352 in the on state precharges the parasitic capacitance 353 and initializes the drain of the pMOS transistor 351 to the standard potential VSSB. Furthermore, the precharge transistor 354 in the on state precharges the parasitic capacitance 356 and initializes the drain of the nMOS transistor 355 to the power supply potential VDDB. Furthermore, the precharge transistors 352 and 354 are controlled to an off state during the AD conversion period.

When the AD conversion is started, the comparison result CMP2 becomes the input potential $V_{VSL}$ (high level). At this time, the pMOS transistor 351 is set to the off state, and the standard potential VSSB of the precharged parasitic capacitance 353 is output as the output signal pOUT. According to the output signal pOUT, the nMOS transistor 355 is set to the off state, and the standard potential VDDB of the precharged parasitic capacitance 356 is output as the output signal nOUT.

Then, when the comparison result CMP2 is inverted to the current source operation potential Vds' (low level), the pMOS transistor 351 transitions to the on state, and the potential of the output signal pOUT is inverted to the input potential $V_{VSL}$. Then, according to the output signal pOUT, the nMOS transistor 355 transitions to the on state, and the potential of the output signal nOUT is inverted to the standard potential VSSB.

Since the pMOS transistor 351 is used instead of the nMOS transistor 322, an operation voltage of the transistor can be easily secured even at a high voltage at which a signal range of the vertical signal line exceeds the power supply potential VDDB of the level shift circuit 320, and VDDB can be freely set.

Note that it is also possible to adopt a configuration in which the precharge transistor 354 and the nMOS transistor 355 in the fourth stage are not provided. In this case, the inverter 340 is unnecessary. Furthermore, it is also possible to adopt a configuration in which the short-circuit transistor 327 is not provided. Furthermore, the third modified example in which the back gate of the nMOS transistor 322 is connected to the standard potential VSSB can also be applied to the fourth modified example of the first embodiment.

Figure 22:
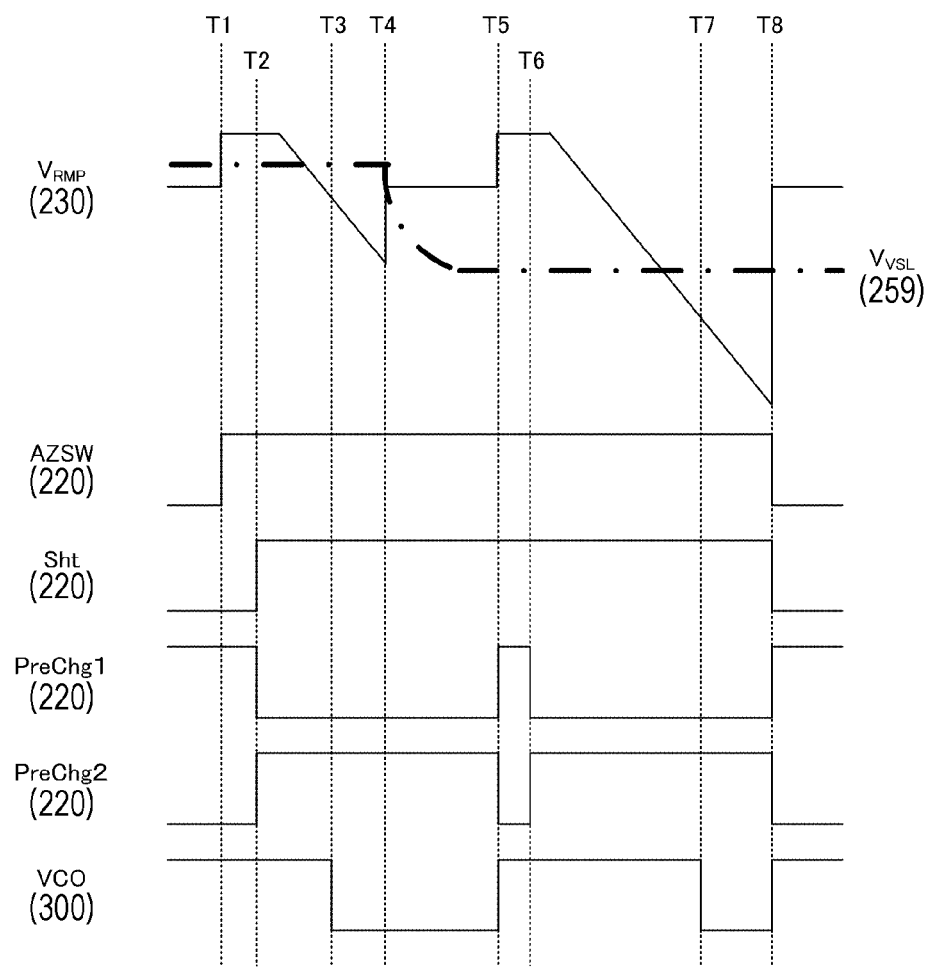
FIG. 22 is a timing chart depicting an example of the operation of a solid-state imaging element in the fourth modified example of the first embodiment of the present technology.

FIG. 22 is a timing chart depicting an example of the operation of the solid-state imaging element 200 in the fourth modified example of the first embodiment of the present technology.

The timing control section 220 sets the control signal PreChg1 to the high level and sets the control signal PreChg2 to the low level to precharge the precharge transistors 321 and 325 until a timing T2 before the start of AD conversion. From the timing T2 to a timing T5, the control signal PreChg1 is controlled to the low level, and the control signal PreChg2 is controlled to the high level.

Furthermore, the timing control section 220 sets the control signal PreChg1 to the high level and sets the control signal PreChg2 to the low level to precharge the precharge transistors 321 and 325 between the timings T5 and T6. From the timing T6 to a timing T8, the control signal PreChg1 is controlled to the low level, and the control signal PreChg2 is controlled to the high level.

In this manner, since the pMOS transistor 351 is provided in the subsequent stage of the second stage in the fourth modified example of the first embodiment of the present technology, the power supply potential VDDB of the level shift circuit 320 is not involved in the operation of the pMOS transistor, and thus, the operation voltage of the transistor can be easily secured, and VDDB can be freely set.

Fifth Modified Example

In the first embodiment described above, the input transistor 312 has the source to which the vertical signal line 259 is connected and the gate to which the reference potential $V_{RMP}$ is input. In this configuration However, it is difficult to further reduce a power supply voltage of the comparator 300. The solid-state imaging element 200 according to a fifth modified example of the first embodiment is different from that of the first embodiment in that a power supply potential of the comparator 300 is lowered by voltage division of the reference potential $V_{RMP}$ and the input potential $V_{VSL}$.

Figure 23:
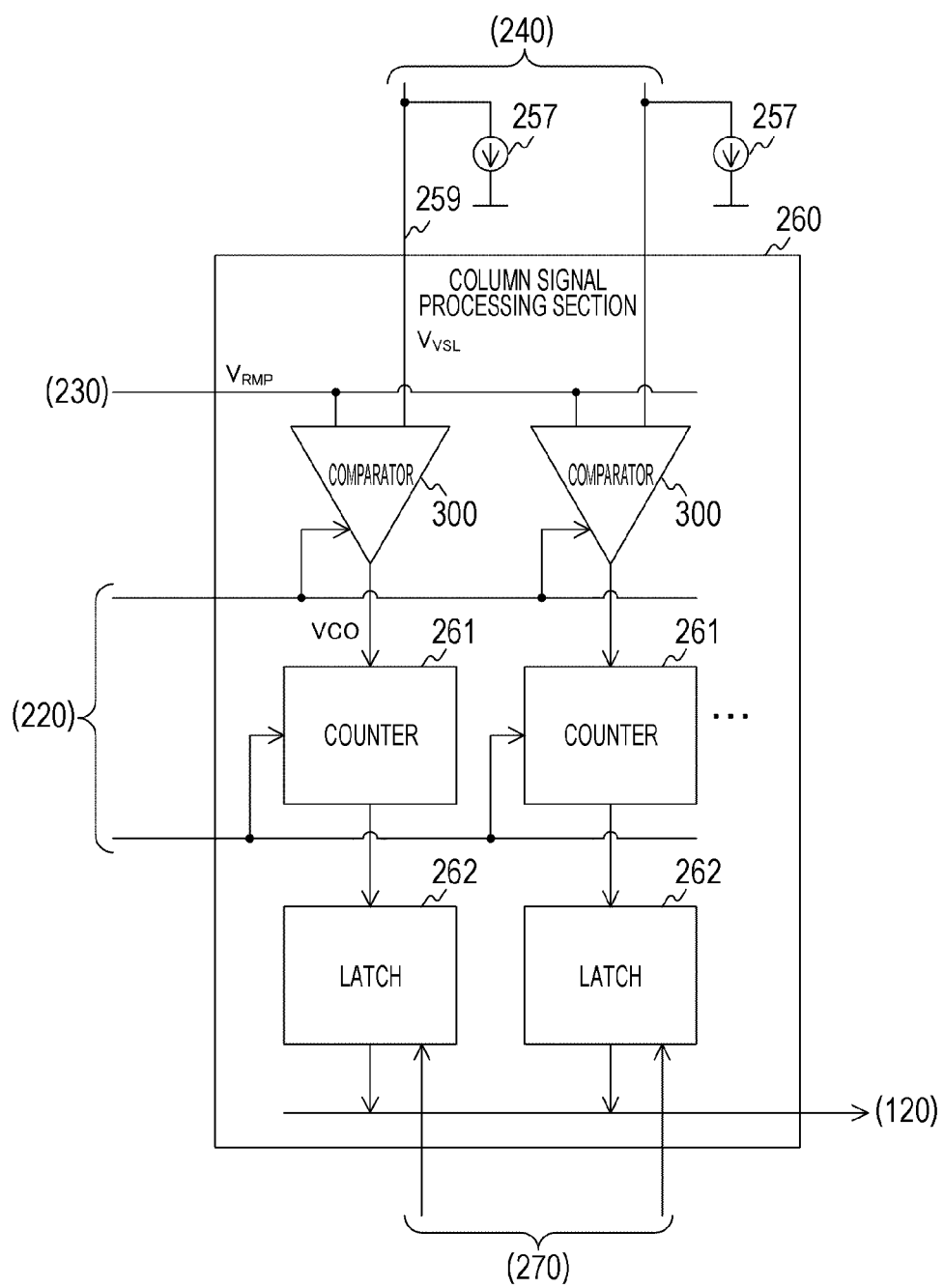
FIG. 23 is a block diagram depicting a configuration example of a column signal processing section in a fifth modified example of the first embodiment of the present technology.

FIG. 23 is a block diagram depicting a configuration example of a column signal processing section in the fifth modified example of the first embodiment of the present technology. As illustrated in the drawing, a load MOS current source 257 is connected to the vertical signal line 259 in each column.

Figure 24:
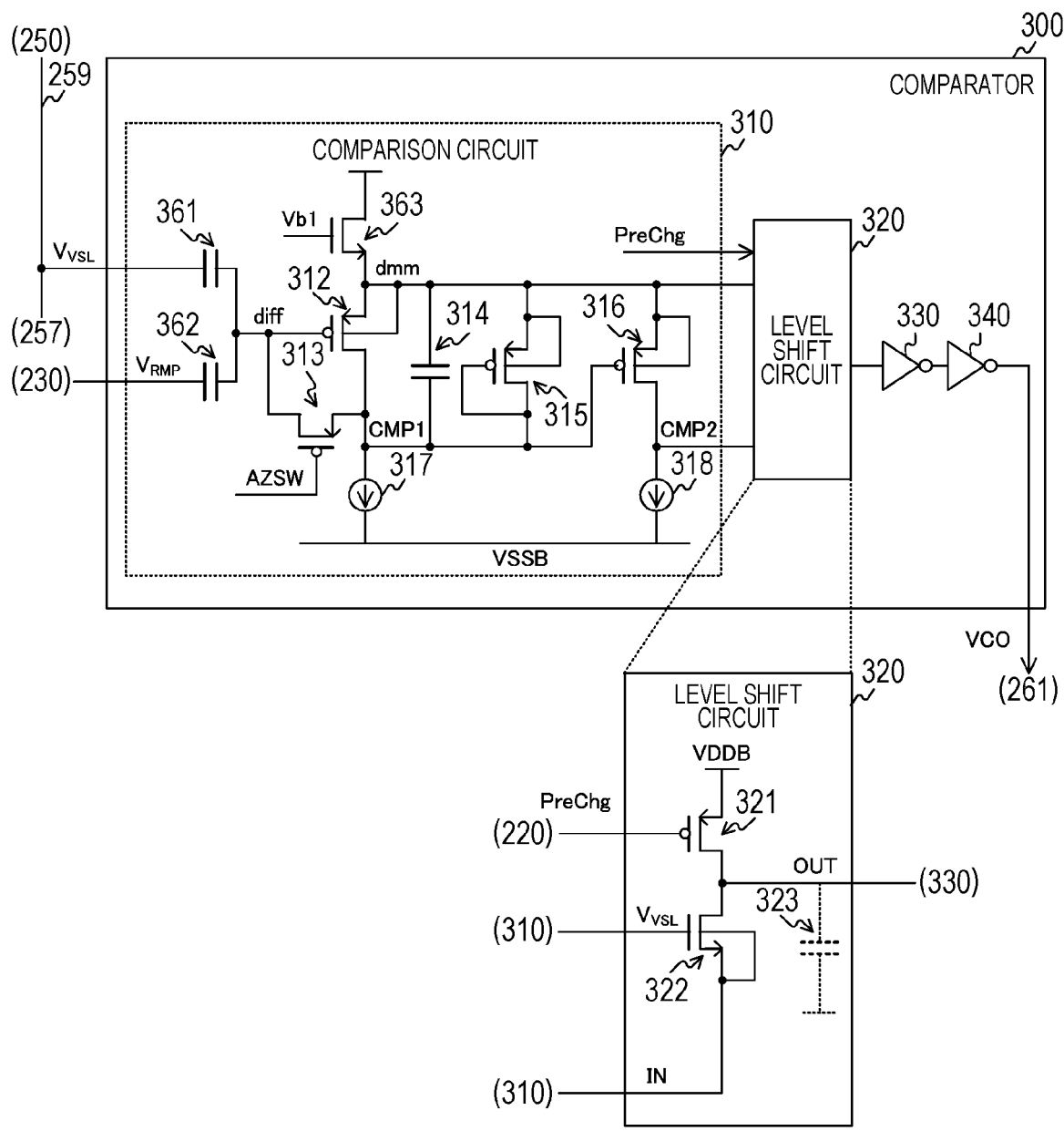
FIG. 24 is a circuit diagram depicting a configuration example of a comparator in the fifth modified example of the first embodiment of the present technology.

FIG. 24 is a circuit diagram depicting a configuration example of the comparator 300 in the fifth modified example of the first embodiment of the present technology. The comparator 300 of the fifth modified example of the first embodiment is different from that of the first embodiment in terms of further including capacitors 361 and 362 and an LDO transistor 363.

The capacitor 361 is inserted between the vertical signal line 259 and a gate of the input transistor 312. the capacitor 362 is inserted between the DAC 230 and the gate of the input transistor 312. A voltage between the input potential $V_{VSL}$ and the reference potential $V_{RMP}$ is divided by a voltage division ratio determined on the basis of the respective values of these capacitors. A voltage diff of a connection node of the capacitors 361 and 362 is input to the gate of the input transistor 312.

Furthermore, the LDO transistor 363 is inserted between a power supply potential and a source of the input transistor 312. The LDO transistor 363 has a gate to which a predetermined bias voltage Vb1 is applied. The LDO transistor 363 supplies a drop potential dmm, lower than the power supply potential, to the source of the input transistor 312. A configuration of circuits in the subsequent stages after the input transistor 312 is similar to that of the first embodiment.

Since the capacitors 361 and 362 that divide the voltage between the input potential $V_{VSL}$ and the reference potential $V_{RMP}$ are provided, the power supply potential of the comparator 300 can be further reduced to reduce power consumption.

Figure 25:
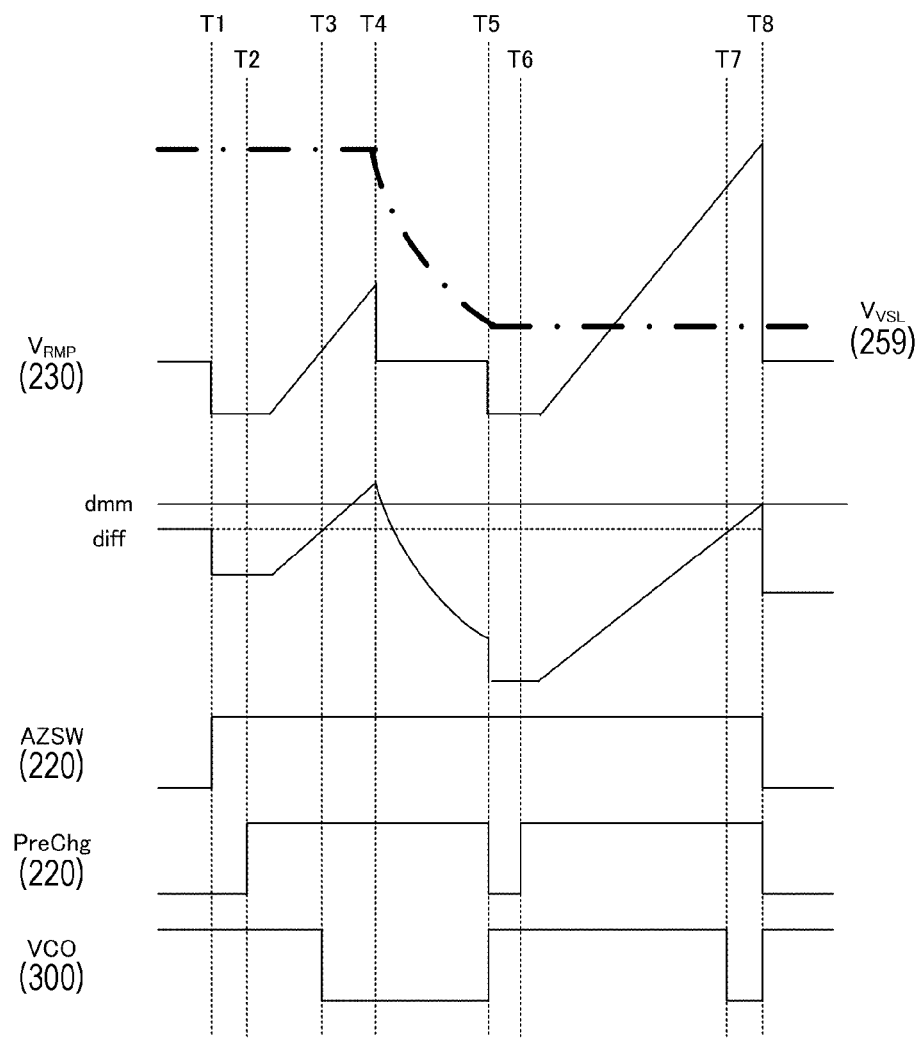
FIG. 25 is a timing chart depicting an example of the operation of a solid-state imaging element in the fifth modified example of the first embodiment of the present technology.

FIG. 25 is a timing chart depicting an example of the operation of the solid-state imaging element 200 in the fifth modified example of the first embodiment of the present technology. As illustrated in the drawing, the reference potential $V_{RMP}$ gradually increases in each of an AD conversion period from immediately after a timing T2 to a timing T4 and an AD conversion period from immediately after a timing T6 to a timing T8.

Furthermore, the output signal VCO is inverted at timings T3 and T7 when a difference between the divided voltage diff and the drop potential dmm becomes equal to or lower than an allowable value (the gate-source voltage Vgs).

Note that the second, third, or fourth modified example can be applied to the fifth modified example of the first embodiment.

In this manner, the power supply potential of the comparator 300 can be lowered since the capacitors 361 and 362 that divide the reference potential $V_{RMP}$ and the input potential $V_{VSL}$ are added according to the fifth modified example of the first embodiment of the present technology.

Sixth Modified Example

In the fifth modified example of the first embodiment described above, the level shift circuit 320 expands the voltage range from the current source operation potential Vds' to the input potential $V_{VSL}$ to the voltage range from the current source operation potential Vds' to the power supply voltage VDDB. However, when the current source operation potential Vds' is relatively high, there is a possibility that a malfunction and a leakage current of the inverter 330 occur. The solid-state imaging element 200 according to a sixth modified example of the first embodiment is different from that of the fifth modified example of the first embodiment in that a voltage range is further expanded.

Figure 26:
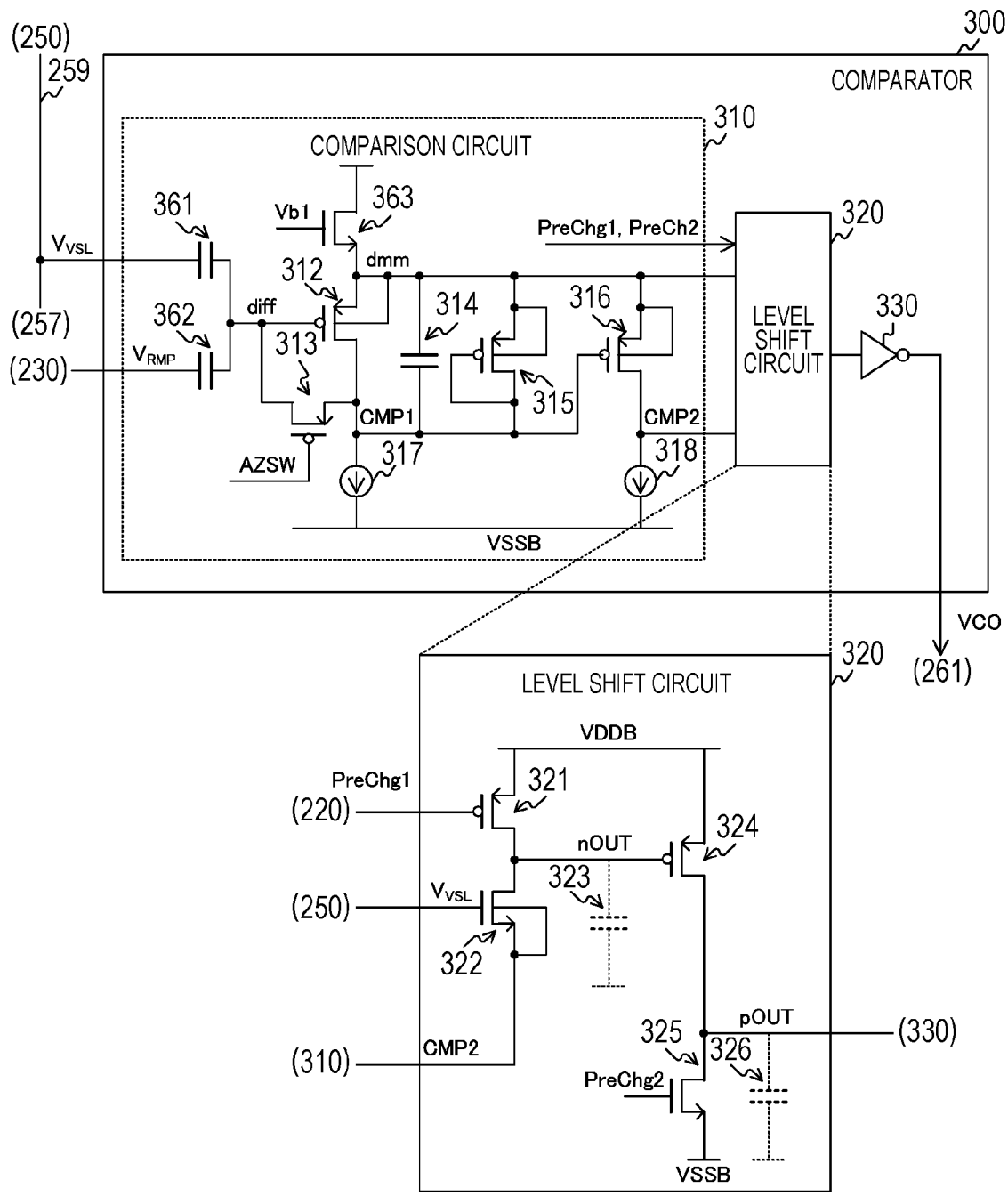
FIG. 26 is a circuit diagram depicting a configuration example of a comparator in a sixth modified example of the first embodiment of the present technology.

FIG. 26 is a circuit diagram depicting a configuration example of the comparator 300 in the sixth modified example of the first embodiment of the present technology. The comparator 300 according to the sixth modified example of the first embodiment is different from that of the fifth modified example of the first embodiment in that the pMOS transistor 324 and the precharge transistor 325 are further provided in the level shift circuit 320. The sixth modified example of the first embodiment corresponds to what is obtained by applying the first modified example to the fifth modified example.

Figure 27:
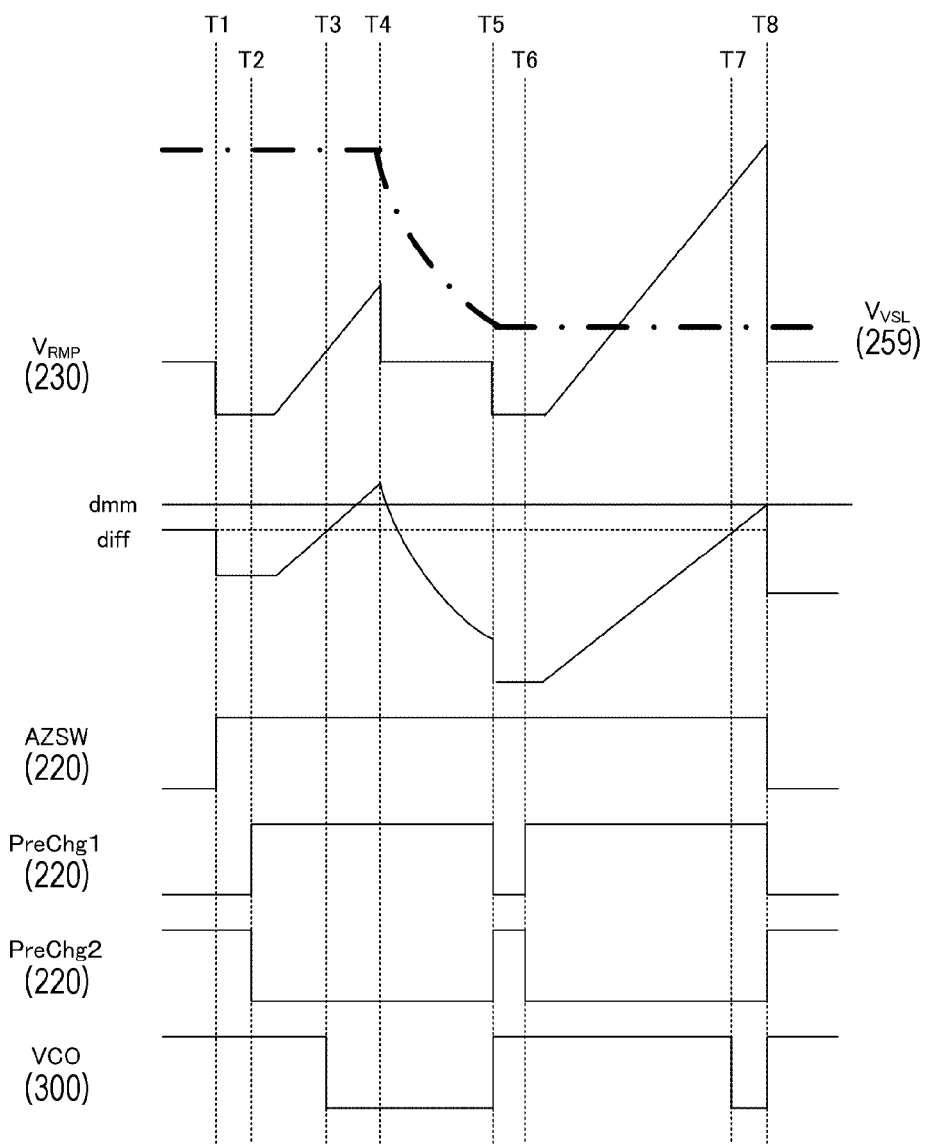
FIG. 27 is a timing chart depicting an example of the operation of a solid-state imaging element in the sixth modified example of the first embodiment of the present technology.

FIG. 27 is a timing chart depicting an example of the operation of the solid-state imaging element in the sixth modified example of the first embodiment of the present technology. Control of precharge in the sixth modified example of the first embodiment is similar to that in the first modified example of the first embodiment.

Note that the second, third, or fourth modified example can be applied to the sixth modified example of the first embodiment.

In this manner, in the sixth modified example of the first embodiment of the present technology, the pMOS transistor 324 further expands a voltage range from the current source operation potential Vds' to the power supply potential VDDB to a voltage range from the standard potential VSSB to the power supply voltage VDDB. Therefore, it is possible to more reliably prevent the malfunction and the leakage current of the inverter 330.

2. Second Embodiment

In the first modified example of the first embodiment described above, the comparators 300 of the respective columns are connected in common to the power supply line that supplies the power supply potential VDDB. In this configuration, however, there is a possibility that a variation in the power supply potential generated in a certain column propagates to another column via the power supply line to cause interference between the columns (streaking). A solid-state imaging element 200 of the second embodiment is different from that of the first modified example of the first embodiment in that a filter circuit is added to suppress the streaking.

Figure 28:
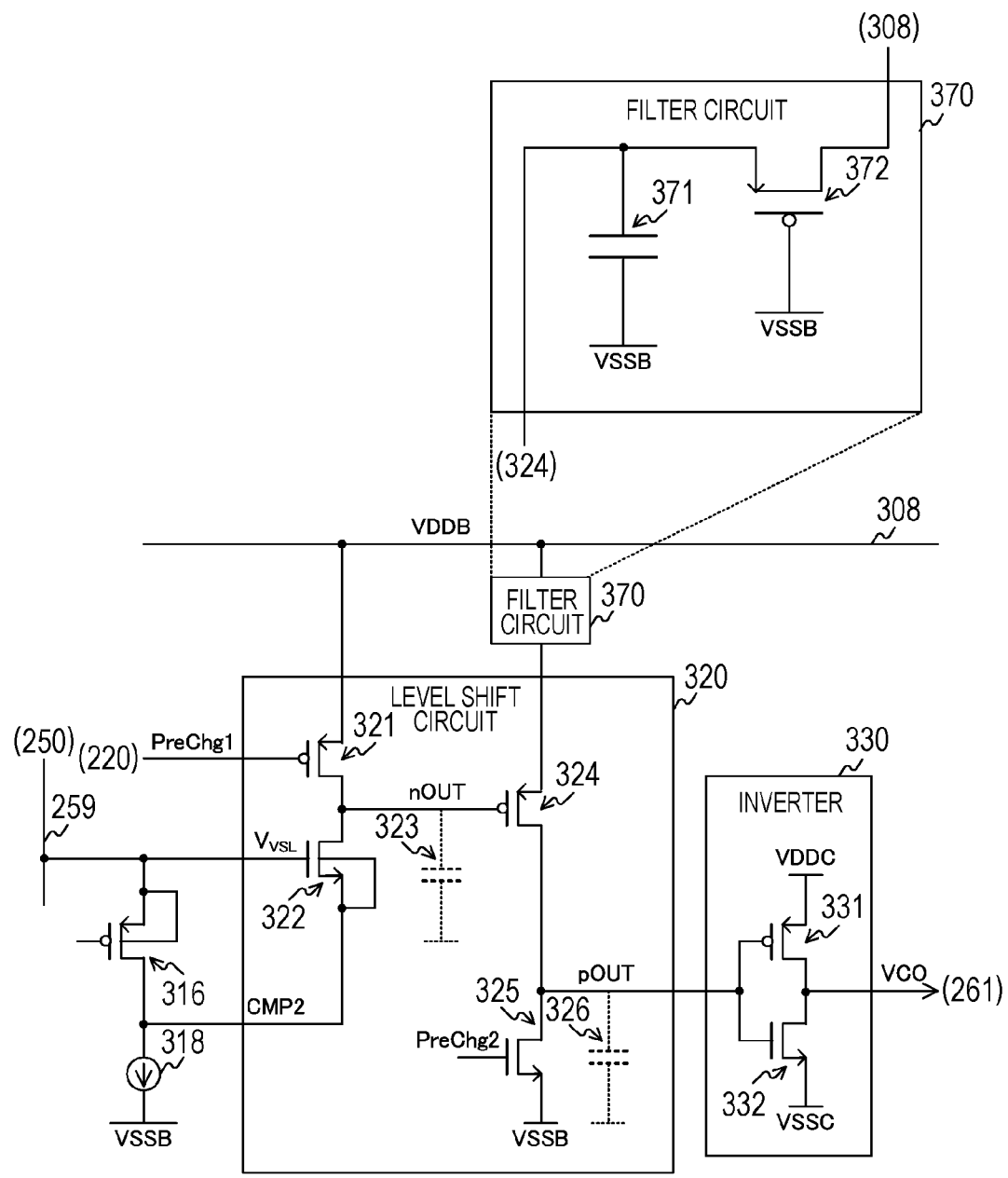
FIG. 28 is a circuit diagram depicting a configuration example of a comparator in a second embodiment of the present technology.

FIG. 28 is a circuit diagram depicting a configuration example of a comparator 300 in the second embodiment of the present technology. The comparator 300 of the second embodiment is different from that of the first modified example of the first embodiment in terms of further including a filter circuit 370.

The filter circuit 370 is inserted between a common power supply line 308 and a level shift circuit 320. The common power supply line 308 is a power supply line to which the respective level shift circuits 320 of columns are connected in common, and is supplied with a power supply potential VDDB. Note that the power supply potential of the common power supply line 308 is an example of a first power supply potential described in the claims.

The filter circuit 370 suppresses a variation in the power supply potential VDDB. The filter circuit 370 includes a capacitor 371 and a pMOS transistor 372. The pMOS transistor 372 has a drain connected to the common power supply line 308 and a source connected to a pMOS transistor 324. Furthermore, the pMOS transistor 372 has a gate to which a predetermined potential (standard potential VSSB or the like) for constantly turning on the pMOS transistor 372 is applied. The capacitor 371 is inserted between a connection node of the pMOS transistors 372 and 324 and the standard potential VSSB.

With the above-described circuit configuration, the filter circuit 370 functions as an RC filter including an on-resistance of the pMOS transistor 372 and the capacitor 371.

Figure 29:
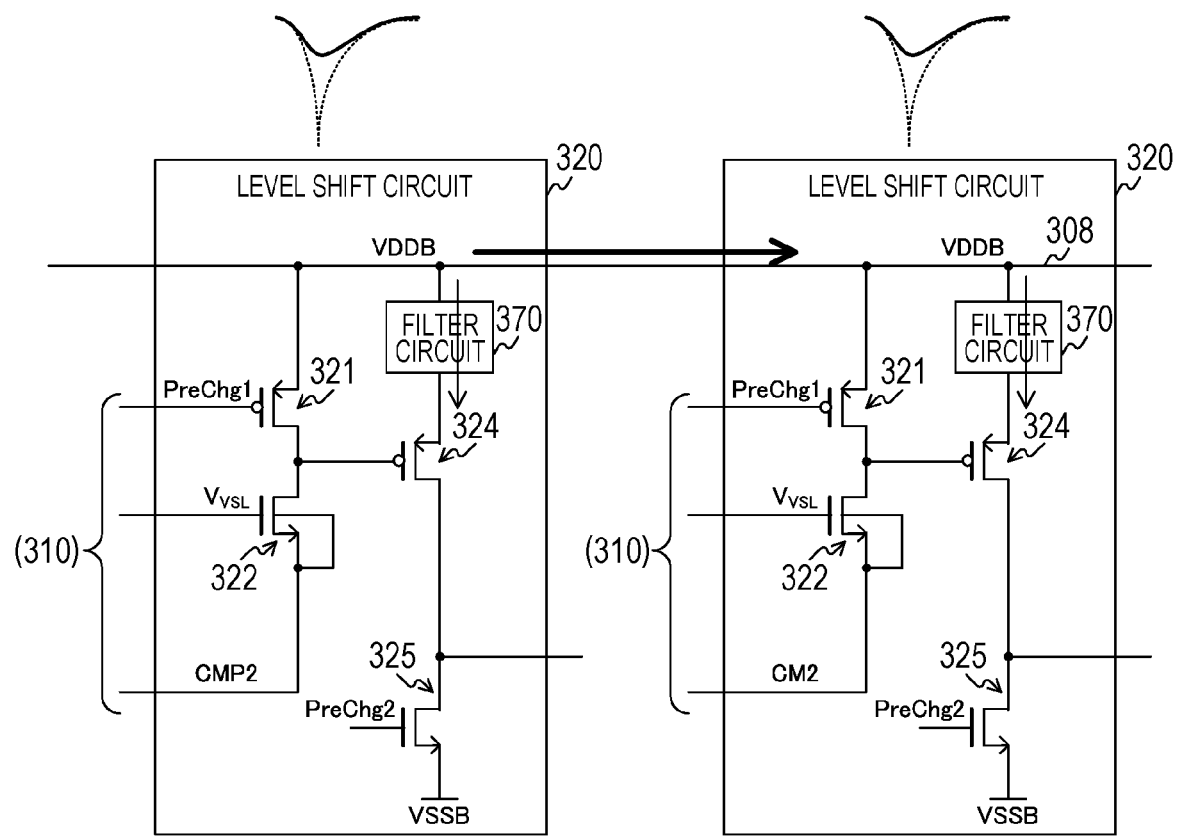
FIG. 29 is a diagram for describing a streaking suppression effect in the second embodiment of the present technology.

FIG. 29 is a diagram for describing a streaking suppression effect in the second embodiment of the present technology. It is assumed a drop in power supply during the operation of a column affects another column. In this case, the affecting column is referred to as an "aggressor", and the affected column is referred to as a "victim". The left side of the drawing is the aggressor, and the right side is the victim.

In the aggressor, when an output signal VCO is inverted, the pMOS transistor 324 of the third stage transitions to an on state, and a current from the power supply potential VDDB flows through the transistor. Therefore, the power supply potential VDDB drops. This drop in power supply propagates to the victim via the common power supply line 308, and a current flows to the level shift circuit 320 in the victim. A thick solid line described above the level shift circuit 320 in the drawing indicates a waveform of a potential in a case where the filter circuit 370 is present. Furthermore, a dotted line indicates a waveform of a potential in a case where the filter circuit 370 is absent.

In the case where the filter circuit 370 is absent, the waveform of the potential becomes steep. Therefore, there is a possibility that the streaking in which streaky noise appears in image data occurs. When the filter circuit 370 is provided, however, the waveform of the potential becomes gentle, and the potential variation is suppressed. Therefore, it is possible to prevent the occurrence of the streaking.

In this manner, it is possible to prevent the occurrence of the streaking caused by the potential variation since the filter circuit 370 suppresses the variation in the power supply potential according to the second embodiment of the present technology.

First Modified Example

In the second embodiment described above, the pMOS transistor 372 is constantly turned on, but there is a case where the potential variation is not sufficiently suppressed in this configuration. A first modified example of the second embodiment is different from the second embodiment in that the pMOS transistor 372 is set to an on state only in a certain pulse period.

Figure 30:
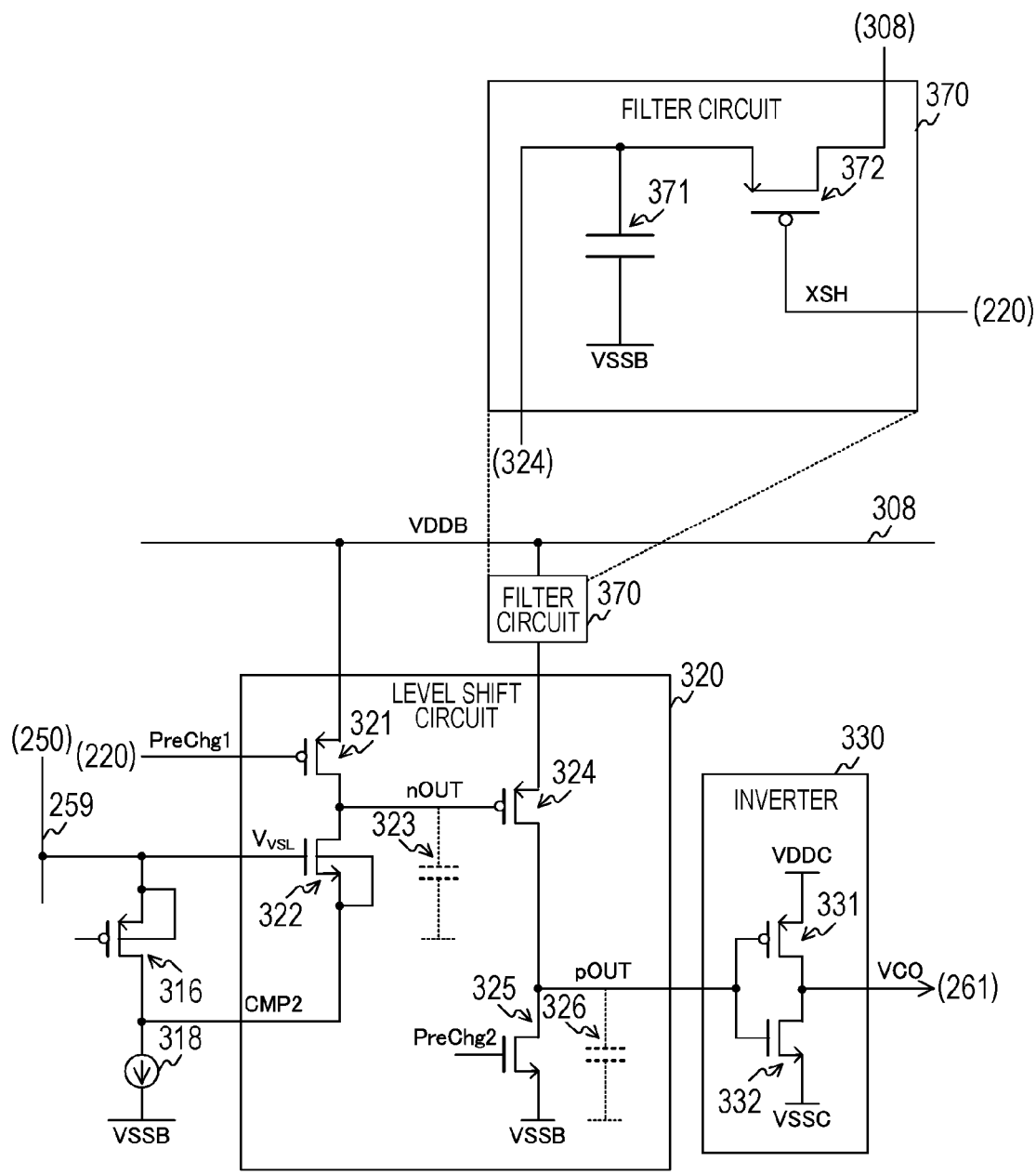
FIG. 30 is a circuit diagram depicting a configuration example of a comparator in a first modified example of the second embodiment of the present technology.

FIG. 30 is a circuit diagram depicting a configuration example of the comparator 300 in the first modified example of the second embodiment of the present technology. The comparator 300 according to the first modified example of the second embodiment is different from that of the second embodiment in that a control signal XSH from a timing control section 220 is input to a gate of the pMOS transistor 372.

Figure 31:
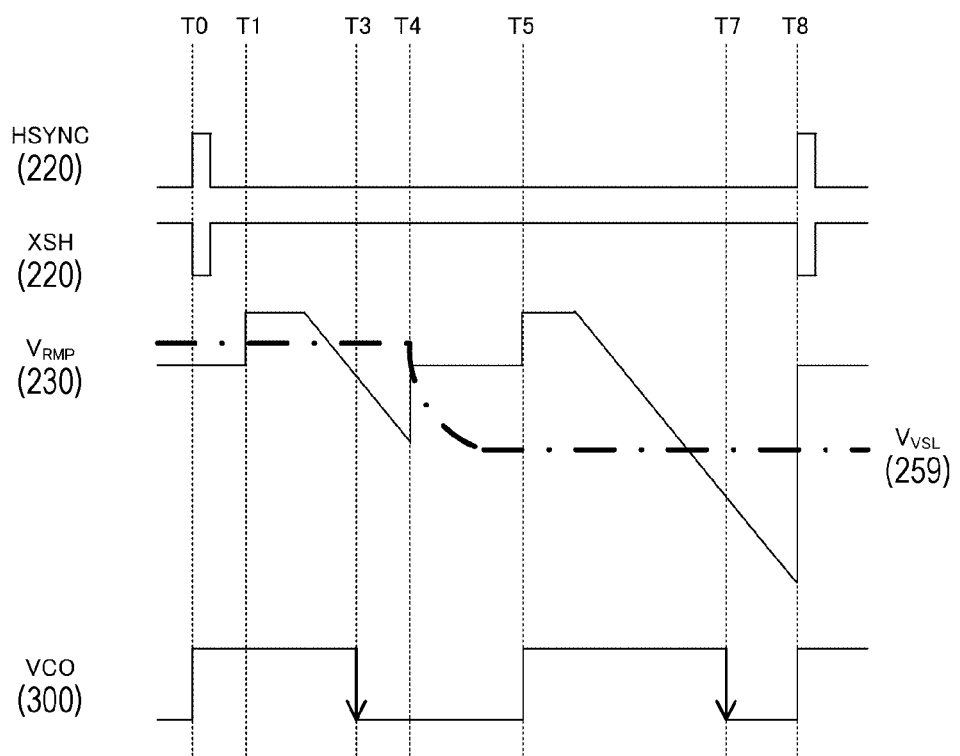
FIG. 31 is a timing chart depicting an example of the operation of a solid-state imaging element in the first modified example of the second embodiment of the present technology.

FIG. 31 is a timing chart depicting an example of the operation of the solid-state imaging element 200 in the first modified example of the second embodiment of the present technology. The timing control section 220 generates a horizontal synchronization signal HSYNC and supplies the horizontal synchronization signal HSYNC to a vertical scanning circuit 210. The horizontal synchronization signal HSYNC is a signal indicating a timing when the vertical scanning circuit 210 drives a row. As the horizontal synchronization signal HSYNC, a periodic signal having a higher frequency than a vertical synchronization signal is generated.

The horizontal synchronization signal HSYNC rises at timings T0 and T8. The timing control section 220 sets the control signal XSH to a low level over a predetermined pulse period at each of these timings T0 and T8. Therefore, the pMOS transistor 372 is set to the on state, and the power supply potential VDDB is sampled in the capacitor 371. In a period other than these pulse periods, the control signal XSH is controlled to a high level.

Furthermore, the output signal VCO is inverted at timings T3 and T7 after the sampling, and at this time, a current flows in the third stage in the aggressor. However, the pMOS transistor 372 is in an off state at this time, the common power supply line 308 and the third stage are disconnected. Therefore, a drop in power supply does not occur, and a potential variation can be more reliably suppressed.

Figure 32:
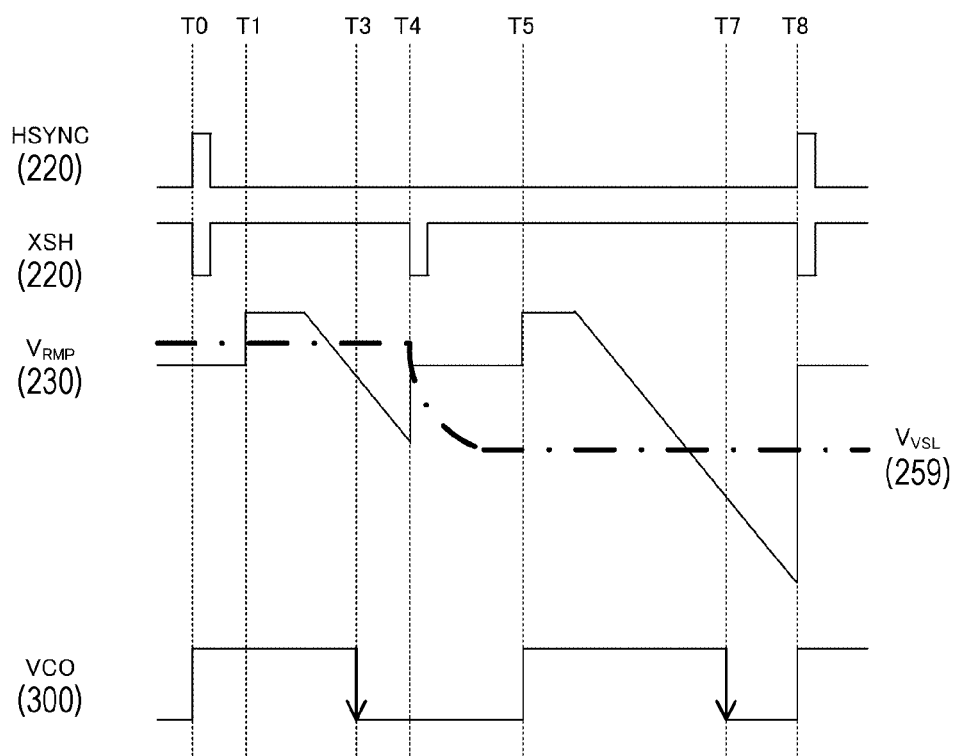
FIG. 32 is a timing chart depicting another example of the operation of the solid-state imaging element in the first modified example of the second embodiment of the present technology.

FIG. 32 is a timing chart depicting another example of the operation of the solid-state imaging element in the first modified example of the second embodiment of the present technology. As illustrated in the drawing, the timing control section 220 can set the control signal XSH to the low level over a pulse period at each of a timing T0 immediately before an AD conversion period of a reset level and a timing T4 immediately before AD conversion of a signal level. In a case where a capacitance value of the capacitor 371 is relatively small, the control in the drawing is desirable.

Figure 33:
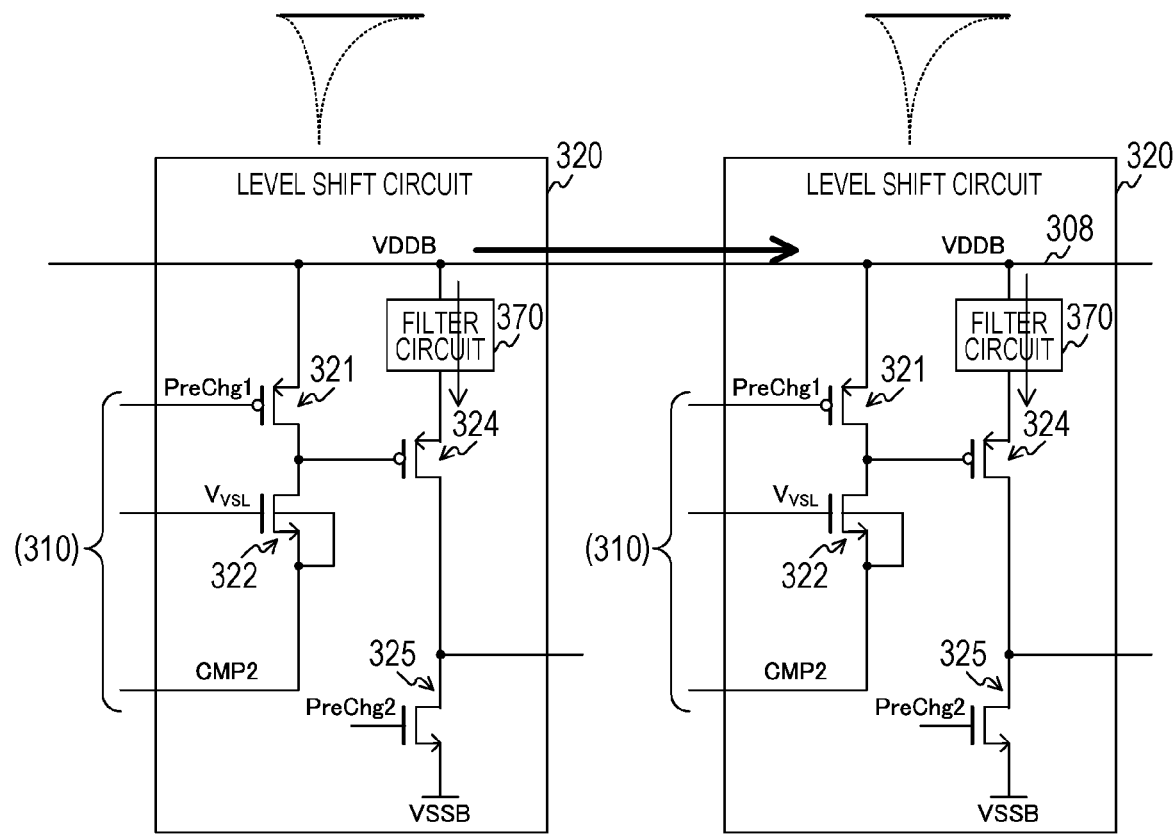
FIG. 33 is a diagram for describing a streaking suppression effect in the first modified example of the second embodiment of the present technology.

FIG. 33 is a diagram for describing a streaking suppression effect in the first modified example of the second embodiment of the present technology. The left side of the drawing is the aggressor, and the right side is the victim. A thick solid line described above the level shift circuit 320 in the drawing indicates a waveform of a potential in a case where the filter circuit 370 is present. Furthermore, a dotted line indicates a waveform of a potential in a case where the filter circuit 370 is absent.

As described above, the common power supply line 308 and the third stage are disconnected since the pMOS transistor 372 in the filter circuit 370 is in the off state at the timing when the output signal VCO is inverted. Therefore, the drop in power supply becomes substantially zero as illustrated in the drawing.

In this manner, the timing control section 220 sets the pMOS transistor 372 to the on state only immediately before the AD conversion period in the first modified example of the second embodiment of the present technology. Therefore, the pMOS transistor 324 of the third stage is disconnected from the common power supply line 308 when the output signal VCO is inverted. Therefore, it is possible to more reliably suppress the potential variation.

Second Modified Example

In the second embodiment described above, the filter circuit 370 is inserted between the level shift circuit 320 and the common power supply line 308, but the filter circuit 370 can also be arranged in a comparator in which the level shift circuit 320 is not arranged. The solid-state imaging element 200 according to a second modified example of the second embodiment is different from that of the second embodiment in that the filter circuit 370 is arranged in a comparator including a differential amplifier circuit whose input terminal is connected to a connection node of a pair of capacitors.

Figure 34:
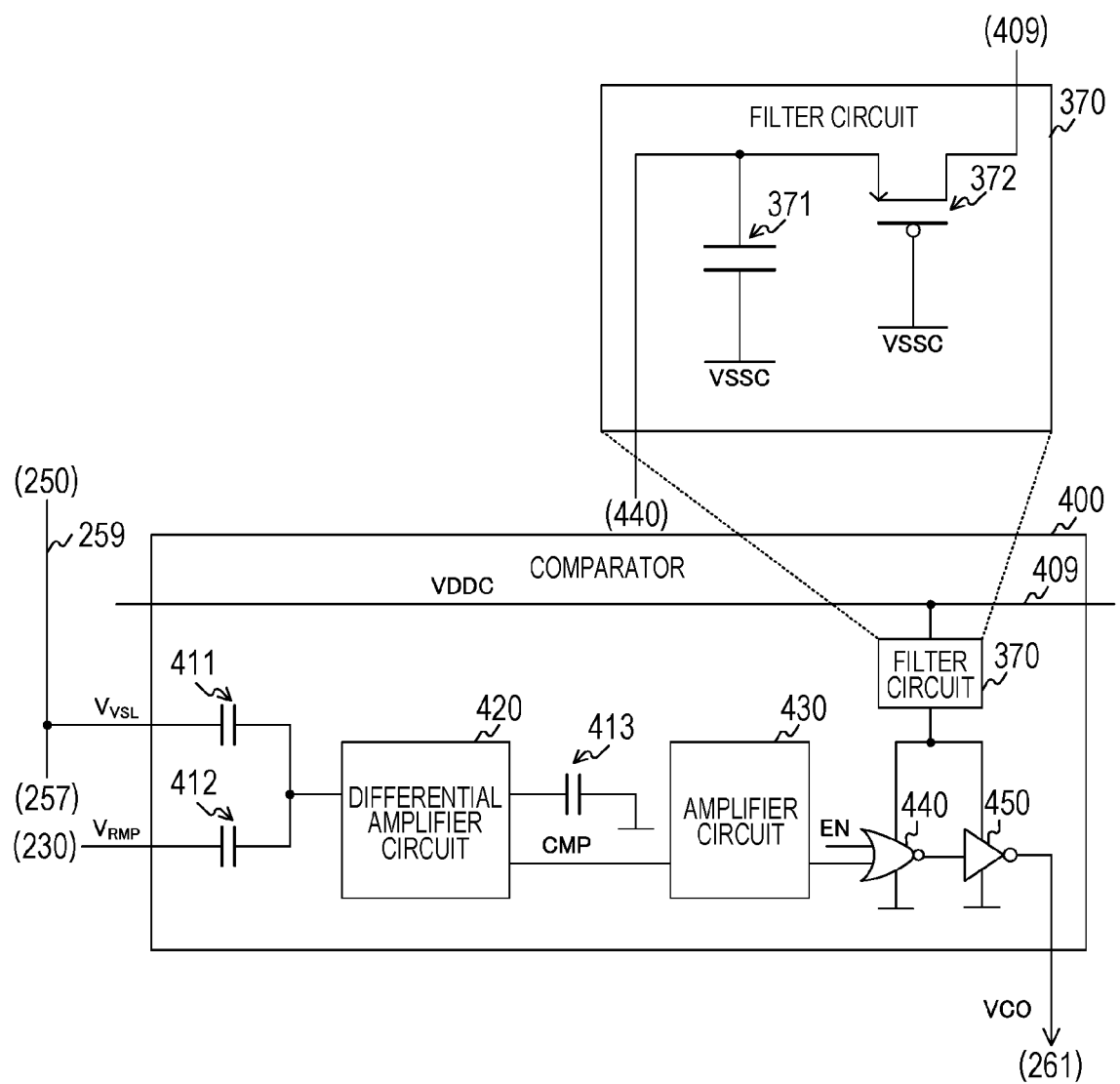
FIG. 34 is a block diagram depicting a configuration example of a comparator in a second modified example of the second embodiment of the present technology.

FIG. 34 is a block diagram depicting a configuration example of a comparator 400 in the second modified example of the second embodiment of the present technology. The comparator 400 includes capacitors 411 to 413, a differential amplifier circuit 420, an amplifier circuit 430, the filter circuit 370, a negative OR (NOR) gate 440, and an inverter 450.

One of two input terminals of the differential amplifier circuit 420 is connected to a connection node of the capacitors 411 and 412, and the other is connected to the capacitor 413. The capacitor 411 is inserted between a vertical signal line 259 and the input terminal of the differential amplifier circuit 420. The capacitor 412 is inserted between a DAC 230 and the input terminal of the differential amplifier circuit 420. The capacitor 413 is inserted between a predetermined standard potential and the input terminal of the differential amplifier circuit 420.

The differential amplifier circuit 420 amplifies a difference between potentials of the two input terminals and outputs the difference to the amplifier circuit 430 as a comparison result CMP.

The amplifier circuit 430 supplies an amplified signal, obtained by amplifying the comparison result CMP, to the NOR gate 440.

The NOR gate 440 outputs a negative OR of the amplified signal from the amplifier circuit 430 and an enable signal EN to the inverter 450. The enable signal EN is supplied from the timing control section 220, for example.

The inverter 450 inverts the output of the NOR gate 440 and outputs the inverted output as the output signal VCO to a counter 261.

Furthermore, power-supply-side terminals of the NOR gate 440 and the inverter 450 are connected. The filter circuit 370 is inserted between such a connection node and a common power supply line 409. The common power supply line 409 is a power supply line to which logic gates (the NOR gate 440 and the inverter 450) of columns are connected in common, and a power supply potential VDDC is applied thereto. Furthermore, a circuit configuration of the filter circuit 370 is similar to that of the second embodiment.

Figure 35:
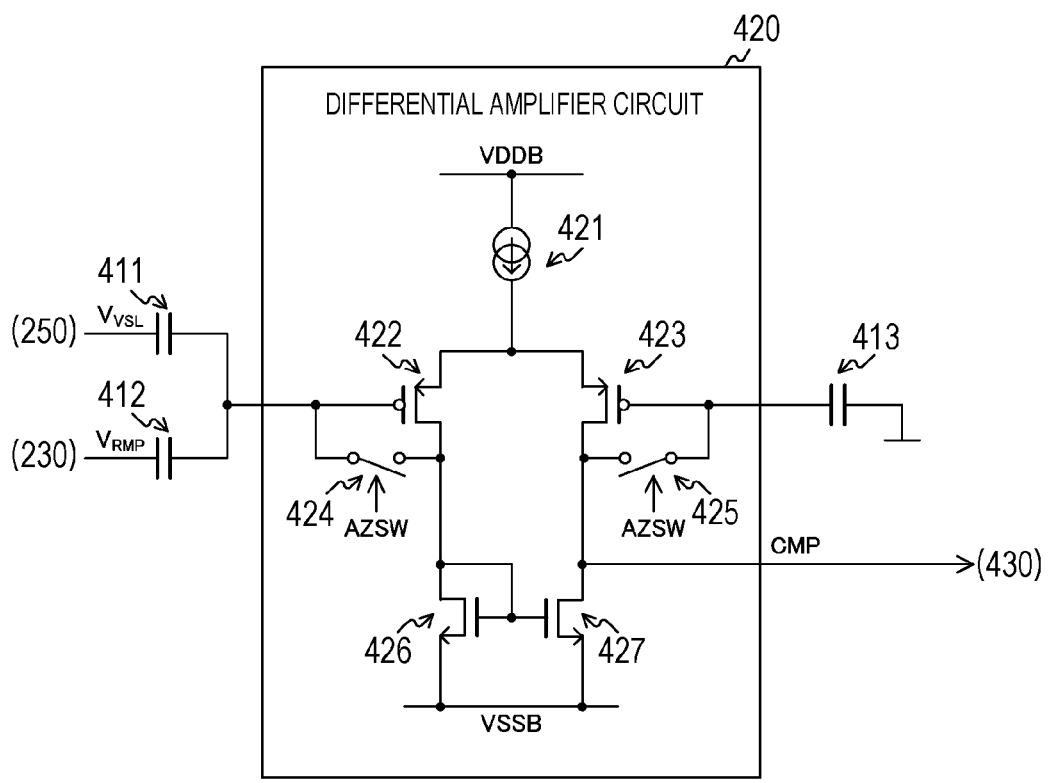
FIG. 35 is a circuit diagram depicting a configuration example of a differential amplifier circuit in the second modified example of the second embodiment of the present technology.

FIG. 35 is a circuit diagram depicting a configuration example of the differential amplifier circuit 420 in the second modified example of the second embodiment of the present technology. The differential amplifier circuit 420 includes a current source 421, pMOS transistors 422 and 423, auto-zero switches 424 and 425, and nMOS transistors 426 and 427.

The current source 421 supplies a constant current, and is inserted between a connection node of the pMOS transistors 422 and 423 and the power supply potential VDDB.

Sources of the pMOS transistors 422 and 423 are connected in common to the current source 421. The pMOS transistor 422 has a gate connected to the connection node of the capacitors 411 and 412 and a drain connected to a drain of the nMOS transistor 426. The pMOS transistor 423 has a gate connected to one end of the capacitor 413 and a drain connected to a drain of the nMOS transistor 427.

The auto-zero switch 424 short-circuits the gate and the drain of the pMOS transistor 422 in accordance with an auto-zero signal AZSW from the timing control section 220. The auto-zero switch 425 short-circuits the gate and the drain of the pMOS transistor 423 in accordance with the control signal AZSW.

Sources of the nMOS transistors 426 and 427 are connected to the standard potential VSSB. Furthermore, a gate and the drain of the nMOS transistor 426 are short-circuited. The respective gates of the nMOS transistors 426 and 427 are connected.

Furthermore, the comparison result CMP is output from a connection node of the pMOS transistor 423 and the nMOS transistor 427 to the NOR gate 440.

Figure 36:
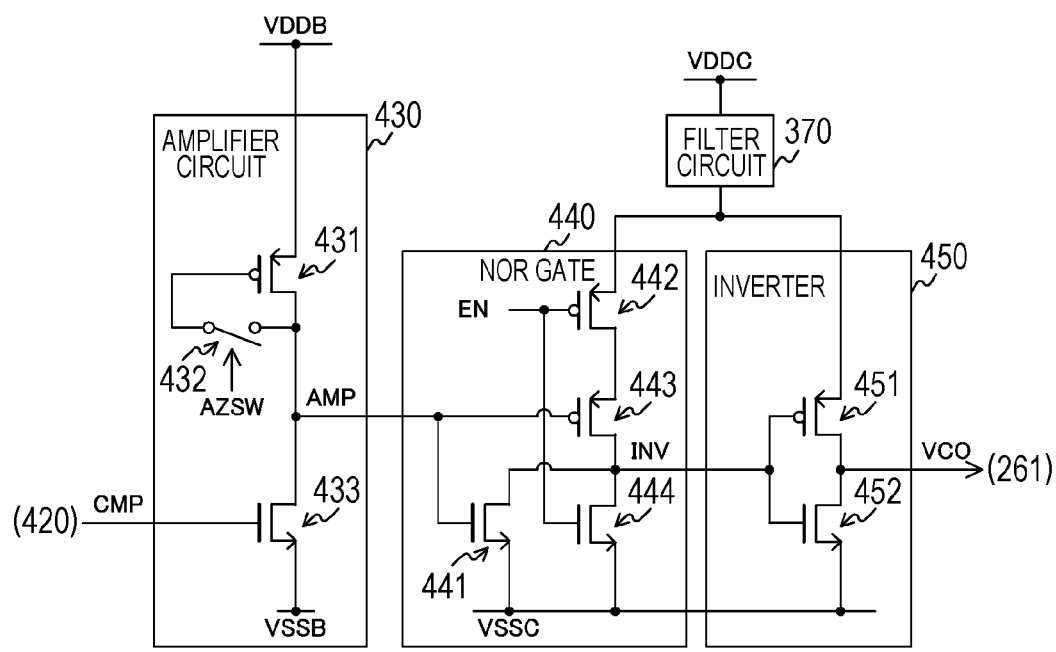
FIG. 36 is a circuit diagram depicting a configuration example of an amplifier circuit and logic gates in the second modified example of the second embodiment of the present technology.

FIG. 36 is a circuit diagram depicting a configuration example of the amplifier circuit 430 and the logic gates (the NOR gate 440 and the inverter 450) in the second modified example of the second embodiment of the present technology.

The amplifier circuit 430 includes a pMOS transistor 431, an auto-zero switch 432, and an nMOS transistor 433. The NOR gate 440 includes nMOS transistors 441 and 444 and pMOS transistors 442 and 443. The inverter 450 includes a pMOS transistor 451 and an nMOS transistor 452.

The pMOS transistor 431 and the nMOS transistor 433 are connected in series between the power supply potential VDDB and the standard potential VSSB. Furthermore, the comparison result CMP from the differential amplifier circuit 420 is input to a gate of the nMOS transistor 433. An amplified signal AMP, obtained by amplifying the comparison result CMP, is output from a connection node of the pMOS transistor 431 and the nMOS transistor 433.

The auto-zero switch 432 short-circuits a gate and a drain of the pMOS transistor 431 in accordance with the control signal AZSW from the timing control section 220.

Furthermore, in the NOR gate 440, the pMOS transistors 442 and 443 are connected in series to the filter circuit 370. The nMOS transistors 441 and 444 are connected in parallel between the pMOS transistor 443 and the standard potential VSSC.

The enable signal EN is input to gates of the pMOS transistor 442 and the nMOS transistor 444. The amplified signal AMP is input to gates of the pMOS transistor 443 and the nMOS transistor 441. When enabled, an inverted signal INV, obtained by inverting the amplified signal AMP, is output from a connection node of the pMOS transistor 443 and the nMOS transistor 444.

In the inverter 450, the pMOS transistor 451 and the nMOS transistor 452 are connected in series to the filter circuit 370. The inverted signal INV is input to the gates of these transistors. A signal, obtained by inverting the inverted signal INV, is output from a connection node of the pMOS transistor 451 and the nMOS transistor 452 to the counter 261 as the output signal VCO.

Figure 37A:
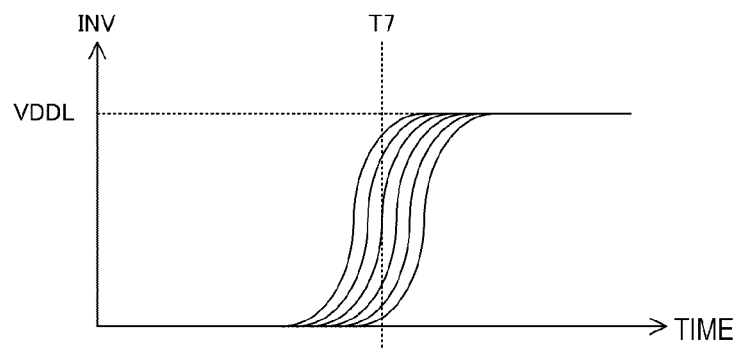
FIGS. 37A, 37B, 37C, and 37D are diagrams depicting an example of waveforms of a voltage and a current in a comparative example.
Figure 37B:
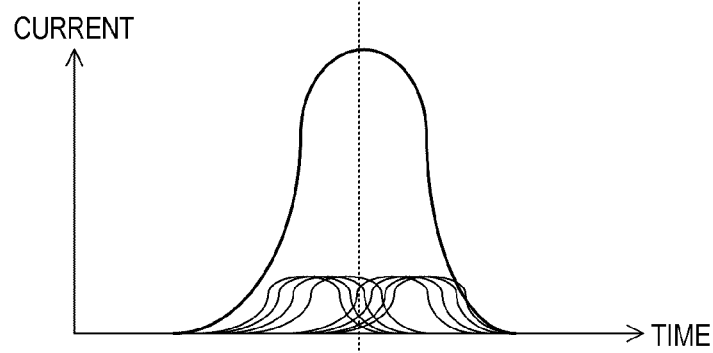
Figure 37C:
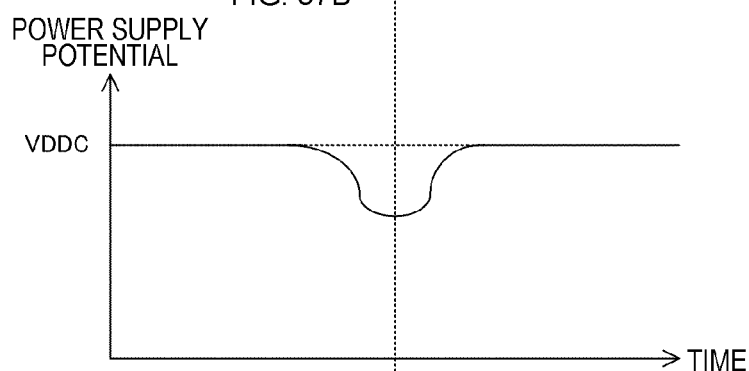
Figure 37D:
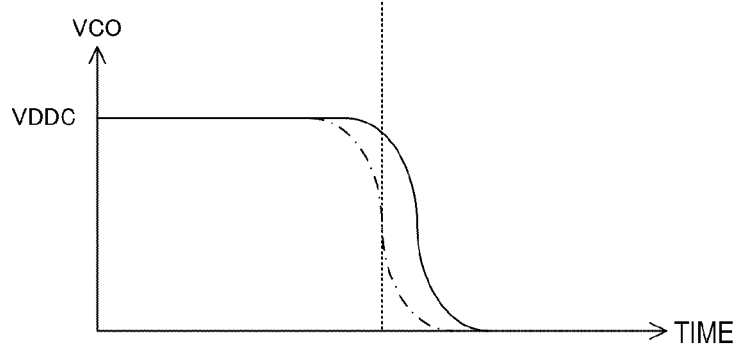

FIGS. 37A, 37B, 37C, and 37D are diagrams depicting an example of waveforms of a voltage and a current in a comparative example. This comparative example assumes the absence of the filter circuit 370. In the drawing, FIG. 37A is a graph depicting an example of a variation in the inverted signal INV. In FIG. 37A of the drawing, the vertical axis represents a level of the inverted signal INV of each column, and the horizontal axis represents time. In the drawing, FIG. 37B is a graph depicting an example of a variation in the current of each column. In FIG. 37B of the drawing, the vertical axis represents a level of the current, and the horizontal axis represents time. In the drawing, FIG. 37C is a graph depicting a variation in a power supply potential. In FIG. 37C of the drawing, the vertical axis represents a level of the power supply potential, and the horizontal axis represents time. In the drawing, FIG. 3D is a graph depicting an example of a variation in the output signal VCO of a victim. In FIG. 37D of the drawing, the vertical axis represents a level of the output signal VCO, and the horizontal axis represents time.

It is assumed that all the columns output pixel signals at levels close to a black level. In this case, the respective inverted signals INV of the columns are inverted in the vicinity of, for example, a timing T7 as exemplified in FIG. 37A of the drawing. A column corresponding to the inverted signal INV inverted at the timing T7 is assumed as the victim.

In this case, as exemplified in FIG. 37B of the drawing, the currents flowing from the respective columns to a standard potential VDDL merge, and the total current becomes larger than the current at each column. A thick solid line in FIG. 37B of the drawing indicates the total current. As illustrated in FIG. 37C of the drawing, a drop in the power supply potential increases due to the increased total current. Then, in the comparative example in which the filter circuit 370 is absent, an inversion timing of the output signal VCO of the victim is delayed from the timing T7 of the input due to the increased drop in power supply as illustrated in FIG. 37D of the drawing. Streaking occurs due to this delay.

On the other hand, in a case where the filter circuit 370 is provided, the drop in power supply is mitigated, a delay time of the output signal VCO is shortened. Therefore, the streaking can be suppressed.

Figure 38A:
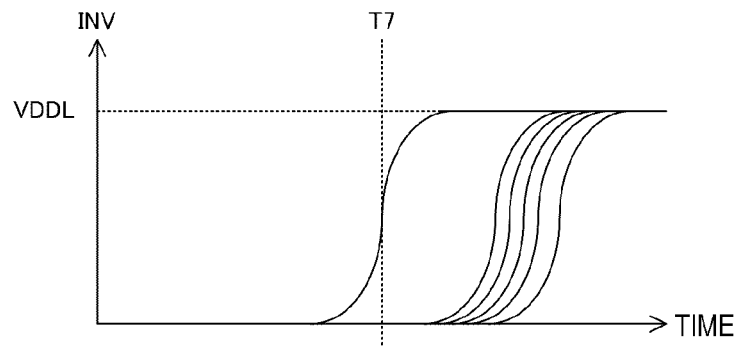
FIGS. 38A, 38B, 38C, and 38D are diagrams depicting another example of the waveforms of the voltage and the current in the comparative example.
Figure 38B:
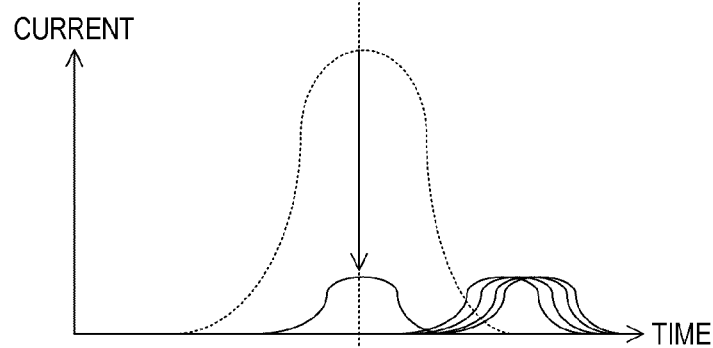
Figure 38C:
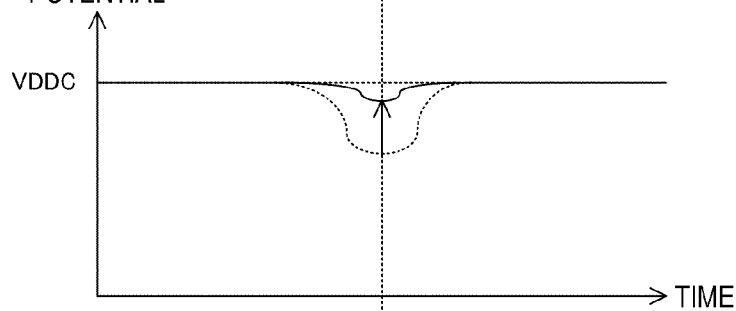
Figure 38D:
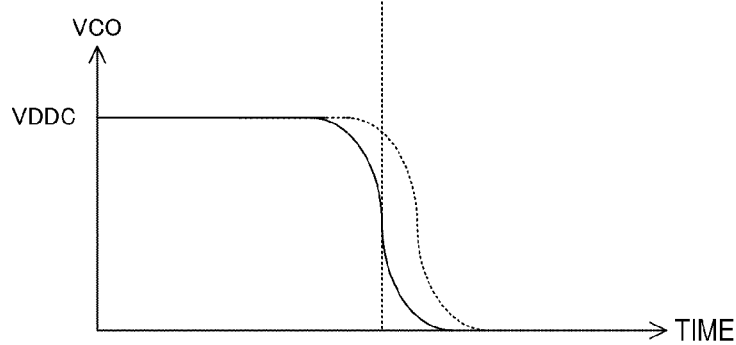

FIGS. 38A, 38B, 38C, and 38D are diagrams depicting another example of the waveforms of the voltage and the current in the comparative example. It is assumed that most columns output pixel signals at levels close to a white level, and a certain column outputs a pixel signal at the black level. In this case, as exemplified in FIG. 38A of the drawing, the inverted signal INV of the column at the black level transitions to a high level at a timing T7, and the inverted signal INV of each column at the white level transitions to the high level after the timing T7. Then, a variation in the current at the timing T7 is greatly reduced as illustrated in FIG. 38B of the drawing. Therefore, a drop in power supply at the timing T7 is reduced as illustrated in FIG. 380 of the drawing. Since the drop in power supply is small, a delay time of the output signal VCO becomes short in this column as illustrated in FIG. 38D of the drawing.

In this manner, the filter circuit 370 is inserted between each of the logic gates and the power supply potential VDDC in the second modified example of the second embodiment of the present technology, and thus, the delay time of the output with respect to the input of each of the logic gates can be shortened. Therefore, the streaking can be suppressed.

Third Modified Example

In the second modified example of the second embodiment described above, the pMOS transistor 372 is constantly turned on, but there is a case where the potential variation is not sufficiently suppressed in this configuration. A third modified example of the second embodiment is different from the second modified example of the second embodiment in that the pMOS transistor 372 is set to an on state only in a certain pulse period.

Figure 39:
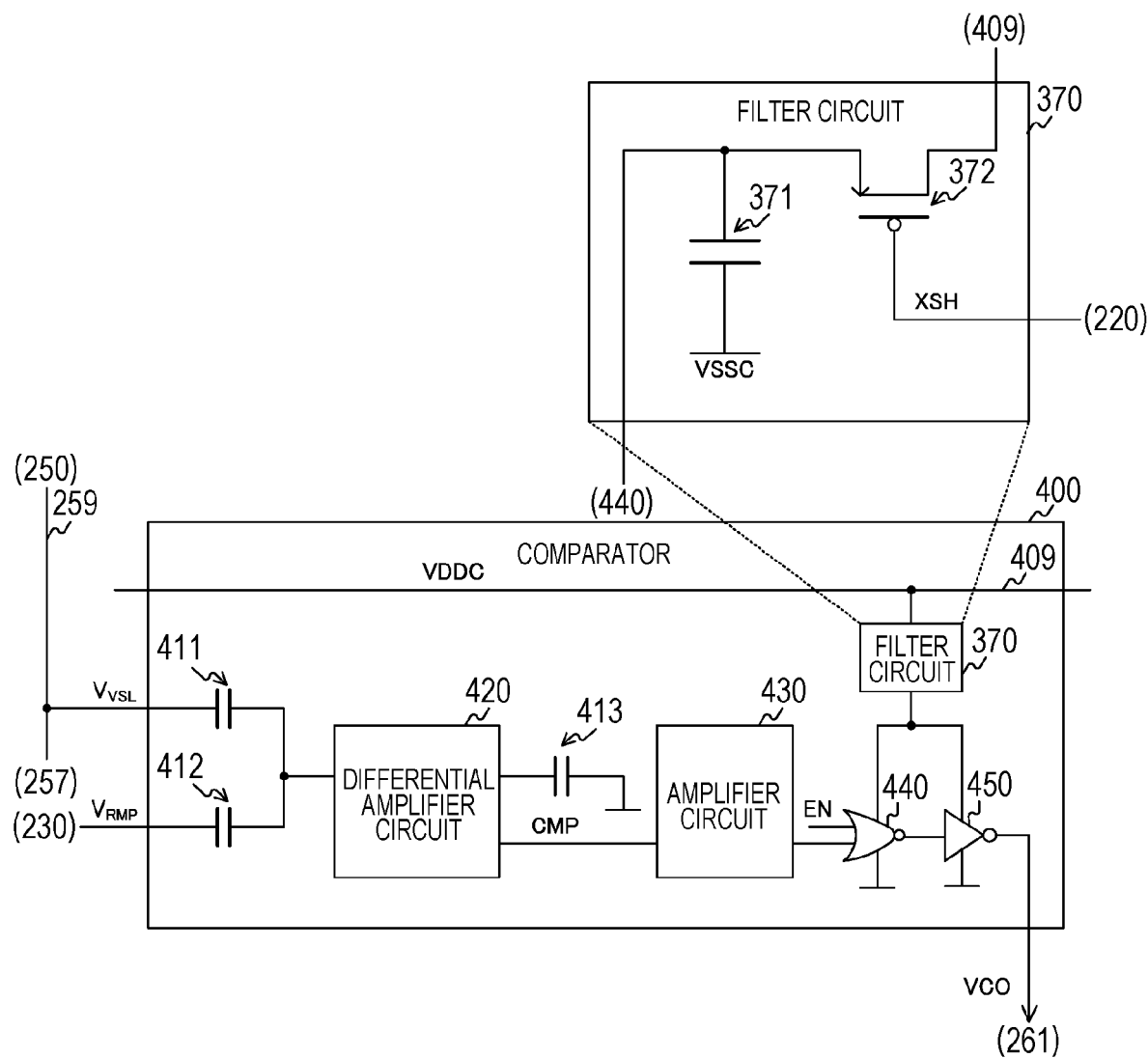
FIG. 39 is a block diagram depicting a configuration example of a comparator in a third modified example of the second embodiment of the present technology.

FIG. 39 is a circuit diagram depicting a configuration example of the comparator 400 in the third modified example of the second embodiment of the present technology. The comparator 400 according to the third modified example of the second embodiment is different from that of the second embodiment in that the control signal XSH from the timing control section 220 is input to a gate of the pMOS transistor 372. The third modified example of the second embodiment is obtained by applying the first modified example of the second embodiment to the second modified example of the second embodiment.

In this manner, the timing control section 220 sets the pMOS transistor 372 to the on state only immediately before an AD conversion period in the third modified example of the second embodiment of the present technology. Therefore, the pMOS transistor 324 of the third stage is disconnected from the common power supply line 308 when the output signal VCO is inverted. Therefore, it is possible to more reliably suppress the potential variation.

Fourth Modified Example

In the second embodiment described above, the filter circuit 370 is inserted between the level shift circuit 320 and the power supply potential. However, in a case where an LDO transistor 363 is connected to a source of an input transistor 312, the filter circuit 370 is unnecessary on the level shift circuit 320 side. The solid-state imaging element 200 according to a fourth modified example of the second embodiment is different from that of the second embodiment in that the filter circuit 370 is arranged on a logic gate side.

Figure 40:
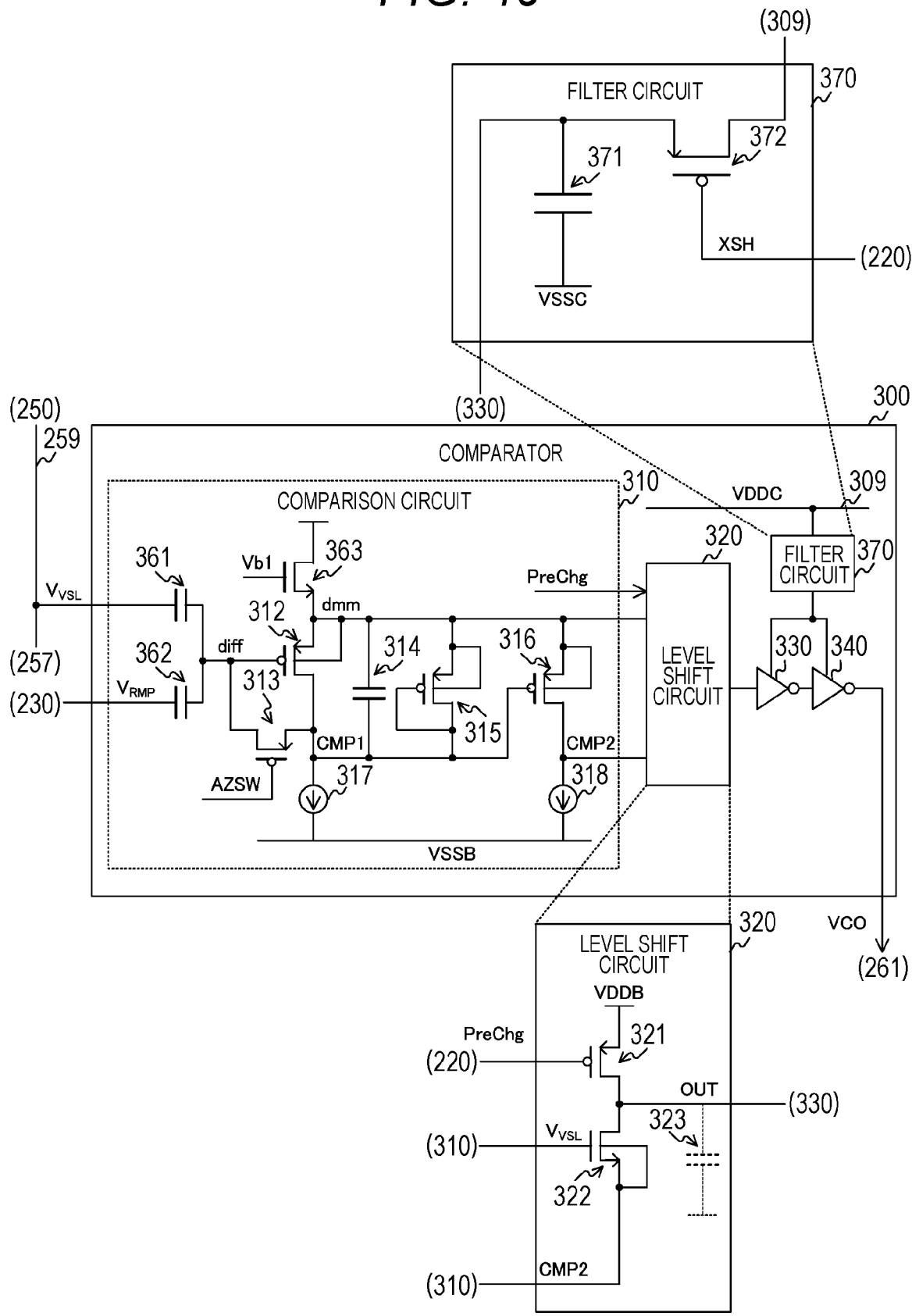
FIG. 40 is a circuit diagram depicting a configuration example of a comparator in a fourth modified example of the second embodiment of the present technology.

FIG. 40 is a circuit diagram depicting a configuration example of the comparator 300 in the fourth modified example of the second embodiment of the present technology. The comparator 300 of the fourth modified example of the second embodiment is different from that of the second embodiment in terms of further including capacitors 361 and 362 and the LDO transistor 363.

Connection configurations among the capacitors 361 and 362 and the LDO transistor 363 are similar to those of the fifth modified example of the first embodiment. The fourth modified example of the second embodiment is obtained by applying the second embodiment to the fifth modified example of the first embodiment.

Furthermore, power-supply-side terminals of inverters 330 and 340 (logic gates) in the subsequent stage of the level shift circuit 320 are connected. The filter circuit 370 is inserted between such a connection node and a common power supply line 309 of the power supply potential VDDC. Note that a power supply potential of the common power supply line 309 is an example of a second power supply potential described in the claims.

In this manner, the filter circuit 370 between the logic gate and the common power supply line suppresses a potential variation according to the fourth modified example of the second embodiment of the present technology, and thus, it is possible to prevent occurrence of streaking caused by the potential variation.

Fifth Modified Example

In the fourth modified example of the second embodiment described above, the level shift circuit 320 expands a voltage range from a current source operation potential Vds' to an input potential $V_{VSL}$ to a voltage range from the current source operation potential Vds' to the power supply voltage VDDB. However, when the current source operation potential Vds' is relatively high, there is a possibility that a malfunction and a leakage current of the inverter 330 occur. The solid-state imaging element 200 according to a fifth modified example of the second embodiment is different from that of the fourth modified example of the second embodiment in that a voltage range is further expanded.

Figure 41:
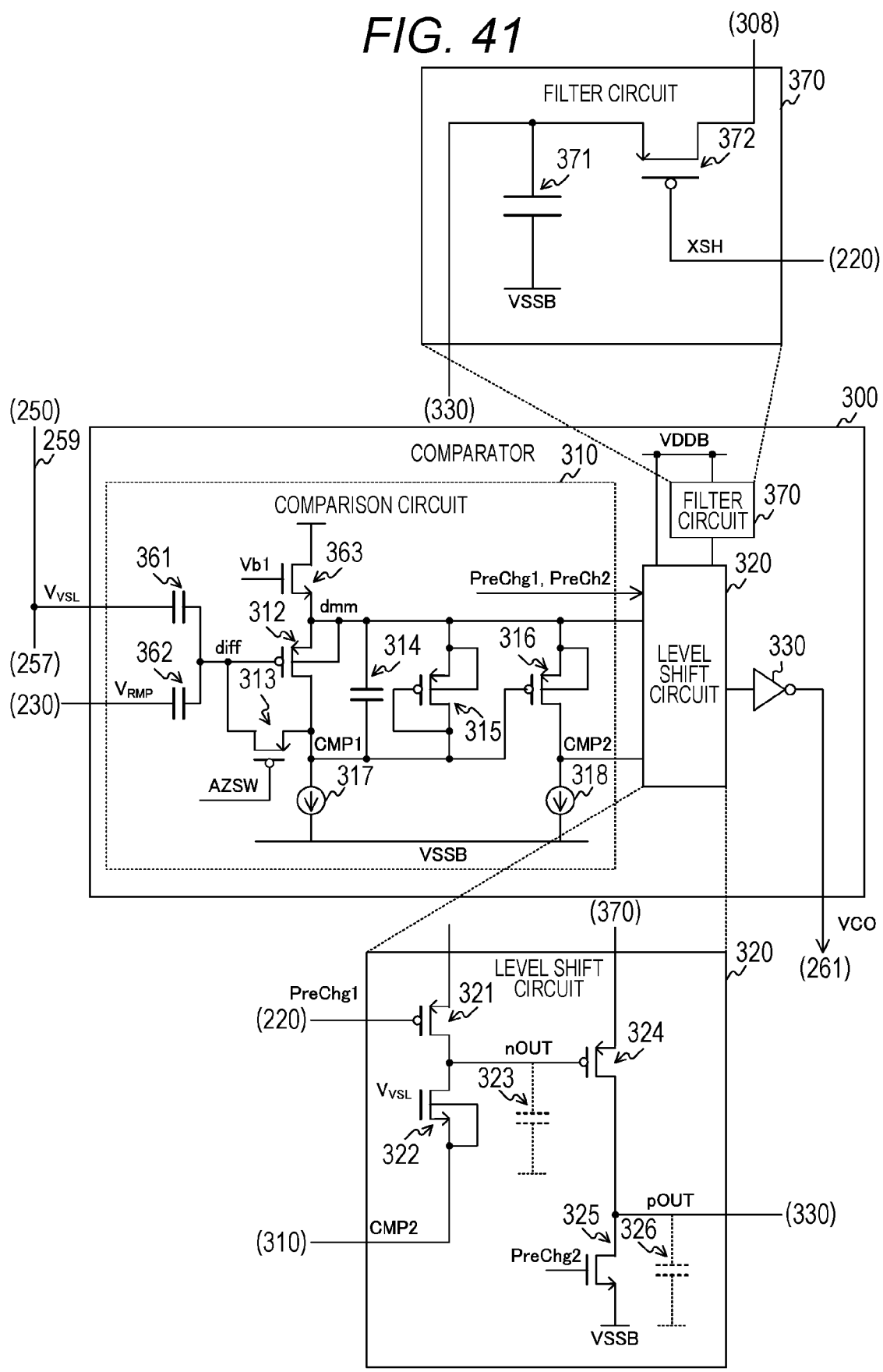
FIG. 41 is a circuit diagram depicting a configuration example of a comparator in a fifth modified example of the second embodiment of the present technology.

FIG. 41 is a circuit diagram depicting a configuration example of the comparator 400 in the fifth modified example of the second embodiment of the present technology. The comparator 400 according to the fifth modified example of the second embodiment is different from that of the fourth modified example of the second embodiment in that the pMOS transistor 324 and a precharge transistor 325 are further provided in the level shift circuit 320. Furthermore, the inverter 340 is not provided, and the filter circuit 370 is inserted between a power supply line of the power supply potential VDDB and the level shift circuit 320. The fifth modified example of the second embodiment is obtained by applying the first modified example of the second embodiment to the fourth modified example of the second embodiment.

In this manner, in the fifth modified example of the second embodiment of the present technology, the pMOS transistor 324 further expands a voltage range from the current source operation potential Vds' to the power supply potential VDDB to a voltage range from the standard potential VSSB to the power supply voltage VDDB. Therefore, it is possible to more reliably prevent the malfunction and the leakage current of the inverter 330.

Sixth Modified Example

In the second embodiment described above, the filter circuit 370 is inserted between the level shift circuit 320 and the common power supply line 308, but the filter circuit 370 can also be arranged in a comparator in which the level shift circuit 320 is not arranged. The solid-state imaging element 200 according to a sixth modified example of the second embodiment is different from that of the second embodiment in that the filter circuit 370 is arranged in a comparator including a general differential amplifier circuit.

Figure 42:
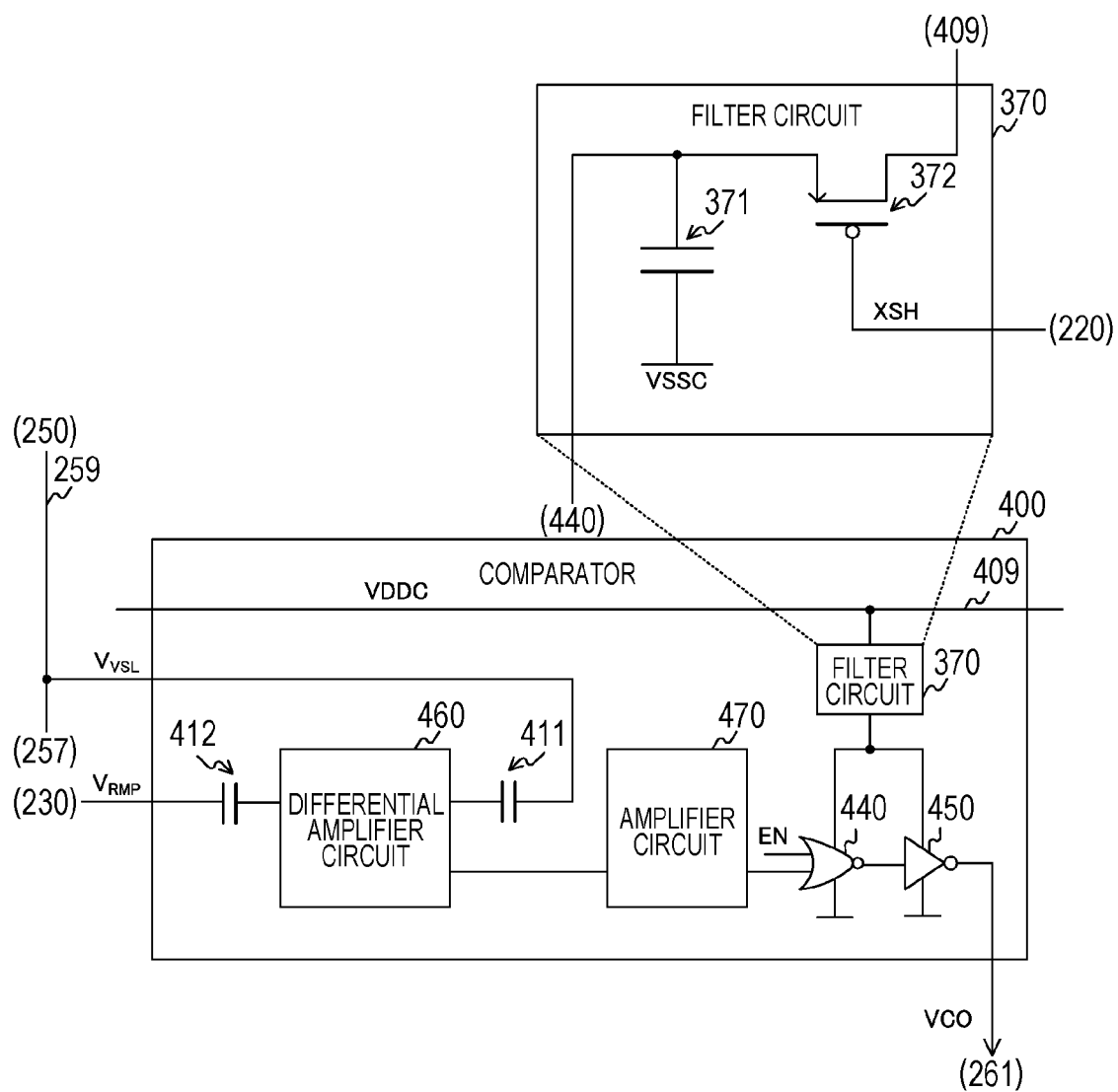
FIG. 42 is a block diagram depicting a configuration example of a comparator in a sixth modified example of the second embodiment of the present technology.

FIG. 42 is a block diagram depicting a configuration example of the comparator 400 in the sixth modified example of the second embodiment of the present technology. The comparator 400 according to the sixth modified example of the second embodiment includes the capacitors 411 and 412, a differential amplifier circuit 460, an amplifier circuit 470, the filter circuit 370, the NOR gate 440, and the inverter 450.

One of two input terminals of the differential amplifier circuit 460 is connected to the vertical signal line 259 via the capacitor 411. The other of these input terminals is connected to the DAC 230 via the capacitor 412. A comparison result of the differential amplifier circuit 460 is output to the amplifier circuit 470.

Figure 43:
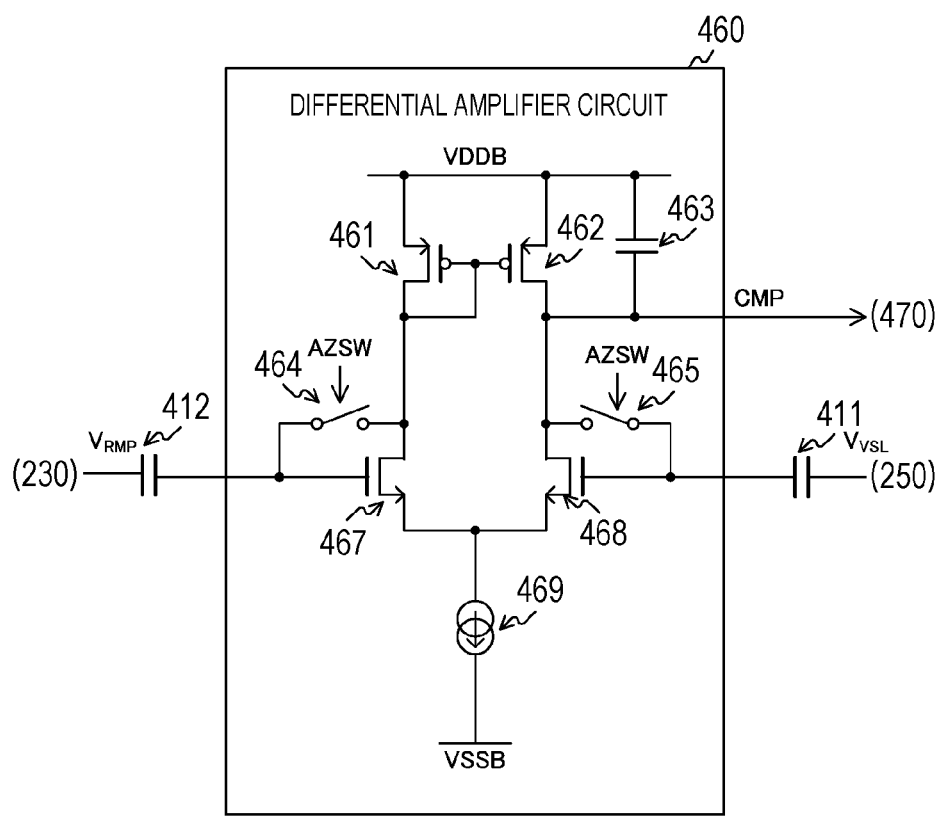
FIG. 43 is a circuit diagram depicting a configuration example of a differential amplifier circuit in the sixth modified example of the second embodiment of the present technology.

FIG. 43 is a circuit diagram depicting a configuration example of the differential amplifier circuit 460 in the sixth modified example of the second embodiment of the present technology. The differential amplifier circuit 460 includes pMOS transistors 461 and 462, a capacitor 463, auto-zero switches 464 and 465, nMOS transistors 467 and 468, and a current source 469.

Sources of the pMOS transistors 461 and 462 are connected to the power supply potential VDDB. Furthermore, a gate and a drain of the pMOS transistor 461 are short-circuited. The respective gates of the pMOS transistors 461 and 462 are connected. The capacitor 463 is inserted between the power supply potential VDDB and a connection node of the pMOS transistor 462 and the nMOS transistor 468.

The auto-zero switch 464 short-circuits a gate and a drain of the nMOS transistor 467 in accordance with the control signal AZSW from the timing control section 220. The auto-zero switch 465 short-circuits a gate and a drain of the nMOS transistor 468 in accordance with the control signal AZSW.

Sources of the nMOS transistors 467 and 468 are connected in common to the current source 469. The nMOS transistor 467 has the gate connected to one end of the capacitor 412 and the drain connected to the drain of the pMOS transistor 461. The nMOS transistor 468 has the gate connected to one end of the capacitor 411 and the drain connected to a drain of the pMOS transistor 462.

The comparison result CMP is output from the connection node of the pMOS transistor 462 and the nMOS transistor 468 to the NOR gate 440.

The current source 469 supplies a constant current and is inserted between a connection node of the nMOS transistors 467 and 468 and the standard potential VSSB.

Figure 44:
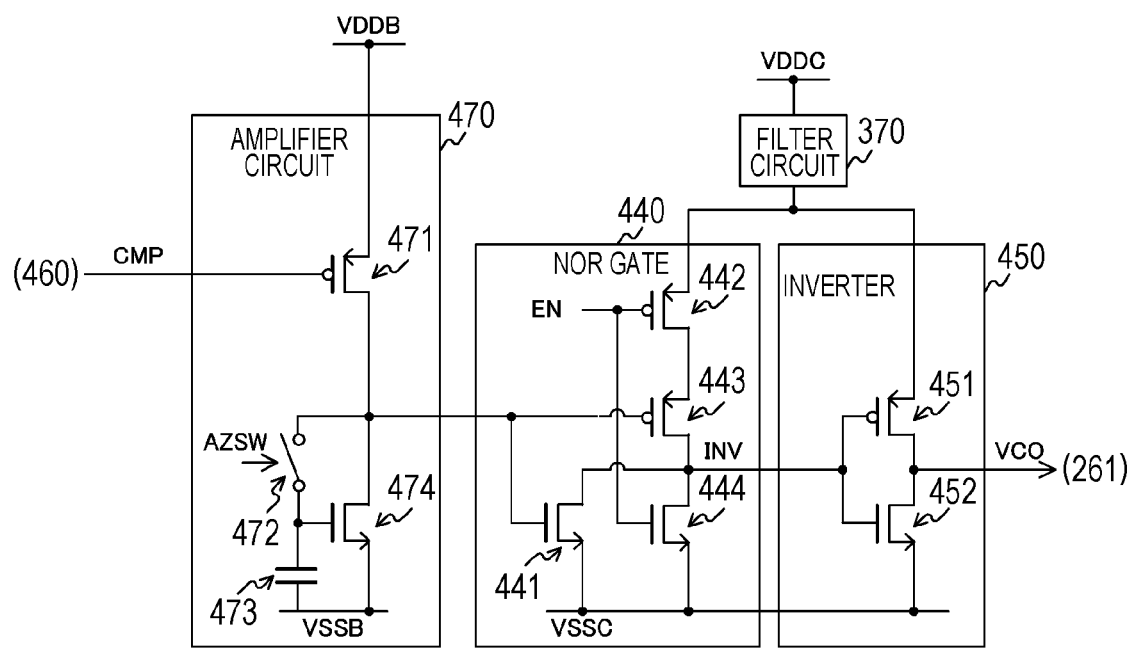
FIG. 44 is a circuit diagram depicting a configuration example of an amplifier circuit in the sixth modified example of the second embodiment of the present technology.

FIG. 44 is a circuit diagram depicting a configuration example of the amplifier circuit 470 in the sixth modified example of the second embodiment of the present technology. The amplifier circuit 470 includes a pMOS transistor 471, an auto-zero switch 472, a capacitor 473, and an nMOS transistor 474.

The pMOS transistor 471 and the nMOS transistor 474 are connected in series between the power supply potential VDDB and the standard potential VSSB. Furthermore, the comparison result CMP from the differential amplifier circuit 460 is input to a gate of the pMOS transistor 471. An amplified signal, obtained by amplifying the comparison result CMP, is output from a connection node of the pMOS transistor 471 and the nMOS transistor 474.

The auto-zero switch 472 short-circuits a gate and a drain of the nMOS transistor 474 in accordance with the control signal AZSW from the timing control section 220. The capacitor 473 is inserted between the gate of the nMOS transistor 474 and the standard potential VSSC. Note that configurations of the NOR gate 440 and the inverter 450 are similar to those of the second modified example of the second embodiment.

As illustrated in FIGS. 42 to 44, the filter circuit 370 is inserted between a logic gate and the power supply potential VDDC in the comparator 300 using the general differential amplifier circuit 460, and thus, a delay time of an output with respect to an input of the logic gate can be shortened. Therefore, the streaking can be suppressed.

Note that the first modified example of the second embodiment can also be applied to the sixth modified example of the second embodiment.

In this manner, the delay time of the output with respect to the input of the logic gate can be shortened since the filter circuit 370 is inserted between the logic gate and the power supply potential VDDC in the sixth modified example of the second embodiment of the present technology. Therefore, the streaking can be suppressed.

3. Example of Application to Mobile Body

The technology according to the present disclosure (present technology) can be applied to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a ship, and a robot.

Figure 45:
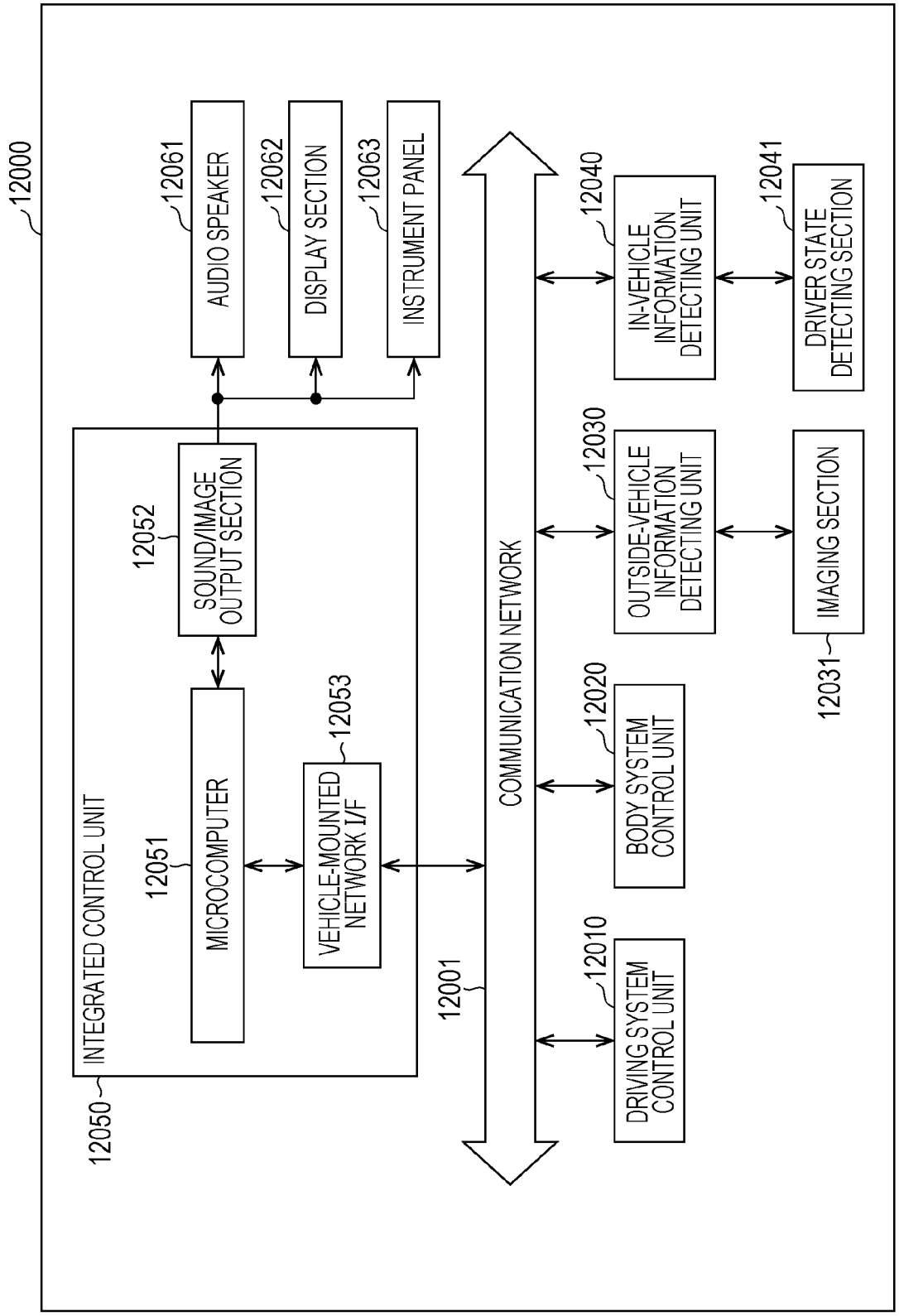
FIG. 45 is a block diagram depicting an example of a schematic configuration of a vehicle control system.

FIG. 45 is a block diagram depicting an example of a schematic configuration of a vehicle control system as an example of a mobile body control system to which the technology according to the present disclosure can be applied.

The vehicle control system 12000 includes a plurality of electronic control units connected to each other via a communication network 12001. In the example depicted in FIG. 45, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 45, an audio speaker 12061, a display section 12062, and an instrument panel 12063 are illustrated as the output device. The display section 12062 may, for example, include at least one of an on-board display and a head-up display.

Figure 46:
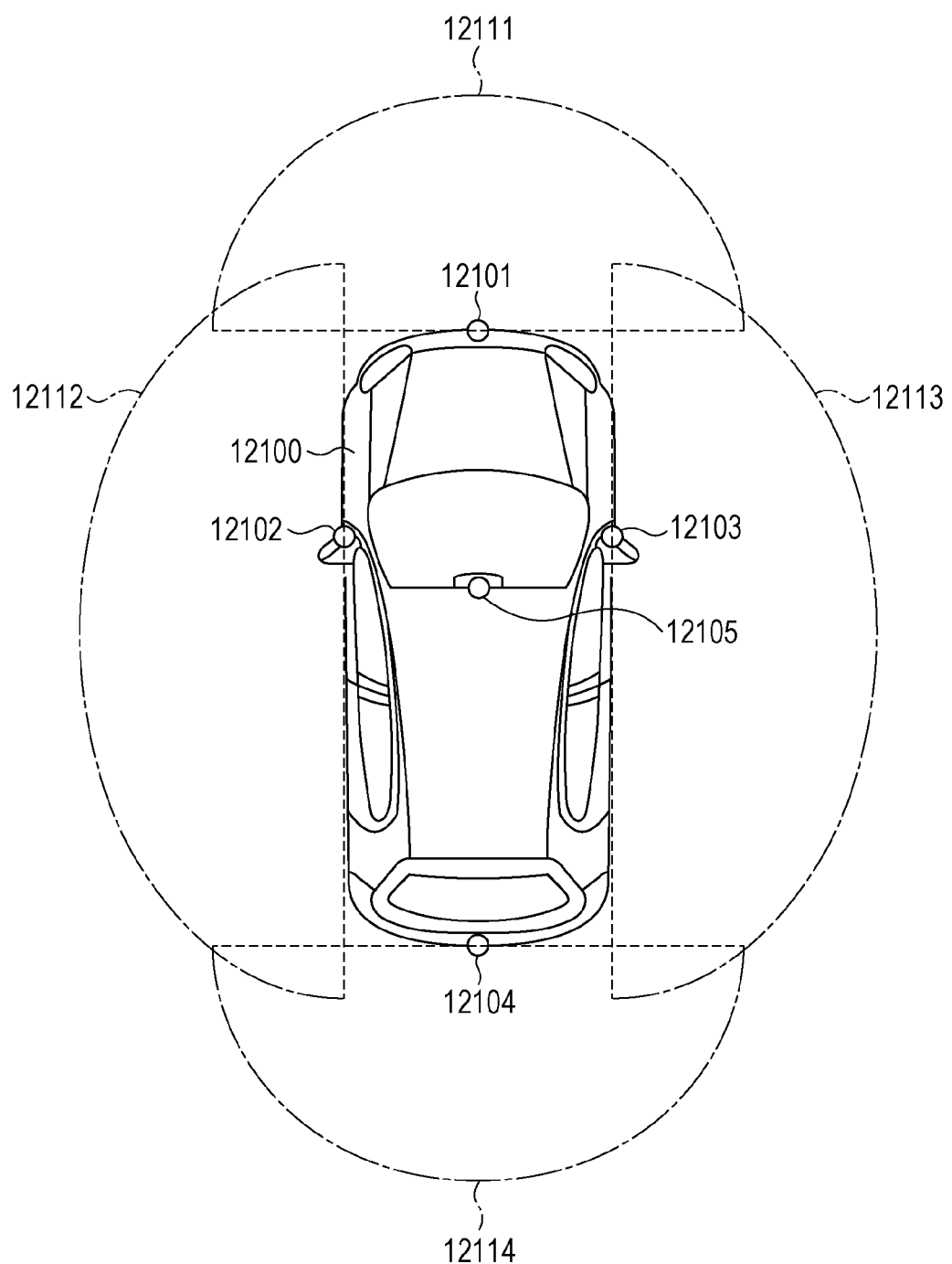
FIG. 46 is an explanatory diagram depicting an example of an installation position of an imaging section.

FIG. 46 is a diagram depicting an example of the installation position of the imaging section 12031.

In FIG. 46, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 46 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described as above. The technology according to the present disclosure can be applied to, for example, the imaging section 12031 among the above-described configurations. Specifically, the imaging device 100 in FIG. 1 can be applied to the imaging section 12031. When the technology according to the present disclosure is applied to the imaging section 12031, streaking can be suppressed, and a more easily viewable imaged image can be obtained, so that the fatigue of the driver can be reduced.

Note that the above-described embodiments illustrate examples for embodying the present technology, and the matters in the embodiments respectively have correspondence relationships with the matters specifying the invention in the claims. Similarly, the matters specifying the invention in the claims respectively have correspondence relationships with the matters in the embodiments of the present technology having the same names. However, the present technology is not limited to the embodiments, and can be embodied by making various modifications to the embodiments within the scope not departing from the gist thereof.

Note that the effects described in the present specification are merely examples and are not limited, and there may be additional effects.

Note that the present technology can also have the following configurations.

(1) A solid-state imaging element including:
  a comparison circuit that compares an input potential which has been input with a predetermined reference potential and outputs any one of a pair of output potentials as a comparison result;
  a level shift circuit that outputs, as an output signal, any one of a pair of shift potentials having a larger potential difference than the pair of output potentials on the basis of the comparison result;
  a logic gate that determines whether or not the output signal is higher than a predetermined threshold between the pair of shift potentials and outputs a determination result; and
  a counter that counts a count value over a period until the determination result is inverted.

(2) The solid-state imaging element according to (1), in which
  one of the pair of shift potentials is a power supply potential higher than the input potential, and another of the pair of shift potentials is the same as a lower one of the pair of output potentials.

(3) The solid-state imaging element according to (1), in which
  one of the pair of shift potentials is the same potential as the input potential, and another of the pair of shift potentials is a standard potential lower than a lower one of the pair of output potentials.

(4) The solid-state imaging element according to (1), in which
  one of the pair of shift potentials is a power supply potential higher than the input potential, and another of the pair of shift potentials is a standard potential lower than a lower one of the pair of output potentials.

(5) The solid-state imaging element according to (4), in which
  the level shift circuit includes:
  an N-type transistor having a gate connected to a vertical signal line of the input potential and a source to which the comparison result is input;
  a power-supply-side precharge transistor that initializes a potential of a drain of the N-type transistor to the power supply potential;
  a P-type transistor having a gate connected to the drain of the N-type transistor and a drain connected to the logic gate; and
  a standard-side precharge transistor that initializes a potential of the drain of the P-type transistor to the standard potential.

(6) The solid-state imaging element according to (5), further including a short-circuit transistor that short-circuits the gate and the source of the N-type transistor.

(7) The solid-state imaging element according to (5) or (6), in which
  a back gate and the source of the N-type transistor are short-circuited.

(8) The solid-state imaging element according to (5) or (6), in which
  a back gate of the N-type transistor is grounded.

(9) The solid-state imaging element according to (4), in which
  the level shift circuit includes:
  a P-type transistor having a gate to which the comparison result is input and a source connected to a vertical signal line of the input potential;
  a standard-side precharge transistor that initializes a potential of a drain of the P-type transistor to the standard potential;

an N-type transistor having a gate connected to the drain of the P-type transistor and a drain connected to the logic gate; and a power-supply-side precharge transistor that initializes a potential of the drain of the N-type transistor to the power supply potential.

(10) The solid-state imaging element according to (9), further including a short-circuit transistor that short-circuits the vertical signal line and the gate of the P-type transistor.

(11) The solid-state imaging element according to any one of (1) to (10), in which
the comparison circuit includes:
an input transistor having a source connected to the vertical signal line and a gate to which the reference potential is input; and
a current source connected to a drain of the input transistor.

(12) The solid-state imaging element according to any one of (1) to (10), in which
the comparison circuit includes:
a pair of capacitors that divides a voltage between the input potential and the reference potential;
an input transistor having a gate connected to a connection node of the pair of capacitors and a source to which a drop potential lower than the power supply potential is input; and
a current source connected to a drain of the input transistor.

(13) The solid-state imaging element according to any one of (1) to (12), further including a filter circuit that suppresses a variation in a first power supply potential, in which
the filter circuit is inserted between a power supply line of the first power supply potential and the level shift circuit.

(14) The solid-state imaging element according to (13), in which
the filter circuit includes a capacitor and a transistor connected in series between the power supply line of the first power supply potential and the level shift circuit.

(15) The solid-state imaging element according to (14), in which
a predetermined potential for constantly turning on the transistor is applied to a gate of the transistor.

(16) The solid-state imaging element according to (14), further including
a timing control section that supplies a control signal to a gate of the transistor.

(17) The solid-state imaging element according to (16), in which
the input potential includes a reset level and a signal level, and
the timing control section controls the transistor to be turned on by the control signal over a first pulse period before a counting period of the count value corresponding to the reset level.

(18) The solid-state imaging element according to (17), in which
the timing control section controls the transistor to be turned on by the control signal over each of a second pulse period and the first pulse period between the counting period of the count value corresponding to the reset level and a counting period of the count value corresponding to the signal level.

(19) The solid-state imaging element according to any one of (1) to (12), further including a filter circuit that suppresses a variation in a second power supply potential, in which the filter circuit is inserted between a power supply line of the second power supply potential and the logic gate.

(20) An imaging device including:
a comparison circuit that compares an input potential which has been input with a predetermined reference potential and outputs any one of a pair of output potentials as a comparison result;
a level shift circuit that outputs, as an output signal, any one of a pair of shift potentials having a larger potential difference than the pair of output potentials on the basis of the comparison result;
a logic gate that determines whether or not the output signal is higher than a predetermined threshold between the pair of shift potentials and outputs a determination result;
a counter that counts a count value over a period until the determination result is inverted; and
a storage section that stores image data in which a digital signal indicating the count value is arranged.

REFERENCE SIGNS LIST

100 Imaging device
110 Optical section
120 DSP circuit
130 Display section
140 Operation section
150 Bus
160 Frame memory
170 Storage section
180 Power supply section
200 Solid-state imaging element
201 Light receiving chip
202 Circuit chip
210 Vertical scanning circuit
220 Timing control circuit
230 DAC
240 Pixel array section
250 Pixel circuit
251 Photoelectric conversion element
252 Transfer transistor
253 Reset transistor
254 Floating diffusion layer
255 Amplification transistor
256 Selection transistor
257 Load MOS current source
260 Column signal processing section
261 Counter
262 Latch
270 Horizontal scanning circuit
300, 400 Comparator
310 Comparison circuit
311, 314, 361, 362, 371, 411 to 413, 463, 473 Capacitor
312 Input transistor
313 Auto-zero transistor
315 Clamp transistor
316 Output transistor
317, 318, 421, 469 Current source
320 Level shift circuit
321, 325, 352, 354 Precharge transistor
322, 332, 342, 355, 426, 427, 433, 441, 444, 452, 467, 468, 474 nMOS transistor
323, 326, 353, 356 Parasitic capacitance
324, 331, 341, 351, 372, 422, 423, 431, 442, 443, 451, 461, 462,
471 pMOS transistor 327 Short-circuit transistor
330, 340, 450 Inverter
363 LDO transistor
370 Filter circuit
420, 460 Differential amplifier circuit
424, 425, 432, 464, 465, 472 Auto-zero switch
430, 470 Amplifier circuit
440 NOR gate
501, 504, 506 n layer
502, 503, 507 p layer
505 Gate electrode
12031 Imaging section

The invention claimed is:

1. A solid-state imaging element, comprising:
a comparison circuit that compares an input potential which has been input with a predetermined reference potential and outputs any one of a pair of output potentials as a comparison result;
a level shift circuit that outputs, as an output signal, any one of a pair of shift potentials having a larger potential difference than the pair of output potentials on a basis of the comparison result;
a logic gate that determines whether or not the output signal is higher than a predetermined threshold between the pair of shift potentials and outputs a determination result; and
a counter that counts a count value over a period until the determination result is inverted.

2. The solid-state imaging element according to claim 1, wherein
one of the pair of shift potentials is a power supply potential higher than the input potential, and another of the pair of shift potentials is same as a lower one of the pair of output potentials.

3. The solid-state imaging element according to claim 1, wherein
one of the pair of shift potentials is a same potential as the input potential, and another of the pair of shift potentials is a standard potential lower than a lower one of the pair of output potentials.

4. The solid-state imaging element according to claim 1, wherein
one of the pair of shift potentials is a power supply potential higher than the input potential, and another of the pair of shift potentials is a standard potential lower than a lower one of the pair of output potentials.

5. The solid-state imaging element according to claim 4, wherein
the level shift circuit includes:
an N-type transistor having a gate connected to a vertical signal line of the input potential and a source to which the comparison result is input;
a power-supply-side precharge transistor that initializes a potential of a drain of the N-type transistor to the power supply potential;
a P-type transistor having a gate connected to the drain of the N-type transistor and a drain connected to the logic gate; and
a standard-side precharge transistor that initializes a potential of the drain of the P-type transistor to the standard potential.

6. The solid-state imaging element according to claim 5, further comprising a short-circuit transistor that short-circuits the gate and the source of the N-type transistor.

7. The solid-state imaging element according to claim 5, wherein
a back gate and the source of the N-type transistor are short-circuited.

8. The solid-state imaging element according to claim 5, wherein
a back gate of the N-type transistor is grounded.

9. The solid-state imaging element according to claim 4, wherein
the level shift circuit includes:
a P-type transistor having a gate to which the comparison result is input and a source connected to a vertical signal line of the input potential;
a standard-side precharge transistor that initializes a potential of a drain of the P-type transistor to the standard potential;
an N-type transistor having a gate connected to the drain of the P-type transistor and a drain connected to the logic gate; and
a power-supply-side precharge transistor that initializes a potential of the drain of the N-type transistor to the power supply potential.

10. The solid-state imaging element according to claim 9, further comprising a short-circuit transistor that short-circuits the vertical signal line and the gate of the P-type transistor.

11. The solid-state imaging element according to claim 1, wherein
the comparison circuit includes:
an input transistor having a source connected to a vertical signal line and a gate to which the predetermined reference potential is input; and
a current source connected to a drain of the input transistor.

12. The solid-state imaging element according to claim 1, wherein
the comparison circuit includes:
a pair of capacitors that divides a voltage between the input potential and the predetermined reference potential;
an input transistor having a gate connected to a connection node of the pair of capacitors and a source to which a drop potential lower than a power supply potential is input; and
a current source connected to a drain of the input transistor.

13. The solid-state imaging element according to claim 1, further comprising a filter circuit that suppresses a variation in a first power supply potential, wherein
the filter circuit is inserted between a power supply line of the first power supply potential and the level shift circuit.

14. The solid-state imaging element according to claim 13, wherein
the filter circuit includes a capacitor and a transistor connected in series between the power supply line of the first power supply potential and the level shift circuit.

15. The solid-state imaging element according to claim 14, wherein
a predetermined potential for constantly turning on the transistor is applied to a gate of the transistor.

16. The solid-state imaging element according to claim 14, further comprising
a timing control section that supplies a control signal to a gate of the transistor.

17. The solid-state imaging element according to claim 16, wherein the input potential includes a reset level and a signal level, and the timing control section controls the transistor to be turned on by the control signal over a first pulse period before a counting period of the count value corresponding to the reset level.

18. The solid-state imaging element according to claim 17, wherein the timing control section controls the transistor to be turned on by the control signal over each of a second pulse period and the first pulse period between the counting period of the count value corresponding to the reset level and a counting period of the count value corresponding to the signal level.

19. The solid-state imaging element according to claim 1, further comprising a filter circuit that suppresses a variation in a second power supply potential, wherein the filter circuit is inserted between a power supply line of the second power supply potential and the logic gate.

20. An imaging device, comprising:

a comparison circuit that compares an input potential which has been input with a predetermined reference potential and outputs any one of a pair of output potentials as a comparison result;

a level shift circuit that outputs, as an output signal, any one of a pair of shift potentials having a larger potential difference than the pair of output potentials on a basis of the comparison result;

a logic gate that determines whether or not the output signal is higher than a predetermined threshold between the pair of shift potentials and outputs a determination result;

a counter that counts a count value over a period until the determination result is inverted; and a storage section that stores image data in which a digital signal indicating the count value is arranged.

* * * * *